(12) United States Patent
Kristensen et al.

(10) Patent No.: US 11,966,673 B2
(45) Date of Patent: Apr. 23, 2024

(54) SENSOR SIMULATION AND LEARNING SENSOR MODELS WITH GENERATIVE MACHINE LEARNING METHODS

(71) Applicant: NVIDIA Corporation, Santa Clara, CA (US)

(72) Inventors: Steen Kristensen, Lindenberg (DE); Alessandro Ferrari, Muchen (DE); Ayman Elsaeid, Berlin (DE)

(73) Assignee: NVIDIA Corporation, Santa Clara, CA (US)

( * ) Notice: Subject to any disclaimer, the term of this patent is extended or adjusted under 35 U.S.C. 154(b) by 343 days.

(21) Appl. No.: 16/818,551

(22) Filed: Mar. 13, 2020

(65) Prior Publication Data

US 2021/0286923 A1     Sep. 16, 2021

(51) Int. Cl.
*G06F 30/27*     (2020.01)
*G01S 7/40*      (2006.01)
(Continued)

(52) U.S. Cl.
CPC ............ *G06F 30/27* (2020.01); *G01S 7/4052* (2013.01); *G01S 7/412* (2013.01); *G06N 3/088* (2013.01);
(Continued)

(58) Field of Classification Search
CPC ........ G06F 30/27; G01S 7/4052; G01S 7/412; G01S 2013/9323; G01S 2013/9324; G01S 13/931; G06N 3/088
See application file for complete search history.

(56) References Cited

U.S. PATENT DOCUMENTS 10,509,947 B1 * 12/2019 Douillard ............... G06V 10/82
10,740,954 B2    8/2020 Liu
(Continued)

OTHER PUBLICATIONS

Park, Taesung, et al. "Semantic image synthesis with spatially-adaptive normalization." Proceedings of the IEEE Conference on Computer Vision and Pattern Recognition. 2019. 19 Pages.
(Continued)

*Primary Examiner* — Peter M Bythrow
*Assistant Examiner* — Nazra Nur Waheed
(74) *Attorney, Agent, or Firm* — Shook, Hardy & Bacon L.L.P.

(57) ABSTRACT

In various examples, a sensor model may be learned to predict virtual sensor data for a given scene configuration. For example, a sensor model may include a deep neural network that supports generative learning—such as a generative adversarial network (GAN). The sensor model may accept an encoded representation of a scene configuration as an input using any number of data structures and/or channels (e.g., concatenated vectors, matrices, tensors, images, etc.), and may output virtual sensor data. Real-world data and/or virtual data may be collected and used to derive training data, which may be used to train the sensor model to predict virtual sensor data for a given scene configuration. As such, one or more sensor models may be used as virtual sensors in any of a variety of applications, such as in a simulated environment to test features and/or functionality of one or more autonomous or semi-autonomous driving software stacks.

17 Claims, 21 Drawing Sheets

(51) Int. Cl.
  *G01S 7/41* (2006.01)
  *G06N 3/088* (2023.01)
  *G01S 13/931* (2020.01)
(52) U.S. Cl.
  CPC ..... *G01S 13/931* (2013.01); *G01S 2013/9323* (2020.01); *G01S 2013/9324* (2020.01)

(56) References Cited

U.S. PATENT DOCUMENTS

| | | | |
|---|---|---|---|
| 10,776,985 B2 | 9/2020 | Liu et al. | |
| 10,829,793 B2 | 11/2020 | Arikawa et al. | |
| 10,885,698 B2 | 1/2021 | Muthler et al. | |
| 11,099,558 B2 | 8/2021 | Huang et al. | |
| 11,150,663 B2 | 10/2021 | Shirvani et al. | |
| 2018/0275658 A1* | 9/2018 | Landola | G06V 20/58 |
| 2018/0349526 A1* | 12/2018 | Atsmon | G06T 19/003 |
| 2019/0228571 A1* | 7/2019 | Atsmon | G01C 11/04 |
| 2019/0250622 A1 | 8/2019 | Nister et al. | |
| 2019/0258251 A1 | 8/2019 | Ditty et al. | |
| 2020/0074266 A1* | 3/2020 | Peake | G06F 18/2411 |
| 2020/0160598 A1* | 5/2020 | Manivasagam | G07C 5/02 |
| 2020/0225655 A1* | 7/2020 | Cella | G05B 19/41875 |
| 2020/0410063 A1* | 12/2020 | O'Malley | G07C 5/02 |
| 2021/0018589 A1* | 1/2021 | Berkooz | G01S 7/40 |
| 2021/0073584 A1* | 3/2021 | St. Romain, II | G06N 5/04 |
| 2023/0044889 A1* | 2/2023 | Ewert | G06N 3/045 |

OTHER PUBLICATIONS

Salian, Isha: "A Pigment of Your Imagination: GauGAN AI Art Tool Receives 'Best of Show,' 'Audience Choice' Awards at SIGGRAPH, " available at https://blogs.nvidia.com/blog/2019/07/30/gaugan-ai-painting/ (last visited Jan. 24, 2020) 6 Pages.

NVIDIA: "GauGAN Beta," available at http://nvidia-research-mingyuliu.com/gaugan/ (last visited Jan. 24, 2020) 2 Pages.

Park, Taesung, et al. "Semantic Image Synthesis with SPADE," available at https://github.com/NVlabs/SPADE (last visited Jan. 24, 2020) 4 Pages.

Pöpperli, M., Gulagundi, R., Yogamani, S., & Milz, S. (Jun. 2019). Realistic Ultrasonic Environment Simulation Using Conditional Generative Adversarial Networks. In 2019 IEEE Intelligent Vehicles Symposium (IV) (pp. 2278-2283). IEEE.

IEC 61508, "Functional Safety of Electrical/Electronic/Programmable Electronic Safety-related Systems," Retrieved from Internet URL: https://en.wikipedia.org/wiki/IEC_61508, accessed on Apr. 1, 2022, 7 pages.

ISO 26262, "Road vehicle—Functional safety," International standard for functional safety of electronic system, Retrieved from Internet URL: https://en.wikipedia.org/wiki/ISO_26262, accessed on Sep. 13, 2021, 8 pages.

Taxonomy and Definitions for Terms Related to Driving Automation Systems for On-Road Motor Vehicles, National Highway Traffic Safety Administration (Nhtsa), A Division of the US Department of Transportation, and the Society of Automotive Engineers (SAE), Standard No. J3016-201609, pp. 1-30 (Sep. 30, 2016).

Taxonomy and Definitions for Terms Related to Driving Automation Systems for On-Road Motor Vehicles, National Highway Traffic Safety Administration (NHTSA), A Division of the US Department of Transportation, and the Society of Automotive Engineers (SAE), Standard No. J3016-201806, pp. 1-35 (Jun. 15, 2018).

"Geometric Shadow Filter for Denoising Ray-Traced Shadows", U.S. Appl. No. 62/644,385, filed Mar. 17, 2018.

"Energy Based Reflection Filter for Denoising Ray-Traced Glossy Reflections", U.S. Appl. No. 62/644,386, filed Mar. 17, 2018.

"Distance Based Ambient Occlusion Filter for Denoising Ambient Occlusions", U.S. Appl. No. 62/644,601, filed Mar. 19, 2018.

"Adaptive Occlusion Sampling of Rectangular Area Lights with Voxel Cone Tracing", U.S. Appl. No. 62/644,806, filed Mar. 19, 2018.

\* cited by examiner

SENSOR SIMULATION AND LEARNING SENSOR MODELS WITH GENERATIVE MACHINE LEARNING METHODS

BACKGROUND

Autonomous vehicles and semi-autonomous vehicles rely on artificial intelligence and machine learning—specifically deep neural networks (DNNs)—for performing any number of operations for operating, piloting, and navigating the vehicle. For example, DNNs may be used for object detection, lane and road boundary detection, safety analysis, drivable free-space analysis, control generation during vehicle maneuvers, and/or other operations. Before any autonomous or semi-autonomous vehicle can safely navigate on the road, the DNNs and other software that enable the vehicle to drive itself are generally tested to verify and validate that they perform safely. More specifically, DNN-powered autonomous and semi-autonomous vehicles should be able to respond properly to an incredibly diverse set of situations, including interactions with emergency vehicles, pedestrians, animals, and a virtually infinite number of other obstacles. However, many scenarios are too dangerous to test in the real world and, as a result, testing to perform such operations in real-world environments may not be practical or desirable.

In addition, DNN-powered autonomous and semi-autonomous vehicles should perform regardless of weather, road, lighting, and/or other environmental conditions. There is no practical way to physically road test vehicles in all these situations, nor is road testing sufficiently controllable, repeatable, exhaustive, or efficient. As such, the ability to test in a realistic simulation environment is essential to providing safe and reliable self-driving vehicles. As a result, verifying and validating DNNs in autonomous or semi-autonomous vehicles often involves a combination of actual road miles with simulated miles in a data center.

An important element in such simulation environments is the creation of realistic sensor data from a given scene configuration. However, creating realistic sensor data for autonomous or semi-autonomous vehicles provides a number of challenges. Generally, creating realistic sensor data requires substantial design efforts and high computational costs. Taking RADAR as an example, simulating realistic RADAR data is particularly challenging, as traditional techniques generally require a detailed radio frequency (RF) simulation, signal processing, and scene modeling. More specifically, traditional simulation techniques like ray casting with added noise and physics-based simulations are computationally expensive and difficult to implement. Furthermore, creating detailed models with suitable reflective characteristics is also challenging, as different objects have different reflective characteristics. For example, metal generally reflects better than plants or people, which generally reflect better than thin sheets of plastic. Furthermore, RADAR can penetrate some surfaces (such as glass or certain walls) in a way that may produce more than one reflection—one from a first surface (e.g., a window) and one from a secondary surface behind the first one. As a result, modeling all the possible reflections and reflective properties in an environment is very demanding, both in terms of design and computational cost. Conventional approaches to sensor modeling generally require an intimate understanding of the internal design of the particular sensor being modeled. However, sensor manufacturers may not always disclose internal design details and, without this information, it may not be possible to create a realistic sensor model. On the other hand, if a sensor manufacturer simply provides a black box model, the accuracy of a simulation that uses such a model will depend on the accuracy of a third party design, which may be undesirable. For each of these reasons, creating realistic sensor simulations is challenging.

SUMMARY

Embodiments of the present disclosure relate to sensor simulation and learning sensor models with generative machine learning. Systems and methods are disclosed for learning a sensor model, and verifying one or more features of a real-world system—such as a software stack for use in autonomous vehicles and/or robots—using the learned sensor model.

In contrast to conventional systems, such as those described above, the systems of the present disclosure may be used to learn a sensor model to predict virtual sensor data for a given scene configuration. A sensor model may include a deep neural network (DNN) with any suitable architecture, and may support generative learning. For example, a sensor model may include a generative adversarial network (GANs), a variational autoencoder (VAE), and/or another type of deep neural network (DNN) or machine learning model. At a high level, a sensor model may accept some encoded representation of a scene configuration as an input using any number of data structures and/or channels (e.g., concatenated vectors, matrices, tensors, images, etc.) and may output virtual sensor data. Real-world data and/or virtual data may be collected and used to derive training data (e.g., input scene configurations and/or ground truth sensor data), which may be used to train the sensor model to predict virtual sensor data for a given scene configuration. A sensor model may be learned for any type of sensor, such as, without limitation, RADAR sensors, LIDAR sensors, ultrasonic or other acoustic or proximity sensors, global navigation satellite system (e.g., GNSS) sensors, cameras, inertial measurement unit (IMU) sensors (e.g., accelerometers, gyroscopes, magnetic compasses, magnetometers), and/or other sensor types.

A sensor model may be learned for any number of sensor types, SKUs, sensor installation locations, and/or the like. As such, one or more sensor models may be used as virtual sensors in any of a variety of applications, such as in a simulated environment to test one or more autonomous or semi-autonomous driving software stacks that may include a multitude of DNNs, in a re-simulation system that uses physical sensor data in combination with virtual sensor data to train, test, verify, and/or validate one or more DNNs for use in software stacks, or otherwise.

BRIEF DESCRIPTION OF THE DRAWINGS

The present systems and methods for sensor simulation and learning sensor models with generative machine learning is described in detail below with reference to the attached drawing figures, wherein.

DETAILED DESCRIPTION

Figure 1:
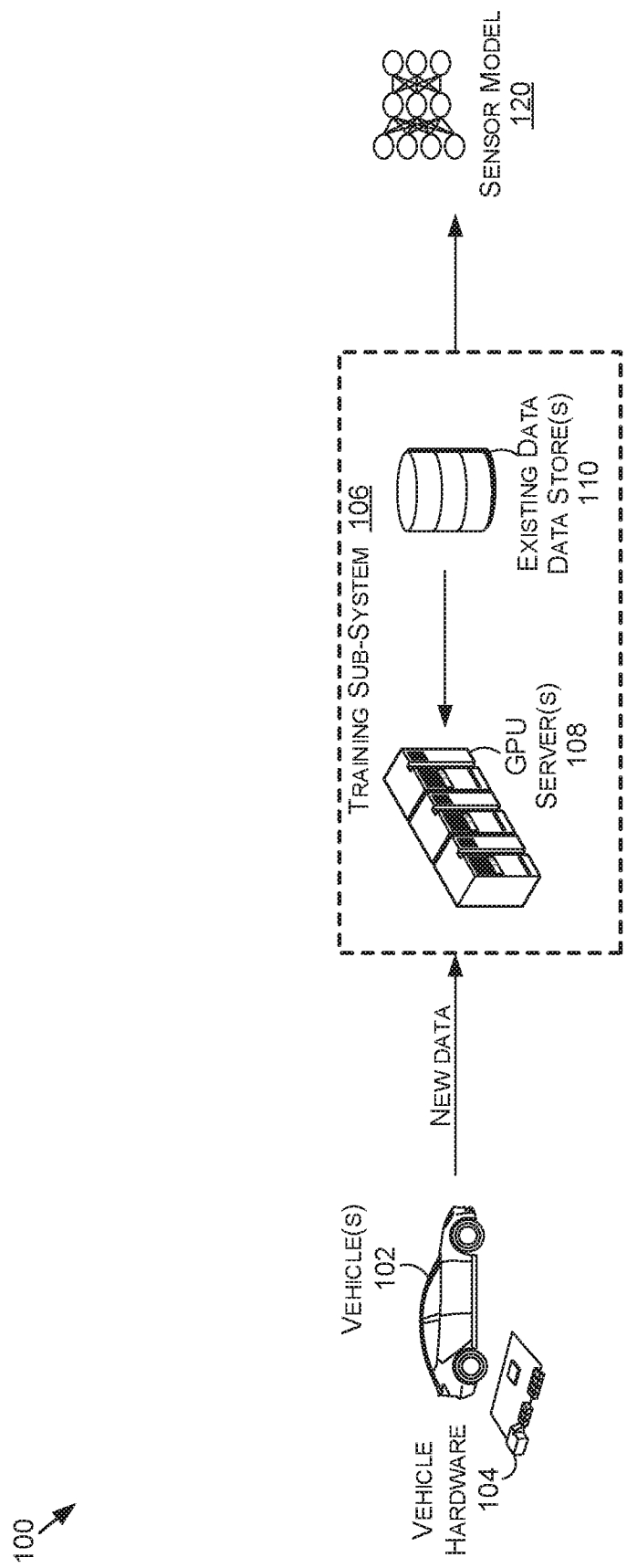
FIG. 1 is an example system for learning a sensor model, in accordance with some embodiments of the present disclosure.

Systems and methods are disclosed relating to sensor simulation and learning sensor models with generative machine learning. The present disclosure may be described generally with respect to an example autonomous or semi-autonomous vehicle 102 (alternatively referred to herein as "vehicle 102" or "autonomous vehicle 102"), an example of which is described in more detail herein with respect to FIGS. 11A-11D. However, this is not intended to be limiting. For example, and without departing from the scope of the present disclosure, the systems, methods, and/or processes described herein may be applicable to non-autonomous vehicles, robots, unmanned aerial vehicles, watercraft, emergency vehicles, aircraft, construction equipment, and/or any other type of vehicle or object.

In general, a sensor model for a particular sensor may be learned to predict virtual sensor data for a given scene configuration. A sensor model may be learned for any type of sensor, such as, without limitation, RADAR sensors, LIDAR sensors, ultrasonic or other acoustic or proximity sensors, global navigation satellite system (e.g., GNSS) sensors, cameras, inertial measurement unit (IMU) sensors (e.g., accelerometers, gyroscopes, magnetic compasses, magnetometers), and/or other sensor types.

A sensor model may include a deep neural network (DNN) with any suitable architecture, and may support generative learning. For example, a sensor model may include a generative adversarial network (GANs), a variational autoencoder (VAE), and/or another type of DNN or machine learning model. At a high level, a sensor model may accept some encoded representation of a scene configuration as an input using any number of data structures and/or channels (e.g., concatenated vectors, matrices, tensors, images, etc.). Generally, an autonomous or semi-autonomous vehicle may use a variety of sensors to measure and/or derive a representation of a scene in the real-world at a given point in time. Data from any of these sensors may be used to generate a representation of a scene configuration, which may be used to drive a sensor model. For example, a representation of a scene configuration may include sensor data (e.g., LIDAR data, RADAR data, ultrasonic sensor data, camera image(s), etc.), properties of objects in the scene such as positions or dimensions (e.g., depth maps), classification data identifying objects in the scene, some combination thereof, and/or the like. Generally, a sensor model may learn to predict virtual sensor data from a representation of a scene configuration. As such, the architecture for a sensor model may be selected to fit the shape of the desired input and output data.

Real-world data and/or virtual data may be collected and used to derive training data (e.g., input scene configurations and/or ground truth sensor data), which may be used to train the sensor model to predict virtual sensor data for a given scene configuration. Taking RADAR simulation as an example, virtual sensor data for RADAR (and ground truth RADAR data) may be structured in any way to identify reflections from a scene and corresponding reflection characteristics. For example, real-world data and/or virtual data may be collected from RADAR and/or LIDAR sensor(s) and used to encode the existence of reflections and values for the reflections such as bearing, azimuth, elevation, range (e.g., time of beam flight), intensity, Doppler velocity, RADAR cross section (RCS), reflectivity, signal-to-noise ratio, some combination thereof, and/or the like. The existence of the reflections and/or corresponding values (or null values) may be encoded into a suitable representation of RADAR data using any number of data structures and/or channels (e.g., concatenated vectors, matrices, tensors, images, etc.). The encoded RADAR data may be used as ground truth data for training data.

For the corresponding input scene configurations, sensor data—such as LIDAR data and/or camera image(s)—may be processed and/or encoded into a suitable representation. For example, images from any number of cameras may be segmented, classified, and/or categorized such as by labeling differing portions of real-world data based on class (e.g., for an image of a landscape, portions of the image—such as pixels or groups of pixels—may be labeled as car, sky, tree, road, building, water, waterfall, vehicle, bus, truck, sedan, etc.). LIDAR may be used to identify reflections and values for the reflections such as lateral bearing, elevation, range (e.g., time of beam flight), reflectivity, signal-to-noise ratio (SNR), some combination thereof, and/or the like. This reflection data may be combined with position and orientation data (e.g., from GNSS and/or IMU sensors) to generate LIDAR point clouds. Any of this LIDAR data, images from one or more cameras, properties of objects in the scene such as positions or dimensions (e.g., depth maps), classification data identifying objects in the scene (e.g., segmentation masks corresponding to the images), and/or other types of data may be encoded into a suitable representation of a scene configuration using any number of data structures and/or channels (e.g., concatenated vectors, matrices, tensors, images, etc.). In another example, geometric description(s) of a scene may be encoded into a suitable network input(s). For example, two or three dimensional geometric model(s) may be arranged in a scene and rendered (e.g., from a desired point of view for the particular sensor being modeled) to form an image, which serve as an encoded scene configuration (or a portion thereof). The encoded scene configuration(s) may be used as input data for a training dataset.

The training dataset may be used to train a sensor model to learn a transformation from an encoded scene configuration to virtual sensor data. A sensor model may be learned for any number of sensor types, SKUs, sensor installation locations, and/or the like. As such, one or more sensor models may be used as virtual sensors in any of a variety of applications, such as in a simulated environment to test one or more autonomous or semi-autonomous driving software stacks that may include a multitude of DNNs, in a re-simulation system that uses physical sensor data in combination with virtual sensor data to train, test, verify, and/or validate one or more DNNs for use in software stacks, or otherwise.

Using learned sensor models provides a number of advantages and benefits over prior techniques. For example, using learned sensor models greatly simplifies the simulation process. For example, there may be less of a need for intimate knowledge of a particular sensor design or its specifications, and/or for domain-specific knowledge about low-level physics simulation. As another example, the need to perform detailed modeling of a particular sensor's signal processing pipeline—including sensor noise patterns and signal processing artifacts, and the like—may be reduced. As such, faster and cheaper simulation capabilities may be achieved using implementations and embodiments described herein. Furthermore, by learning sensor models, a simulation provider no longer needs to rely on third party sensor models, thus allowing the simulation provider to decouple its simulation from third party dependencies. Finally, sensor models—such as generative models—have real-time capabilities, which is not the case for many physically accurate sensor simulations. As a result, the various techniques described herein provide efficient and effective methods for sensor simulation and modeling.

Sensor Learning System

Now referring to FIG. 1, FIG. 1 is an example system 100 for learning a sensor model, in accordance with some embodiments of the present disclosure. For example, the system 100 may be used to learn a sensor model 120 to predict virtual sensor data for a given scene configuration. A sensor model 120 may be learned for any type of sensor, such as, without limitation, RADAR sensors, LIDAR sensors, ultrasonic or other acoustic or proximity sensors, global navigation satellite system (e.g., GNSS) sensors, cameras, inertial measurement unit (IMU) sensors (e.g., accelerometers, gyroscopes, magnetic compasses, magnetometers), and/or other sensor types. In some examples, the system 100 may include some or all of the components, features, and/or functionality of system 1176 of FIG. 11D, and/or may include additional and/or alternative components, features, and functionality of the system 1176. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

A sensor model 120 may include a deep neural network with any suitable architecture, and may support generative learning. For example, the sensor model 120 may include a generative adversarial network (GANs), a variational autoencoder (VAE), and/or another type of DNN or machine learning model. At a high level, the sensor model 120 may accept some encoded representation of a scene configuration as an input, using any number of data structures and/or channels (e.g., concatenated vectors, matrices, tensors, images, etc.). Generally, an autonomous or semi-autonomous vehicle may use a variety of sensors to measure and/or derive a representation of the real-world at a given point in time. Data from any of these sensors may be used to generate a representation of a scene configuration, which may be used to drive a sensor model. For example, a representation of a scene configuration may include sensor data (e.g., LIDAR data, RADAR data, ultrasonic sensor data, camera image(s), etc.), properties of objects in the scene such as positions or dimensions (e.g., depth maps), classification data identifying objects in the scene, some combination thereof, and/or the like. Generally, the sensor model 120 may learn to predict virtual sensor data from a representation of a scene configuration.

Generally, an architecture for the sensor model 120 may be selected to fit the shape of the desired input and output data. Some non-limiting examples of DNNs include perceptron, feed-forward, radial basis, deep feed forward, recurrent, long/short term memory, gated recurrent unit, autoencoder, variational autoencoder, convolutional, deconvolutional, and generative adversarial, to name a few. Some DNNs like GANs may include a convolutional neural network that accepts and evaluates an input image. Moreover, some neural network architectures are designed to accept and operate on an input vector that encodes some type of input information. Further, some neural network architectures—such as GANs—may include multiple input channels, which may be used to accept and evaluate multiple input images and/or input vectors. Some generative techniques such as conditional image synthesis may be applied to generate an output such as a photorealistic image conditioned on some input data. Any or all of these techniques may be applied and/or combined to generate an architecture for the sensor model 120. For example, different input layers, channels, and/or networks may be used to encode different features (e.g., vectors, tensors, etc.) that may be combined using another layer, network, and/or some other operation. In this manner, any number of inputs may be combined. Any number of layers, networks, and/or other operations may be applied to normalize, re-shape, and/or otherwise output virtual sensor data for a desired sensor. One non-limiting example architecture recently introduced by the present Applicant is GauGAN, a generative adversarial network-based technique capable of transforming segmentation maps into realistic photos. In some embodiments, spatially-adaptive normalization may be applied in which an input image such as a segmentation map may be fed into a normalization layer to modulate layer activations. These are meant simply as examples, as any suitable architecture may be implemented within the scope of the present disclosure.

Generally, training data for a sensor model may be generated at least in part from real-world data. As such, one or more vehicles 102 may collect sensor data from one or more sensors of the vehicle(s) 102 in real-world (e.g., physical) environments. The sensors of the vehicle(s) 102 may include, without limitation, global navigation satellite systems sensor(s) 1158 (e.g., Global Positioning System sensor(s)), RADAR sensor(s) 1160, ultrasonic sensor(s) 1162, LIDAR sensor(s) 1164, inertial measurement unit (IMU) sensor(s) 1166 (e.g., accelerometer(s), gyroscope(s), magnetic compass(es), magnetometer(s), etc.), ego-motion sensor(s), microphone(s) 1196, stereo camera(s) 1168, wide-view camera(s) 1170 (e.g., fisheye cameras), infrared camera(s) 1172, surround camera(s) 1174 (e.g., 360 degree cameras), long-range and/or mid-range camera(s) 1198, speed sensor(s) 1144 (e.g., for measuring the speed of the vehicle 102), vibration sensor(s) 1142, steering sensor(s) 1140, brake sensor(s) (e.g., as part of the brake sensor system 1146), and/or other sensor types. The vehicle(s) 102 may include autonomous vehicles, semi-autonomous vehicles, non-autonomous vehicles, and/or may include objects or vehicles other than vehicles 102, such as robots, drones, watercraft, aircraft, unmanned aerial vehicles (UAVs), etc.

The vehicle(s) 102 may include vehicle hardware 104. For example, the vehicle hardware 104 may be responsible for managing the sensor data generated by the sensors (e.g., using a sensor manager of an autonomous driving software stack being executed by the vehicle hardware 104). The autonomous driving software stack being executed using the vehicle hardware 104 may further include a world state manager that manages the world using one or more maps (e.g., 3D maps), localization component(s), perception component(s), and/or the like. In addition, the autonomous driving software stack may include planning component(s) (e.g., as part of a planning layer), control component(s) (e.g., as part of a control layer), actuation component(s) (e.g., as part of an actuation layer), obstacle avoidance component(s) (e.g., as part of an obstacle avoidance layer), and/or other component(s). In any example, the vehicle hardware 104 may include the hardware of the vehicle 102 that is used to control the vehicle 102 through real-world environments based on the sensor data, one or more machine learning models (e.g., neural networks), and/or the like. As such, the vehicle hardware 104 may be configured for installation within the vehicle 102 and for use by the vehicle 102 in executing an autonomous driving software stack for controlling, at least in part, the vehicle 102 through a real-world physical environment(s).

The sensor data collected by the sensors of the vehicle(s) 102 and/or existing sensor data (e.g., real-world data and/or virtual data stored in the data store(s) 110), may be used by a training sub-system 106 to derive training data (e.g., input scene configurations and/or ground truth sensor data), as explained in more detail below. As such, the training sub-system 106 may use the training data to train the sensor model 120 to predict virtual sensor data for a given scene configuration. The training sub-system 106 may include a cloud-based deep learning infrastructure that may use artificial intelligence to analyze the sensor data received from the vehicle(s) 102 and/or stored in the data store(s) 110, and incorporate or train up-to-date, real-time neural networks (and/or other machine learning models) for one more sensor models (e.g., the sensor model 120). In some examples, the training sub-system 106 may include one or more graphics processing unit (GPU) servers 108. For example, the training sub-system 106 may include a datacenter with GPUs, TPUs, CPUs, and/or other processor types. As such, the use of GPU with respect to GPU server(s) 108 is not intended to be limiting, and in some examples, the GPU server(s) 108 may not include GPU(s). In the sections that follow, various techniques are described that may be implemented to derive training data and use the training data to learn a sensor model.

Deriving Training Data from Sensor Data

As a general matter, the training sub-system 106 may derive training data (e.g., input scene configurations and/or ground truth sensor data) for the sensor model 120 from sensor data collected by the sensors of the vehicle(s) 102 and/or existing sensor data (e.g., real-world data and/or virtual data stored in the data store(s) 110). The training data may be derived to fit the shape of the input and output data for the sensor model 120, which may, in turn, depend on the architecture of the sensor model 120. For example, sensor data may be used to encode an input scene configuration and/or ground truth sensor data using any number of data structures and/or channels (e.g., concatenated vectors, matrices, tensors, images, etc.).

Taking RADAR simulation as an example, virtual sensor data for RADAR (and ground truth RADAR data) may be structured in any way to identify reflections from a scene and corresponding reflection characteristics. For example, real-world data and/or virtual data may be collected from RADAR and/or LIDAR sensor(s) and used to encode the existence of reflections and values for the reflections such as bearing, azimuth, elevation, range (e.g., time of beam flight), intensity, Doppler velocity, RADAR cross section (RCS), reflectivity, signal-to-noise ratio (SNR), some combination thereof, and/or the like. The existence of the reflections and/or corresponding values (or null values) may be encoded into a suitable representation of RADAR data using any number of data structures and/or channels (e.g., concatenated vectors, matrices, tensors, images, etc.). The encoded RADAR data may be used as ground truth data for a training dataset.

Figure 2:
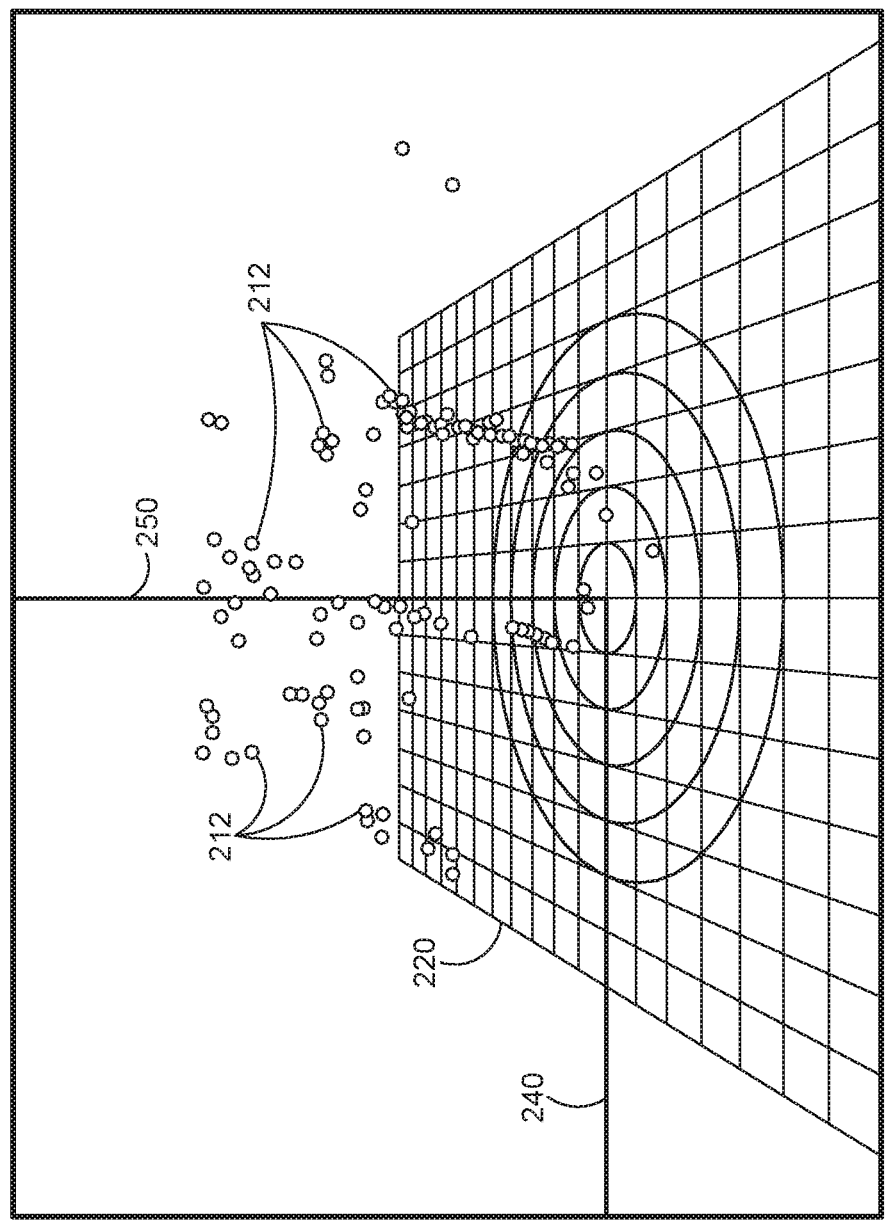
FIG. 2 is a visualization of sample RADAR data generated by a RADAR sensor(s), in accordance with some embodiments of the present disclosure.

By way of illustration, FIG. 2 is a visualization of sample RADAR data generated by a RADAR sensor(s). FIG. 2 shows an example 3D world space with a ground plane 220 and an example coordinate system defined by a first axis 240 and a second axis 250. Generally, a RADAR system may include a transmitter that emits radio waves. The radio waves reflect off of certain objects and materials, and a RADAR sensor (which may correspond to the origin of the coordinate system in FIG. 2) may detect these reflections and reflection characteristics such as bearing, azimuth, elevation, range (e.g., time of beam flight), intensity, Doppler velocity, RADAR cross section (RCS), reflectivity, SNR, and/or the like. Generally, reflections and reflection characteristics may depend on the objects in a scene, speeds, materials, sensor mounting position and orientation, etc. Reflection data may be combined with position and orientation data (e.g., from GNSS and IMU sensors) to generate point clouds. In FIG. 2, each of the RADAR points 212 represents the location of a detected reflection in the world space. Collectively, the RADAR points 212 may form a point cloud representing detected reflections in the scene.

Generally, for the RADAR points 212, the existence of corresponding detected reflections, and/or corresponding values (or null values) may be encoded into a suitable representation of RADAR data using any number of data structures and/or channels (e.g., concatenated vectors, matrices, tensors, images, etc.). In some embodiments, the RADAR points 212 may be used to synthesize a two-dimensional RADAR image of the scene from the perspective of the sensor, with pixel values corresponding to one or more reflection characteristics (e.g., in different layers). For example, a RADAR image layer may include pixel values corresponding to reflectivity (e.g., points with a higher reflectivity being assigned a brighter color). Generally, RADAR imaging may generate any number of layers encoding any reflection characteristic.

Additionally or alternatively to RADAR imaging, a list of detected reflections and/or corresponding reflection characteristics may be identified from the RADAR points 212 and encoded into one or more vectors, matrices, tensors, and/or the like. For example, a threshold value (e.g., a threshold reflectivity) may be applied to identify a discrete set of reflections, the identified reflections and corresponding reflection characteristics may be encoded into corresponding vectors, and the vectors may be concatenated to form a single dimensional input vector. Additionally or alternatively, a list of identified reflections may be pared down to a designated number (e.g., by identifying the designated number of reflections based on some metric such as reflections having the largest reflectivity values, closest range, etc.), the designated reflections and corresponding reflection characteristics may be encoded into corresponding vectors, and the vectors may be concatenated to form a single dimensional input vector. Generally, the number of reflections may be selected to match the dimensionality of the input(s) into the sensor model 120. By way of non-limiting example, a list of 180 reflections, each having values for 5 reflection characteristics (e.g., bearing, elevation, range, velocity, RCS), may be encoded into inputs of the sensor model 120. As such, in some scenarios where there are fewer detected reflections than there are inputs into the sensor model 120, some of the input values may be null or zero. These are just meant as examples, and other ways of encoding RADAR data into a suitable representation may be implemented within the present disclosure. As such, the encoded RADAR data may be used as ground truth data for a training dataset. Although the foregoing example focused on RADAR, similar considerations may be used to encode sensor data for other types of sensors, such as LIDAR sensors, ultrasonic or other acoustic or proximity sensors, GNSS sensors, cameras, IMU sensors (e.g., accelerometers, gyroscopes, magnetic compasses, magnetometers), and/or other sensor types.

For the corresponding input scene configurations, sensor data corresponding to the ground truth data (e.g., sensor data from the same time slice) may be processed and/or encoded into a suitable representation of a scene. By way of non-limiting example, a representation of a scene configuration may be derived from sensor data such as ego-motion sensor(s), camera(s), LIDAR sensor(s), RADAR sensor(s), ultrasonic sensor(s), and/or other sensor(s). Sensor data may be collected by the sensors of the vehicle(s) 102 and/or existing sensor data (e.g., real-world data and/or virtual data stored in the data store(s) 110). For example, image(s) from any number of cameras may be segmented, classified, and/or categorized such as by labeling differing portions of real-world data based on class (e.g., for an image of a landscape, portions of the image—such as pixels or groups of pixels—may be labeled as car, sky, tree, road, building, water, waterfall, vehicle, bus, truck, sedan, etc.). In some embodiments, an encoded input scene configuration may include labeled or annotated sensor data 102 (e.g., images, depth maps, point clouds, etc.) with bounding shapes and/or corresponding class labels (e.g., vehicle, pedestrian, building, airplane, watercraft, street sign, etc.). The result may be one or more images, properties of objects in the scene such as positions or dimensions (e.g., depth maps), classification data identifying objects in a scene (e.g., segmentation masks corresponding to the images), and/or other types of data.

In some embodiments, sensor data—such as LIDAR data (and/or RADAR data) collected by the sensors of the vehicle(s) 102 and/or existing sensor data (e.g., real-world data and/or virtual data stored in the data store(s) 110)—may be used to identify reflections and values for the reflections, as described above with respect to RADAR data. However, some of the reflection characteristics (e.g., Doppler velocity) that are detectable with RADAR may not be detectible as easily (or at all) using commercial LIDAR devices. In some embodiments, a sensor used to derive scene configurations may be selected based on the sensor having a higher accuracy than the ground truth sensor data for the output of the sensor model 120. For example, when predicting RADAR, a LIDAR sensor (or a higher accuracy RADAR sensor) may be used to derive input scene configurations for training data. Reflection data may be encoded and/or derived into a suitable representation of scene configuration using any number of data structures and/or channels (e.g., concatenated vectors, matrices, tensors, images, etc.). For example, reflection data may be combined with position and orientation data (e.g., from GNSS and IMU sensors) to generate LIDAR and/or RADAR point clouds. Any of this LIDAR data and/or RADAR data may be encoded into a suitable representation of a scene configuration using any number of data structures and/or channels (e.g., concatenated vectors, matrices, tensors, images, etc.).

Additionally or alternatively, properties of objects in the scene—such as positions or dimensions and/or classification data—may be generated and used to encode the representation of a scene configuration. For example, in some embodiments, sensor data such as images from one or more cameras, LIDAR data, and/or RADAR data may be used to identify properties of objects in the scene such as positions or dimensions (e.g., depth maps), classification data identifying objects in the scene (e.g., segmentation masks corresponding to the images), and/or other types of data. For example, properties of objects in the scene such as object dimensions may be calculated from LIDAR and/or RADAR data (e.g., point clouds), position data, and/or orientation data (e.g., from GNSS and IMU sensors). Objects may be detected, classified, and/or otherwise identified using object detection (e.g., on image(s), LIDAR data, RADAR data, ultrasonic sensor data, etc.). In some embodiments, the properties of the objects may take the form of bounding shape(s), identified object line(s) or curve(s), or some other identified property (e.g., one-dimensional, two-dimensional, three-dimensional, etc.). In some embodiments, objects may be classified and/or categorized such as by labeling differing portions of real-world data based on class (e.g., for an image of a landscape, portions of the image—such as pixels or groups of pixels—may be labeled as car, sky, tree, road, building, water, waterfall, vehicle, bus, truck, sedan, etc.). In some embodiments, an encoded input scene configuration may include labeled or annotated the sensor data 102 (e.g., images, depth maps, point clouds, etc.) with bounding shapes and/or corresponding class labels (e.g., vehicle, pedestrian, building, airplane, watercraft, street sign, etc.). As such, object data such as object properties and/or classification data may be generated and associated with other data (such as corresponding image(s), LIDAR data, and/or RADAR data), which may be used to encode the representation of a scene configuration.

Figure 3A:
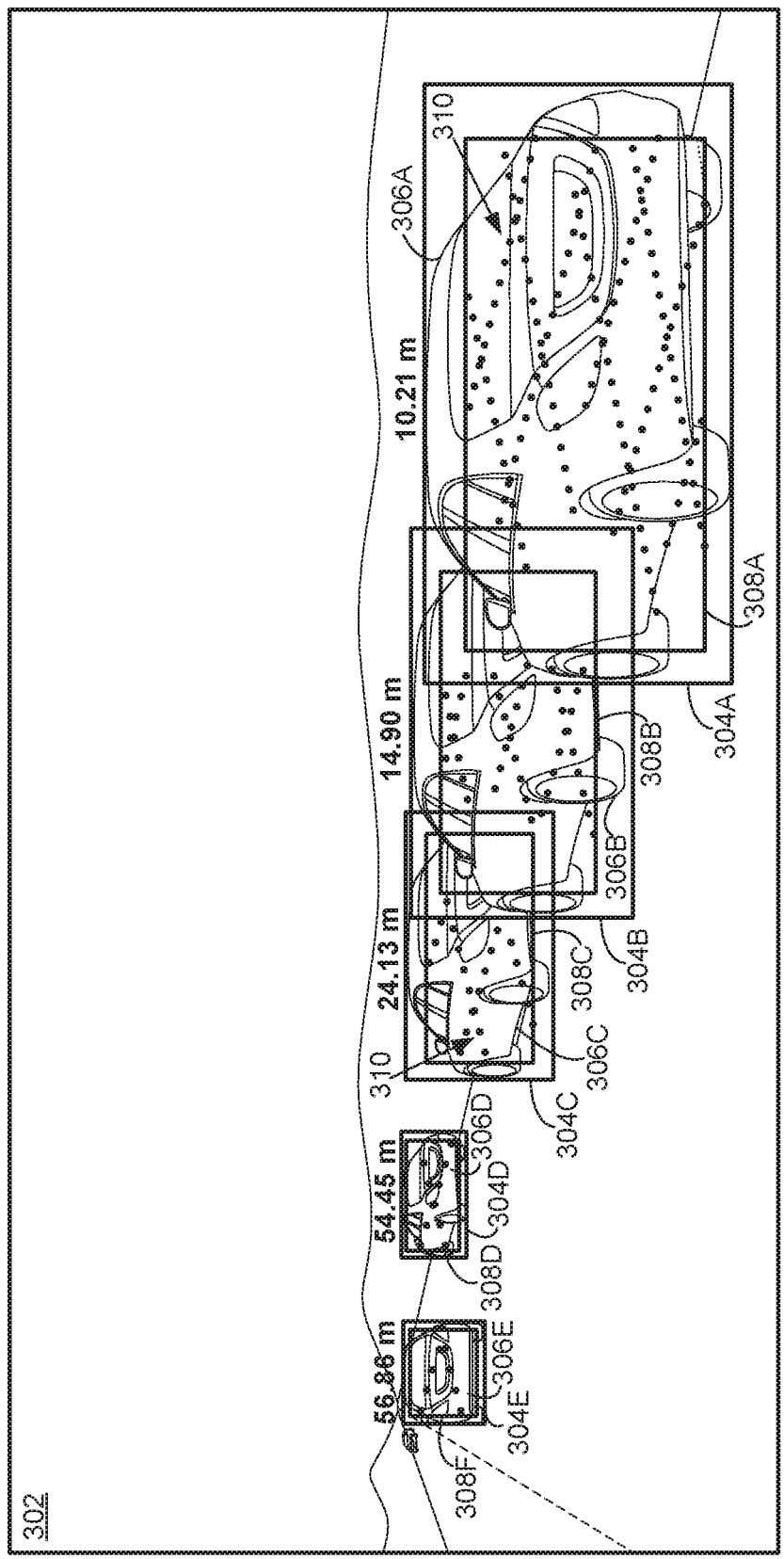
FIG. 3A is a visualization of example object data generated based on LIDAR sensor data, in accordance with some embodiments of the present disclosure.

FIG. 3A is a visualization of example object data generated based on LIDAR sensor data, in accordance with some embodiments of the present disclosure. For example, LIDAR distance(s) may be determined from LIDAR data and used as part of an encoded input scene configuration. By way of non-limiting example, object detection may be performed on an image 302 to identify bounding shapes 304A-304E or some other property or dimension corresponding respectively to objects 306A-306E. Additionally or alternatively, LIDAR data—represented by LIDAR points 310 in the visualization of FIG. 3A—may be associated with the image 302. For example, conversions between world space locations and corresponding image space locations of LIDAR data may be known, or determined, using intrinsic and/or extrinsic parameters—e.g., after calibration—of the LIDAR sensor(s) and/or the camera(s) that generated the image 302. As such, because this relationship between world space and image space is known, and because the LIDAR data and the image data may have been captured substantially simultaneously, the LIDAR data distance predictions may be associated with the various objects 306—or their corresponding bounding shapes 304 or other property or dimension—in the image 302.

Although the LIDAR points are only illustrated within the bounding shapes 304, this is not intended to be limiting and is for illustrative purposes only. In some examples, the LIDAR points may be generated to correspond to the entire image 302, or to correspond to additional or alternative portions of the image 302 than the visualization of FIG. 3A illustrates.

In some embodiments, a cropped bounding shape 308 be generated for each object 306 that is equal to or lesser in size than the bounding shape 304 corresponding to the object. For example, because the bounding shapes 304 output by an object detector (e.g., an object detection neural network, a computer vision algorithm, or another object detection algorithm) may include additional portions of the environment that are not part of the object 306 or obstacle. As such, and in an effort to increase accuracy of the reconciliation of the depth values from the LIDAR data with pixels of the image 302 that correspond to the object 306 or obstacle, the cropped bounding shapes 308 may be created within the bounding shapes 304. Additionally or alternatively, an adjusted property or other dimension may be generated to account for a similar or other effect In some examples, the dimensions of the cropped bounding shapes 308 or other adjusted property or dimension may be determined based on a distance of the object 306 from a reference location (e.g., from the ego-vehicle, from the camera, from the LIDAR sensor, etc.), such that as an object moves further away from a reference location, the amount of cropping or adjustment changes. For example, the amount, percentage (e.g., percentage of the bounding shape 304), or ratio (ratio of the size of the cropped bounding shape 308 with respect to the bounding shape 304, or vice versa) of cropping may decrease as the distance of the object 306 increases, or vice versa. In such examples, there may be a calculated change in the amount, percentage, or ratio of cropping according to distance (e.g., using one or more equations, curves, relationships, functions, etc.), or there may be zones, where particular distance zones correspond to a certain amount, percentage, or ratio of cropping. For instance, at a first range of distances from 0-10 meters, the crop may be 50%, at 10-20 meters, the crop may be 40%, at 20-40 meters, the crop may be 35%, and so on.

In some embodiments, the dimensions of the cropped bounding shapes 308 or other adjusted property or dimension may be determined differently for different sides or edges of the cropped bounding shapes 308. For example, a bottom crop of the bounding shape 304 to generate a corresponding cropped bounding shape 308 may be a different amount, percentage, or ratio than a top crop, a left side crop, and/or a right side crop, a top crop of the bounding shape 304 to generate a corresponding cropped bounding shape 308 may be a different amount, percentage, or ratio than a bottom crop, a left side crop, and/or a right side crop, and so on. For example, a bottom crop may be a set amount, percentage, or ratio for each cropped bounding shape 308 while the top crop may change based on some factor or variable—such as distance from the reference location, type of object, etc.—or vice versa. As a non-limiting example, the bottom crop may always be 10%, while the top crop may be in a range between 10% and 20%, where a value within the range is determined based on some function of distance of the object 306 from a reference location.

In at least one embodiment, the LIDAR points 310 used to determine the distance of an object 306 may be the LIDAR points 310 that correspond to the cropped bounding shape 308. As a result, in such embodiments, the likelihood that the depths or distances determined to correspond to the object 306 actually correspond to the object 306 is increased. In other embodiments, the LIDAR points 310 used to determine the distance to an object may be the LIDAR points 310 that correspond to the bounding shapes 304 (and the cropped bounding shapes 304 may not be used, or generated, in such embodiments). The distance that is associated with each object 306 (e.g., 10.21 meters (m) for the object 306A, 14.90 m for the object 306B, 24.13 m for the object 306C, 54.45 m for the object 306D, and 58.86 m for the object 306E) may be determined using one or more of the LIDAR points 310 associated with the corresponding bounding shape 304 and/or cropped bounding shape 308. For example, distances associated with each of the LIDAR points 310 within the bounding shape 304 and/or the bounding shape 308 may be averaged to generate the final distance value. As another example, a LIDAR point 310 closest to a centroid of the bounding shape 304 and/or the cropped bounding shape 308 may be used to determine the final distance value. In a further example, a group or subset of the LIDAR points 310—such as a subset within a region near a centroid of the bounding shape 304 and/or the cropped bounding shape 308—may be used to determine the final distance value for an object 306 (e.g., by averaging, weighting, and/or otherwise using the distance values associated with each of the group or subset of the LIDAR points 310 to compute the final distance value).

In addition, in some embodiments, to help reduce noise in the LIDAR points 310 projected into the image space, a filtering algorithm may be applied to remove or filter out noisy LIDAR points 310. For example, and without limitation, a random sample consensus (RANSAC) algorithm may be applied to the camera-to-LIDAR data point associations to cluster and filter out the noisy LIDAR points 310. As a result of using a filtering algorithm, such as RANSAC, the surviving LIDAR points 310 that are within a given bounding shape 304 and/or cropped bounding shape 308 may be interpreted to be a common distance away from the camera or other reference location.

Figure 3B:
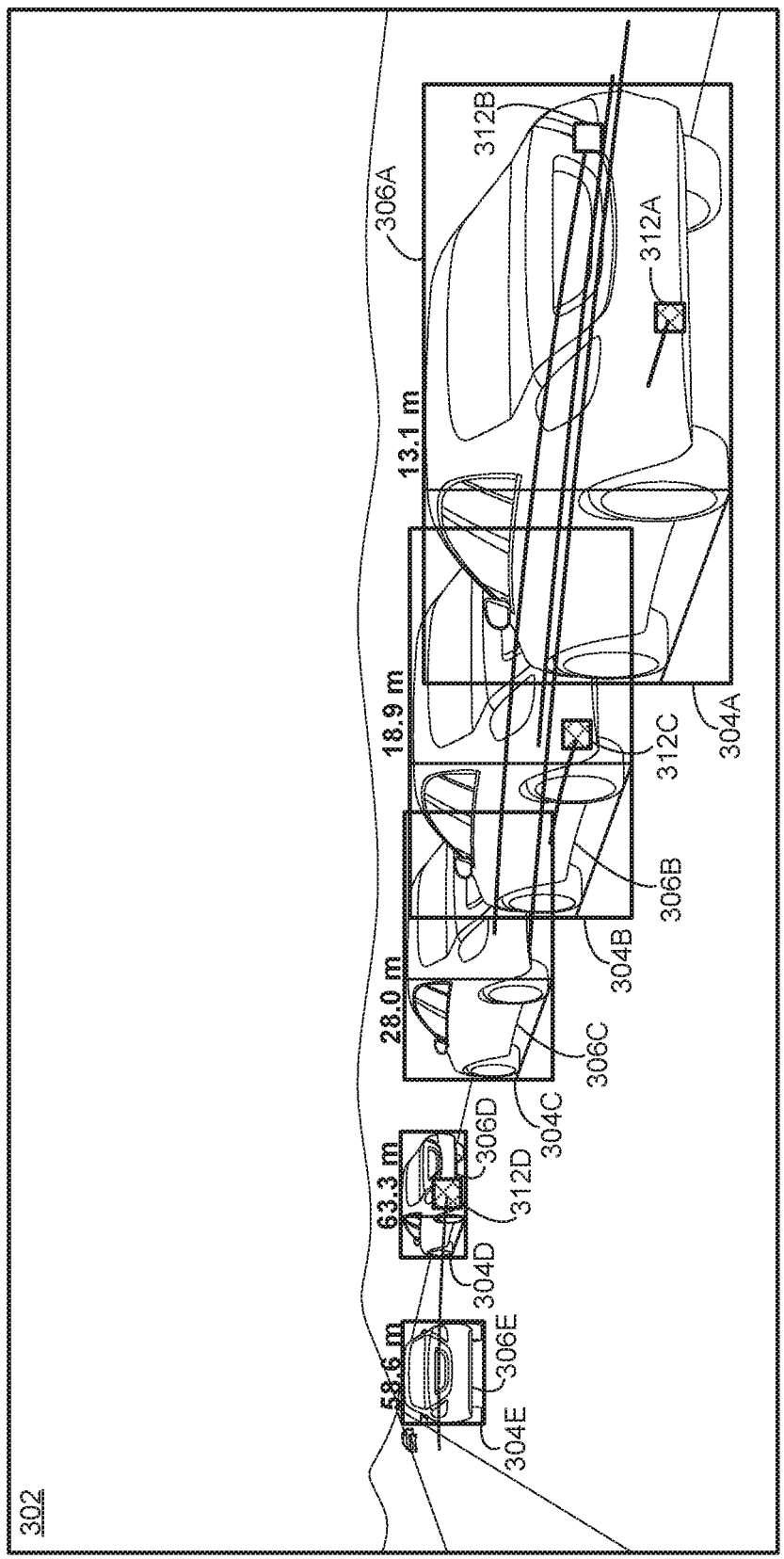
FIG. 3B a visualization of example object data generated based on RADAR sensor data, in accordance with some embodiments of the present disclosure.

FIG. 3B is a visualization of example object data generated based on RADAR sensor data, in accordance with some embodiments of the present disclosure. For example, RADAR distance(s) may be determined from RADAR data and used as part of an encoded input scene configuration. By way of non-limiting example, object detection may be performed on an image 302 to identify bounding shapes 304A-304E or some other property or dimension corresponding respectively to objects 306A-306E. Additionally or alternatively, RADAR data—represented by RADAR points 312 in the visualization of FIG. 3B—may be associated with the image 302. For example, conversions between world space locations and corresponding image space locations of RADAR data may be known, or determined, using intrinsic and/or extrinsic parameters—e.g., after calibration—of the RADAR sensor(s) and/or the camera(s) that generated the image 302. In some embodiments, RADAR target clustering and tracking may be used to determine the associations between RADAR points 312 and objects 306—or bounding shapes 304 or other property or dimension corresponding thereto. As such, because this relationship between world space and image space is known, and because the RADAR data and the image data may have been captured substantially simultaneously, the RADAR data distance predictions may be associated with the various objects 306—or their corresponding bounding shapes 304 or other property or dimension—in the image 302.

Although the RADAR points 312 are only illustrated within the bounding shapes 304, this is not intended to be limiting and is for illustrative purposes only. In some examples, the RADAR points may be generated to correspond to the entire image 302, or to correspond to additional or alternative portions of the image 302 than the visualization of FIG. 3B illustrates. Additionally or alternatively, an adjusted property or other dimension may be generated to account for a similar or other effect In some embodiments, similar to the description herein with respect to the FIG. 3A, a cropped bounding shape 308 (not illustrated in FIG. 3B) may be generated for each object 306 that is equal to or lesser in size than the bounding shape 304 corresponding to the object. In such embodiments, and in an effort to increase accuracy of the reconciliation of the depth values from the RADAR data with pixels of the image 302 that correspond to the object 306 or obstacle, the cropped bounding shapes 308 may be created within the bounding shapes 304. As such, in at least one embodiment, the RADAR points 312 used to determine the distance of an object 306 may be the RADAR points 312 that correspond to the cropped bounding shape 308.

The distance that is associated with each object 306 (e.g., 13.1 m for the object 306A, 18.9 m for the object 306B, 28.0 m for the object 306C, 63.3 m for the object 306D, and 58.6 m for the object 306E) may be determined using one or more of the RADAR points 312 associated with the corresponding bounding shape 304 and/or cropped bounding shape 308. For example, distances associated with each of the RADAR points 312 within the bounding shape 304 (e.g., the RADAR points 312A and 312B in FIG. 3B) and/or the bounding shape 308 may be averaged to generate the final distance value. As another example, a single RADAR point 312 may be selected for use in computing the final distance value. For example, as illustrated in FIG. 3B, the RADAR point 312A may be used for the object 306A (as indicated by the cross-hatching) while the RADAR point 312B may not be used. For example, a confidence may be associated with the camera-to-RADAR points such that a higher confidence point may be selected (e.g., the RADAR point 312A may be selected over the RADAR point 312B). The confidence may be determined using any calculation, such as, without limitation, a distance to a centroid of the bounding shape 304 and/or the cropped bounding shape 308.

Once the final distance values have been determined for each object 306 using the LIDAR data and/or the RADAR data (and/or SONAR data, ultrasonic data, etc.), a determination may be made as to which of the final distance values should be used for each object 306 may be made. For example, for each object 306, a determination may be made as to whether the LIDAR distance(s), the RADAR distance(s), and/or a combination thereof should be used for generating a representation of an input scene configuration, such as a depth map. Where a distance for a particular object 306 has only been computed from one depth sensor modality (e.g., RADAR or LIDAR), the distance associated with the object 306 may be the distance from the one depth sensor modality. Where two or more modalities have computed distances for a particular object 306, a noisiness threshold may be used to determine which modality(ies) to use for the distance values. In some non-limiting embodiments, the noisiness threshold may be optimized as a hyper-parameter. Although any number of depth sensor modalities may be used, in examples using RADAR and LIDAR, a single modality may be selected over the other where both have corresponding depth values for an object. For example, LIDAR distance(s) may be selected over RADAR distance(s), or vice versa. In other examples, one modality may be selected below a threshold distance and another may be selected beyond the threshold distance. In such examples, the LIDAR distance(s) may be used at closer distances (e.g., within 40 meters of the camera or other reference location), and RADAR distance(s) may be used at further distances (e.g., further than 40 meters from the camera or other reference location). Using a threshold distance in this way may leverage the accuracy of various depth sensor modalities over varying distance ranges. In at least one embodiment, the LIDAR distance(s) and the RADAR distance(s), where both are computed for an object 306, may be averaged or weighted to compute a single combined distance value. For example, the two distances may be averaged with equal weight, or one modality may be weighted greater than the other. Where weighting is used, the determination of the weight for each modality may be constant (e.g., 60% for LIDAR and 40% for RADAR) or may vary depending on some factor, such as distance (e.g., within 50 meters of the camera or other reference location, LIDAR is weighted 70% and RADAR is weighted 30%, while beyond 50 meters of the camera or other reference location, LIDAR is weighted 40% and RADAR is weighted 60%). As such, the determination of which distance value should be the final distance value for a particular object 306 may be made using one or more depth sensor modalities and may depend on a variety of factors (e.g., availability of data from various depth sensor modalities, distance of an object from the reference location, noisiness of the data, etc.).

In some examples, the LIDAR distance(s) and/or the RADAR distance(s) may be further enhanced by applying a time-domain state estimator—based on a motion model—on object tracks. Using this approach, noisy readings from LIDAR and/or RADAR may be filtered out. A state estimator may further model covariance of the state, which may represent a measure of uncertainty on the depth value. Such a measure may be utilized in training and evaluation of the sensor model 120, for instance, by down-weighting loss for high uncertainty samples.

Once a final distance value(s) has been selected for an object 306, one or more pixels of the image 302 may be encoded with the final depth value(s) to generate a depth map, for example. In some non-limiting embodiments, to determine the one or more pixels to be encoded for the object 306, each of the pixels associated with the bounding shape 304 and/or the cropped bounding shape 308 may be encoded with the final distance value(s). However, in such examples, where two or more bounding shapes 304 and/or cropped bounding shapes 308 at least partially overlap (e.g., one bounding shape 304 occludes another), using each of the pixels of the bounding shape 304 and/or the cropped bounding shape 308 may result in one or more of the objects 306 not being represented sufficiently in the depth map. As such, in some embodiments, a shape—such as a circle or ellipse—may be generated for each object. The shape, in some examples, may be centered at a centroid of the bounding shape 304 and/or the cropped bounding shape 308. By generating a circle or ellipse, the potential for occlusion leading to lack of representation of an object 306 in the depth map may be reduced, thereby increasing the likelihood that each of the objects 306 are represented in the depth map. As a result, the depth map may represent the distance(s) encoded onto an image—e.g., a depth map image. The depth map—or depth map image—may then be used as a representation of an input scene configuration (or portion thereof) for training data. For example, the depth map may be input into a channel of the sensor model 120. This is meant simply as an example, and other ways of identifying other object properties or dimension may be implemented within the scope of the present disclosure.

In some embodiments, objects may be classified and/or categorized such as by labeling differing portions of real-world data based on class (e.g., for an image of a landscape, portions of the image—such as pixels or groups of pixels—may be labeled as car, sky, tree, road, building, water, waterfall, vehicle, bus, truck, sedan, etc.). Whether automatically and/or manually generating annotations, the annotations for training data (e.g., training images) may be generated within a drawing program (e.g., an annotation program), a computer aided design (CAD) program, a labeling program, another type of program suitable for generating the annotations, and/or may be hand drawn, in some examples. In any example, the annotations may be synthetically produced (e.g., generated from computer models or renderings), real produced (e.g., designed and produced from real-world data), machine-automated (e.g., using feature analysis and learning to extract features from data and then generate labels), human annotated (e.g., labeler, or annotation expert, defines the location of the labels), and/or a combination thereof (e.g., human formulates one or more rules or labeling conventions, machine generates annotations).

In some examples, the LIDAR data, RADAR data, ultrasonic sensor data, image data, and/or other sensor data 102 that is used to derive an input scene configuration to the sensor model 120 (whether for training or in operation) may be generated in a virtual or simulated environment. For example, with respect to a virtual vehicle (e.g., a car, a truck, a water vessel, a construction vehicle, an aircraft, a drone, etc.), the virtual vehicle may include virtual sensors (e.g., virtual cameras, virtual LIDAR, virtual RADAR, virtual SONAR, etc.) that capture simulated or virtual data of the virtual or simulated environment. As such, in some embodiments, in addition to or alternatively from real-world data being used to derive an input scene configuration to the sensor model 120, simulated or virtual sensor data may be used and thus included in the sensor data 102.

As such, LIDAR data, RADAR data, ultrasonic sensor data, images from one or more cameras, properties of objects in the scene such as positions or dimensions (e.g., depth maps), classification data identifying objects in the scene (e.g., segmentation masks corresponding to the images), and/or other types of data may be encoded into a suitable representation of a scene configuration using any number of data structures and/or channels (e.g., concatenated vectors, matrices, tensors, images, etc.). Although the foregoing examples involve the use of LIDAR, RADAR, and camera image(s), other types of sensor day may additionally or alternatively be used to generate encoded scene configurations. Accordingly, the encoded scene configurations may be used as input data for a training dataset.

Using the Training Data to Learn a Sensor Model

Returning now to FIG. 1, the training sub-system 106 may train a sensor model to learn a transformation from an encoded scene configuration to virtual sensor data. For example, training sub-system 106 may use a deep-learning platform to define training applications and to run the training application on a compute cluster (e.g., of the training sub-system 106). The compute cluster may include one or more GPU-powered servers (e.g., GPU servers 108) that may each include a plurality of GPUs, PCIe switches, and/or CPUs, interconnected with high-speed interconnects such as NVLink and PCIe connections. In some examples, a local cache (high-bandwidth scaled out file system) may be available next to the compute cluster and used to cache datasets next to the compute nodes. The system may handle the caching and may provide a local dataset to the compute job. The training apps may produce trained models and experimental metadata that may be stored in a model data store for further consumption.

In some examples, active learning may be used. For example, existing trained sensor models may be used to mine for more training data. The system may use existing models to score (or inference) newly collected data and/or raw data and to compute a confidence score for each piece of data. The confidence score may be representative of how informative or useful the data may be for training. For example, data already used that is modeled by an existing model may not provide much or any incremental value, while new data that the model poorly predicts may be reused to improve the model for real-world driving applications. In other words, data that sensor models are already trained to process accurately may not be as useful as data that the sensor models are not trained to process accurately. Active learning may be used to identify the data that may be used to provide increased performance for the sensor models in additional or alternative situations or environments.

Generally, a sensor model may be learned for any number of sensor types, SKUs, sensor installation locations, and the like. In some embodiments, a sensor model may be trained to predict virtual sensor data for a particular sensor installation location. In some embodiments, a sensor model may be adaptable to multiple sensor installation location, for example, by training the sensor model with sensor data corresponding to multiple sensor installation locations, by training the sensor model with sensor data for a first sensor installation location and then using transfer learning to adapt the sensor model to a second installation location, by adding an encoder to the sensor model to adapt the sensor model to an alternate installation location, and/or in other ways.

Further, although some embodiments are described with respect to automotive sensors, sensor models may be learned for other sensors in other applications (e.g., non-autonomous vehicles, robots, unmanned aerial vehicles, sensing pedestrian traffic in public places (e.g., supermarkets, airports, city parks), and/or any other type of sensing application).

Once trained, a sensor model may be validated and/or verified by a validation/verification sub-system. The validation/verification sub-system may include similar components and/or features as the training sub-system 106. In some examples, the training sub-system 106 and the validation/verification sub-system may include the same hardware components, while in other examples the hardware components may differ. The validation/verification sub-system may verify and/or validate performance, accuracy, and/or other criteria associated with the sensor model.

Once trained and/or validated, one or more sensor models may be used as virtual sensors in any of a variety of applications, such as in a simulated environment to test one or more autonomous or semi-autonomous driving software stacks that may include a multitude of DNNs, in a re-simulation system that uses physical sensor data in combination with virtual sensor data to train, test, verify, and/or validate one or more DNNs for use in software stacks, or otherwise.

Simulation System

In some embodiments, a learned sensor model may be used as a virtual sensor in a simulated environment to test one or more autonomous or semi-autonomous driving software stacks. For example, the simulation system 400—e.g., represented by simulation systems 400A, 400B, 400C, and 400D in FIGS. 4A-D, and described in more detail below—may generate a global simulation that simulates a virtual world or environment (e.g., a simulated environment) that may include artificial intelligence (AI) vehicles or other objects (e.g., pedestrians, animals, etc.), hardware-in-the-loop (HIL) vehicles or other objects, software-in-the-loop (SIL) vehicles or other objects, and/or person-in-the-loop (PIL) vehicles or other objects. The global simulation may be maintained within an engine (e.g., a game engine), or other software-development environment, that may include a rendering engine (e.g., for 2D and/or 3D graphics), a physics engine (e.g., for collision detection, collision response, etc.), sound, scripting, animation, AI, networking, streaming, memory management, threading, localization support, scene graphs, cinematics, and/or other features. In some examples, as described herein, one or more vehicles or objects within the simulation system 400 (e.g., HIL objects, SIL objects, PIL objects, AI objects, etc.) may be maintained within their own instance of the engine. In such examples, a virtual sensor for each virtual object may include its own instance of the engine (e.g., an instance for a virtual camera, a second instance for a virtual LIDAR sensor, a third instance for another virtual LIDAR sensor, etc.). As such, an instance of the engine may be used for processing sensor data for each sensor with respect to the sensor's perception of the global simulation. As such, for a virtual camera, the instance may be used for processing image data with respect to the camera's field of view in the simulated environment. As another example, for an IMU sensor, the instance may be used for processing IMU data (e.g., representative of orientation) for the object in the simulated environment.

AI (e.g., bots) vehicles or other objects may include pedestrians, animals, third-party vehicles, vehicles, and/or other object types. The AI objects in the simulated environment may be controlled using artificial intelligence (e.g., machine learning such as neural networks, rules-based control, a combination thereof, etc.) in a way that simulates, or emulates, how corresponding real-world objects would behave. In some examples, the rules, or actions, for AI objects may be learned from one or more HIL objects, SIL objects, and/or PIL objects. In an example where an AI object (e.g., bot) in the simulated environment corresponds to a pedestrian, the bot may be trained to act like a pedestrian in any of a number of different situations or environments (e g, running, walking, jogging, not paying attention, on the phone, raining, snowing, in a city, in a suburban area, in a rural community, etc.). As such, when the simulated environment is used for testing vehicle performance (e.g., for HIL or SIL embodiments), the bot (e.g., the pedestrian) may behave as a real-world pedestrian would (e.g., by jaywalking in rainy or dark conditions, failing to heed stop signs or traffic lights, etc.), in order to more accurately simulate a real-world environment. This method may be used for any AI bot in the simulated environment, such as vehicles, bicyclists, or motorcycles, whose AI bots may also be trained to behave as real-world objects would (e.g., weaving in and out of traffic, swerving, changing lanes with no signal or suddenly, braking unexpectedly, etc.).

The AI objects that may be distant from the vehicle of interest (e.g., the ego-vehicle in the simulated environment) may be represented in a simplified form—such as a radial distance function, or list of points at known positions in a plane, with associated instantaneous motion vectors. As such, the AI objects may be modeled similarly to how AI agents may be modeled in videogame engines.

HIL vehicles or objects may use hardware that is used in the physical vehicles or objects to at least assist in some of the control of the HIL vehicles or objects in the simulated environment. For example, a vehicle controlled in a HIL environment may use one or more SoCs 1104 (FIG. 11C), CPU(s) 1118, GPU(s) 1120, etc., in a data flow loop for controlling the vehicle in the simulated environment. In some examples, the hardware from the vehicles may be an NVIDIA DRIVE AGX Pegasus™ compute platform and/or an NVIDIA DRIVE PX Xavier™ compute platform. For example, the vehicle hardware (e.g., vehicle hardware 104) may include some or all of the components and/or functionality described in U.S. Non-Provisional application Ser. No. 16/186,473, filed on Nov. 9, 2018, which is hereby incorporated by reference in its entirety. In such examples, at least some of the control decisions may be generated using the hardware that is configured for installation within a real-world autonomous vehicle (e.g., the vehicle 102) to execute at least a portion of a software stack(s) 116 (e.g., an autonomous driving software stack).

SIL vehicles or objects may use software to simulate or emulate the hardware from the HIL vehicles or objects. For example, instead of using the actual hardware that may be configured for use in physical vehicles (e.g., the vehicle 102), software, hardware, or a combination thereof may be used to simulate or emulate the actual hardware (e.g., simulate the SoC(s) 1104).

PIL vehicles or objects may use one or more hardware components that allow a remote operator (e.g., a human, a robot, etc.) to control the PIL vehicle or object within the simulated environment. For example, a person or robot may control the PIL vehicle using a remote control system (e.g., including one or more pedals, a steering wheel, a VR system, etc.), such as the remote control system described in U.S. Non-Provisional application Ser. No. 16/366,506, filed on Mar. 27, 2019, and hereby incorporated by reference in its entirety. In some examples, the remote operator may control autonomous driving level 0, 1, or 2 (e.g., according to the Society of Automotive Engineers document J3016) virtual vehicles using a VR headset and a CPU(s) (e.g., an X86 processor), a GPU(s), or a combination thereof. In other examples, the remote operator may control advanced AI-assisted level 2, 3, or 4 vehicles modeled using one or more advanced SoC platforms. In some examples, the PIL vehicles or objects may be recorded and/or tracked, and the recordings and/or tracking data may be used to train or otherwise at least partially contribute to the control of AI objects, such as those described herein.

Figure 4A:
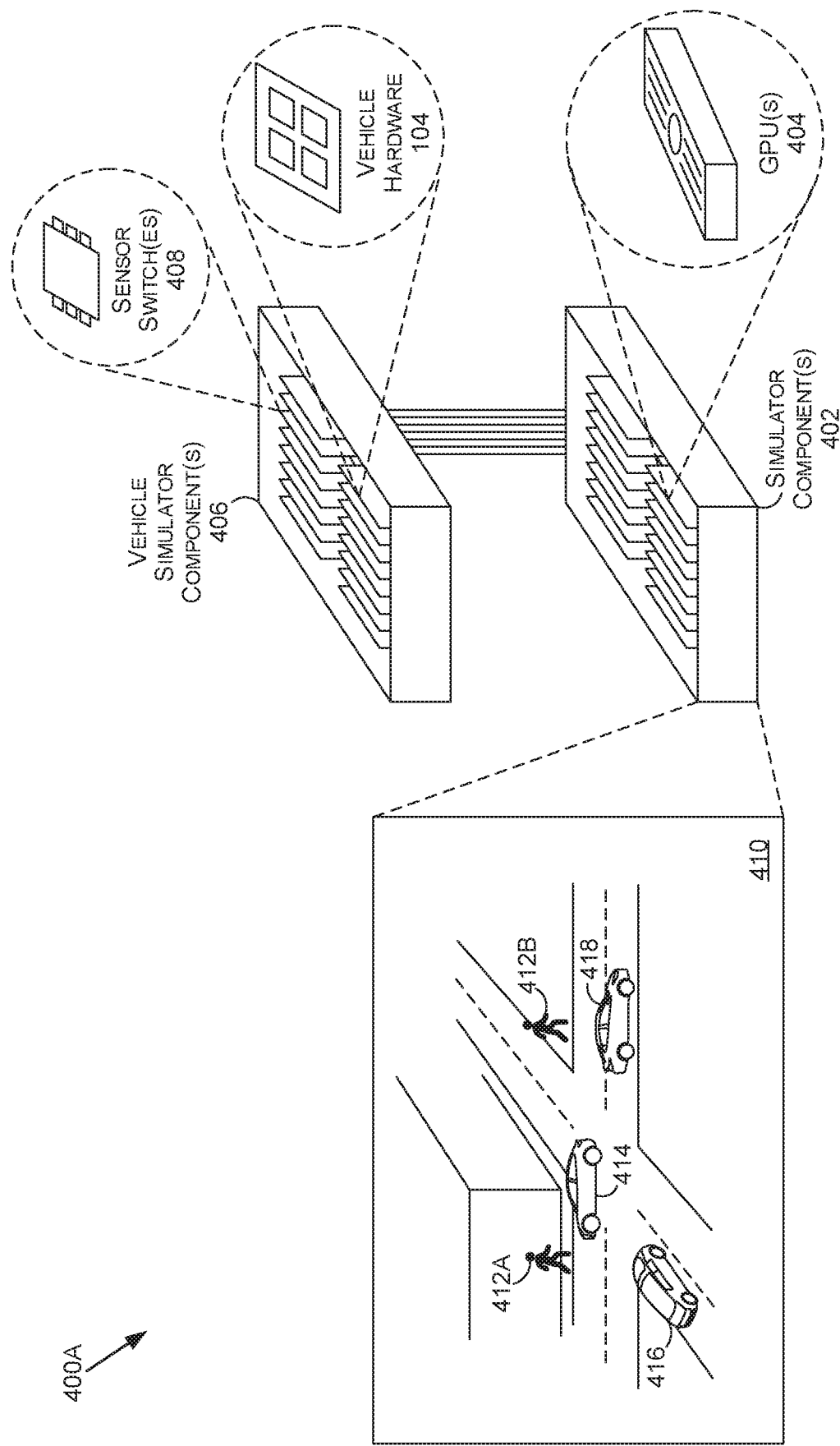
FIGS. 4A-4F are example illustrations of a simulation system, in accordance with some embodiments of the present disclosure.

Now referring to FIG. 4A, FIG. 4A is an example illustration of a simulation system 400A, in accordance with some embodiments of the present disclosure. The simulation system 400A may generate a simulated environment 410 that may include AI objects 412 (e.g., AI objects 412A and 412B), HIL objects 414, SIL objects 416, PIL objects 418, and/or other object types. The simulated environment 410 may include features of a driving environment, such as roads, bridges, tunnels, street signs, stop lights, crosswalks, buildings, trees and foliage, the sun, the moon, reflections, shadows, etc., in an effort to simulate a real-world environment accurately within the simulated environment 410. In some examples, the features of the driving environment within the simulated environment 410 may be more true-to-life by including chips, paint, graffiti, wear and tear, damage, etc. Although described with respect to a driving environment, this is not intended to be limiting, and the simulated environment may include an indoor environment (e.g., for a robot, a drone, etc.), an aerial environment (e.g., for a UAV, a drone, an airplane, etc.), an aquatic environment (e.g., for a boat, a ship, a submarine, etc.), and/or another environment type.

The simulated environment 410 may be generated using virtual data, real-world data, or a combination thereof. For example, the simulated environment may include real-world data augmented or changed using virtual data to generate combined data that may be used to simulate certain scenarios or situations with different and/or added elements (e.g., additional AI objects, environmental features, weather conditions, etc.). For example, pre-recorded video may be augmented or changed to include additional pedestrians, obstacles, and/or the like, such that the virtual objects (e.g., executing the software stack(s) 116 as HIL objects and/or SIL objects) may be tested against variations in the real-world data.

The simulated environment may be generated using rasterization, ray-tracing, using DNNs such as generative adversarial networks (GANs), another rendering technique, and/or a combination thereof. For example, in order to create more true-to-life, realistic lighting conditions (e.g., shadows, reflections, glare, global illumination, ambient occlusion, etc.), the simulation system 400A may use real-time ray-tracing. In one or more embodiments, one or more hardware accelerators may be used by the simulation system 400A to perform real-time ray-tracing. The ray-tracing may be used to simulate LIDAR sensor for accurate generation of LIDAR data. For example, ray casting may be used in an effort to simulate LIDAR reflectivity. In another example, virtual LIDAR data may be generated using a learned sensor model, as described in more detail above. In any example, ray-tracing techniques used by the simulation system 400A may include one or more techniques described in U.S. Provisional Patent Application No. 62/644,385, filed Mar. 17, 2018, U.S. Provisional Patent Application No. 62/644,386, filed Mar. 17, 2018, U.S. Provisional Patent Application No. 62/644,601, filed Mar. 19, 2018, and U.S. Provisional Application No. 62/644,806, filed Mar. 19, 2018, U.S. Non-Provisional patent application Ser. No. 16/354,983, filed on Mar. 15, 2019, and/or U.S. Non-Provisional patent application Ser. No. 16/355,214, filed on Mar. 15, 2019, each of which is hereby incorporated by reference in its entirety.

In some examples, the simulated environment may be rendered, at least in part, using one or more DNNs, such as generative adversarial neural networks (GANs). For example, real-world data may be collected, such as real-world data captured by autonomous vehicles (e.g., camera(s), LIDAR sensor(s), RADAR sensor(s), etc.), robots, and/or other objects, as well as real-world data that may be captured by any sensors (e.g., images or video pulled from data stores, online resources such as search engines, etc.). The real-world data may then be segmented, classified, and/or categorized, such as by labeling differing portions of the real-world data based on class (e.g., for an image of a landscape, portions of the image—such as pixels or groups of pixels—may be labeled as car, sky, tree, road, building, water, waterfall, vehicle, bus, truck, sedan, etc.). A GAN (or other DNN or machine learning model) may then be trained using the segmented, classified, and/or categorized data to generate new versions of the different types of objects, landscapes, and/or other features as graphics within the simulated environment.

The simulator component(s) 402 of the simulation system 400 may communicate with vehicle simulator component(s) 406 over a wired and/or wireless connection. In some examples, the connection may be a wired connection using one or more sensor switches 408, where the sensor switches may provide low-voltage differential signaling (LVDS) output. For example, the sensor data (e.g., image data) may be transmitted over an HDMI to LVDS connection between the simulator component(s) 402 and the vehicle simulator component(s) 406. The simulator component(s) 402 may include any number of compute nodes (e.g., computers, servers, etc.) interconnected in order to ensure synchronization of the world state. In some examples, as described herein, the communication between each of the compute nodes (e.g., the vehicle simulator component(s) compute nodes and the simulator component(s) compute nodes) may be managed by a distributed shared memory (DSM) system (e.g., DSM 424 of FIG. 4C) using a distributed shared memory protocol (e.g., a coherence protocol). The DSM may include a combination of hardware (cache coherence circuits, network interfaces, etc.) and software. This shared memory architecture may separate memory into shared parts distributed among nodes and main memory, or distributing all memory between all nodes. In some examples, InfiniBand (IB) interfaces and associated communications standards may be used. For example, the communication between and among different nodes of the simulation system 400 (and/or 600) may use IB.

The simulator component(s) 402 may include one or more GPUs 404. The virtual vehicle being simulated may include any number of sensors (e.g., virtual or simulated sensors) that may correspond to one or more of the sensors described herein at least with respect to FIGS. 11A-11C. Any or all of the sensors of the simulator component(s) 402 may be implemented using a corresponding learned sensor model, as described in more detail above. In some examples, each sensor of the vehicle may correspond to, or be hosted by, one of the GPUs 404. For example, processing for a LIDAR sensor may be executed on a first GPU 404, processing for a wide-view camera may be executed on a second GPU 404, processing for a RADAR sensor may be executed on a third GPU, and so on. As such, the processing of each sensor with respect to the simulated environment may be capable of executing in parallel with each other sensor using a plurality of GPUs 404 to enable real-time simulation. In other examples, two or more sensors may correspond to, or be hosted by, one of the GPUs 404. In such examples, the two or more sensors may be processed by separate threads on the GPU 404 and may be processed in parallel. In other examples, the processing for a single sensor may be distributed across more than one GPU. In addition to, or alternatively from, the GPU(s) 404, one or more TPUs, CPUs, and/or other processor types may be used for processing the sensor data.

Figure 4B:
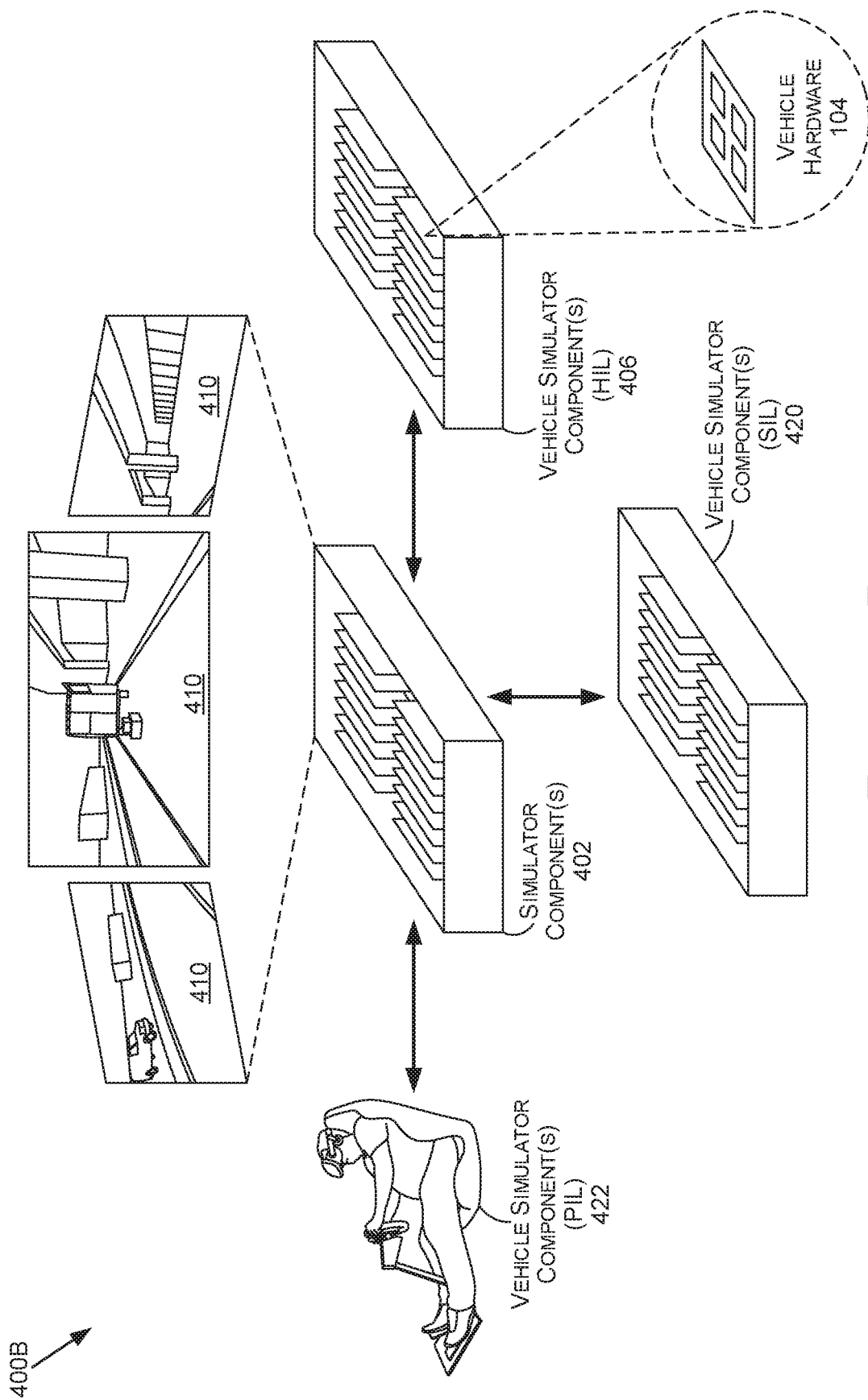
Figure 4C:
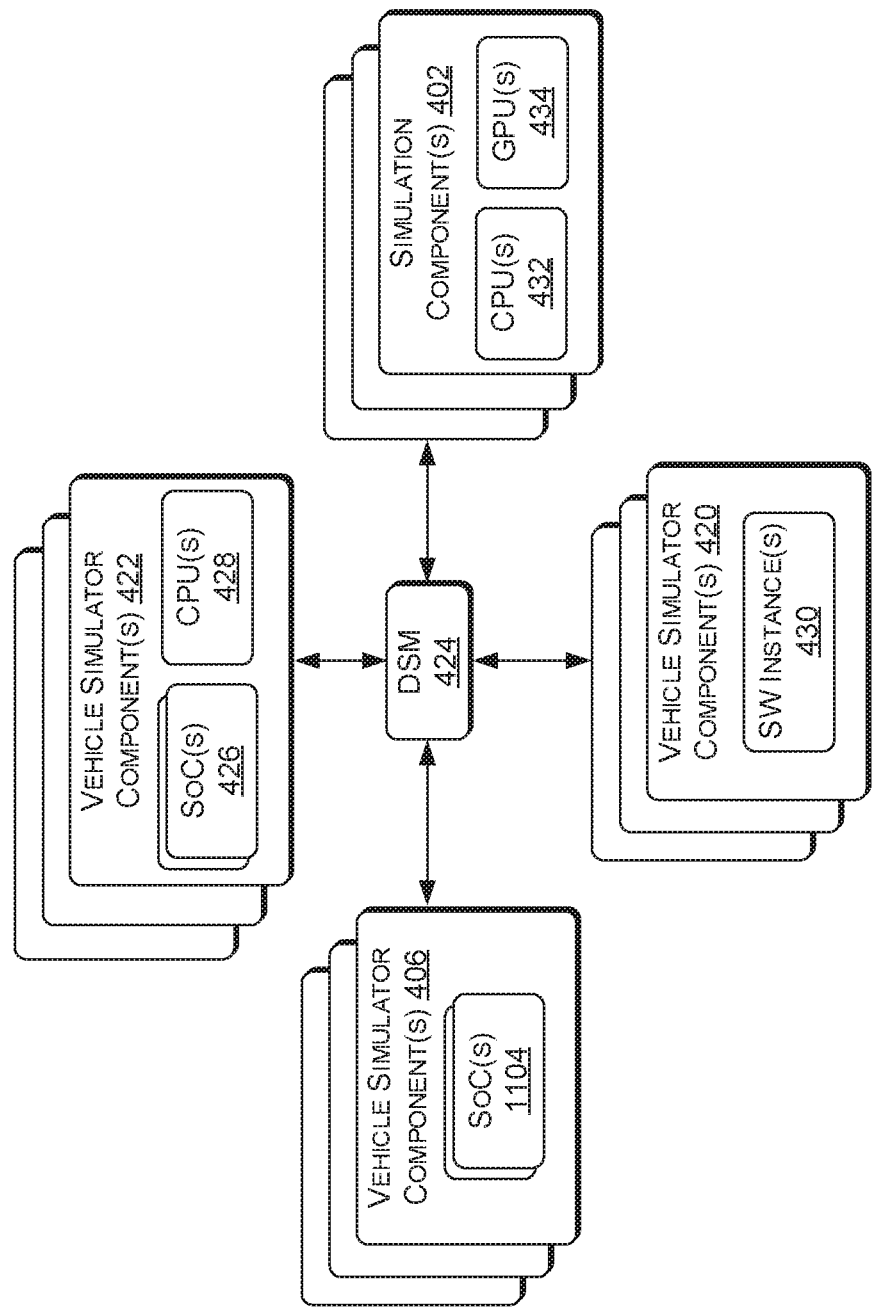

Vehicle simulator component(s) 406 may include a compute node of the simulation system 400A that corresponds to a single vehicle represented in the simulated environment 410. Each other vehicle (e.g., 414, 418, 416, etc.) may include a respective node of the simulation system. As a result, the simulation system 400A may be scalable to any number of vehicles or objects as each vehicle or object may be hosted by, or managed by, its own node in the system 400A. In the illustration of FIG. 4A, the vehicle simulator component(s) 406 may correspond to a HIL vehicle (e.g., because the vehicle hardware 104 is used). However, this is not intended to be limiting and, as illustrated in FIGS. 4B and 4C, the simulation system 400 may include SIL vehicles, HIL vehicles, PIL vehicles, and/or AI vehicles. The simulator component(s) 402 (e.g., simulator host device) may include one or more compute nodes of the simulation system 400A, and may host the simulation of the environment with respect to each actor (e.g., with respect to each HIL, SIL, PIL, and AI actors), as well as hosting the rendering and management of the environment or world state (e.g., the road, signs, trees, foliage, sky, sun, lighting, etc.). In some examples, the simulator component(s) 402 may include a server(s) and associated components (e.g., CPU(s), GPU(s), computers, etc.) that may host a simulator (e.g., NVIDIA's DRIVE™ Constellation AV Simulator).

The vehicle hardware 104, as described herein, may correspond to the vehicle hardware 104 of FIG. 1 that may be used in the physical vehicle 102. However, in the simulation system 400A, the vehicle hardware 104 may be incorporated into the vehicle simulator component(s) 406. As such, because the vehicle hardware 104 may be configured for installation within the vehicle 102, the simulation system 400A may be specifically configured to use the vehicle hardware 104 within a node (e.g., of a server platform) of the simulation system 400A. For example, similar interfaces used in the physical vehicle 102 may need to be used by the vehicle simulator component(s) 406 to communicate with the vehicle hardware 104. In some examples, the interfaces may include: (1) CAN interfaces, including a PCAN adapter, (2) Ethernet interfaces, including RAW UDP sockets with IP address, origin, VLA, and/or source IP all preserved, (3) Serial interfaces, with a USB to serial adapter, (4) camera interfaces, (5) InfiniBand (IB) interfaces, and/or other interface types.

In any examples, once the sensor data representative of a field(s) of view of the sensor(s) of the vehicle in the simulated environment has been generated and/or processed (e.g., using one or more codecs, as described herein), the sensor data (and/or encoded sensor data) may be used by the software stack(s) 116 (e.g., the autonomous driving software stack) executed on the vehicle hardware 104 to perform one or more operations (e.g., generate one or more controls, route planning, detecting objects, identifying drivable freespace, monitoring the environment for obstacle avoidance, etc.). As a result, the identical, or substantially identical, hardware components used by the vehicle 102 (e.g., a physical vehicle) to execute the autonomous driving software stack in real-world environments may be used to execute the autonomous driving software stack in the simulated environment 410. The use of the vehicle hardware 104 in the simulation system 400A thus provides for a more accurate simulation of how the vehicle 102 will perform in real-world situations, scenarios, and environments without having to actually find and test the vehicle 102 in the real-world. This may reduce the amount of driving time required for testing the hardware/software combination used in the physical vehicle 102 and may reduce safety risks by not requiring actual real-world testing (especially for dangerous situations, such as other vehicles driving erratically or at unsafe speeds, children playing in the street, ice on a bridge, etc.).

In addition to the vehicle hardware 104, the vehicle simulator component(s) 406 may manage the simulation of the vehicle (or other object) using additional hardware, such as a computer—e.g., an X86 box. In some examples, additional processing for virtual sensors (e.g., learned sensor models) of the virtual object may be executed using the vehicle simulation component(s) 406. In such examples, at least some of the processing may be performed by the simulator component(s) 402, and other of the processing may be executed by the vehicle simulator component(s) 406 (or 420, or 422, as described herein). In other examples, the processing of the virtual sensors may be executed entirely on the vehicle simulator component(s) 406.

Now referring to FIG. 4B, FIG. 4B is another example illustration of a simulation system 400B, in accordance with some embodiments of the present disclosure. The simulation system 400B may include the simulator component(s) 402 (as one or more compute nodes), the vehicle simulator component(s) 406 (as one or more compute nodes) for a HIL object(s), the vehicle simulator component(s) 420 (as one or more compute nodes) for a SIL object(s), the vehicle simulator component(s) 406 (as one or more compute nodes) for a PIL object(s), and/or additional component(s) (or compute nodes) for AI objects and/or other object types. Each of the PIL, HIL, SIL, AI, and/or other object type compute nodes may communicate with the simulator component(s) 402 to capture from the global simulation at least data that corresponds to the respective object within the simulate environment 410.

For example, the vehicle simulator component(s) 422 may receive (e.g., retrieve, obtain, etc.), from the global simulation (e.g., represented by the simulated environment 410) hosted by the simulator component(s) 402, data that corresponds to, is associated with, and/or is required by the vehicle simulator component(s) 422 to perform one or more operations by the vehicle simulator component(s) 422 for the PIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the PIL object may be received from the simulator component(s) 402. This data may be used to generate an instance of the simulated environment corresponding to the field of view of a remote operator of the virtual vehicle controlled by the remote operator, and the portion of the simulated environment may be projected on a display (e.g., a display of a VR headset, a computer or television display, etc.) for assisting the remote operator in controlling the virtual vehicle through the simulated environment 410. The controls generated or input by the remote operator using the vehicle simulator component(s) 422 may be transmitted to the simulator component(s) 402 for updating a state of the virtual vehicle within the simulated environment 410.

As another example, the vehicle simulator component(s) 420 may receive (e.g., retrieve, obtain, etc.), from the global simulation hosted by the simulator component(s) 402, data that corresponds to, is associated with, and/or is required by the vehicle simulator component(s) 420 to perform one or more operations by the vehicle simulator component(s) 420 for the SIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the SIL object may be received from the simulator component(s) 402. This data may be used to generate an instance of the simulated environment for each sensor (e.g., a first instance from a field of view of a first virtual camera of the virtual vehicle, a second instance from a field of view of a second virtual camera, a third instance from a field of view of a virtual LIDAR sensor, etc.). The instances of the simulated environment may thus be used to generate sensor data for each sensor by the vehicle simulator component(s) 420. In some examples, the sensor data may be encoded using one or more codecs (e.g., each sensor may use its own codec, or each sensor type may use its own codec) in order to generate encoded sensor data that may be understood or familiar to an autonomous driving software stack simulated or emulated by the vehicle simulator component(s) 420. For example, a first vehicle manufacturer may use a first type of LIDAR data, a second vehicle manufacturer may use a second type of LIDAR data, etc., and thus the codecs may customize the sensor data to the types of sensor data used by the manufacturers. As a result, the simulation system 400 may be universal, customizable, and/or useable by any number of different sensor types depending on the types of sensors and the corresponding data types used by different manufacturers. In any example, the sensor data and/or encoded sensor data may be used by an autonomous driving software stack to perform one or more operations (e.g., object detection, path planning, control determinations, actuation types, etc.). For example, the sensor data and/or encoded data may be used as inputs to one or more DNNs of the autonomous driving software stack, and the outputs of the one or more DNNs may be used for updating a state of the virtual vehicle within the simulated environment 410. As such, the reliability and efficacy of the autonomous driving software stack, including one or more DNNs, may be tested, fine-tuned, verified, and/or validated within the simulated environment.

In yet another example, the vehicle simulator component(s) 406 may receive (e.g., retrieve, obtain, etc.), from the global simulation hosted by the simulator component(s) 402, data that corresponds to, is associated with, and/or is required by the vehicle simulator component(s) 406 to perform one or more operations by the vehicle simulator component(s) 406 for the HIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the HIL object may be received from the simulator component(s) 402. This data may be used to generate an instance of the simulated environment for each sensor (e.g., a first instance from a field of view of a first virtual camera of the virtual vehicle, a second instance from a field of view of a second virtual camera, a third instance from a field of view of a virtual LIDAR sensor, etc.). The instances of the simulated environment may thus be used to generate sensor data for each sensor by the vehicle simulator component(s) 420 (e.g., using a corresponding learned sensor model). In some examples, the sensor data may be encoded using one or more codecs (e.g., each sensor may use its own codec, or each sensor type may use its own codec) in order to generate encoded sensor data that may be understood or familiar to an autonomous driving software stack executing on the vehicle hardware 104 of the vehicle simulator component(s) 420. Similar to the SIL object described herein, the sensor data and/or encoded sensor data may be used by an autonomous driving software stack to perform one or more operations (e.g., object detection, path planning, control determinations, actuation types, etc.).

Now referring to FIG. 4C, FIG. 4C is another example illustration of a simulation system 400C, in accordance with some embodiments of the present disclosure. The simulation system 400C may include distributed shared memory (DSM) system 242, the simulator component(s) 402 (as one or more compute nodes), the vehicle simulator component(s) 406 (as one or more compute nodes) for a HIL object(s), the vehicle simulator component(s) 420 (as one or more compute nodes) for a SIL object(s), the vehicle simulator component(s) 406 (as one or more compute nodes) for a PIL object(s), and/or additional component(s) (or compute nodes) for AI objects and/or other object types (not shown). The simulation system 400C may include any number of HIL objects (e.g., each including its own vehicle simulator component(s) 406), any number of SIL objects (e.g., each including its own vehicle simulator component(s) 420), any number of PIL objects (e.g., each including its own vehicle simulator component(s) 422), and/or any number of AI objects (not shown, but may be hosted by the simulation component(s) 402 and/or separate compute nodes, depending on the embodiment).

The vehicle simulator component(s) 406 may include one or more SoC(s) 1104 (or other components) that may be configured for installation and use within a physical vehicle. As such, as described herein, the simulation system 400C may be configured to use the SoC(s) 1104 and/or other vehicle hardware 104 by using specific interfaces for communicating with the SoC(s) 1104 and/or other vehicle hardware. The vehicle simulator component(s) 420 may include one or more software instances 430 that may be hosted on one or more GPUs and/or CPUs to simulate or emulate the SoC(s) 1104. The vehicle simulator component(s) 422 may include one or more SoC(s) 426, one or more CPU(s) 428 (e.g., X86 boxes), and/or a combination thereof, in addition to the component(s) that may be used by the remote operator (e.g., keyboard, mouse, joystick, monitors, VR systems, steering wheel, pedals, in-vehicle components, such as light switches, blinkers, HMI display(s), etc., and/or other component(s)).

The simulation component(s) 402 may include any number of CPU(s) 432 (e.g., X86 boxes), GPU(s), and/or a combination thereof. The CPU(s) 432 may host the simulation software for maintaining the global simulation, and the GPU(s) 434 may be used for rendering, physics, and/or other functionality for generating the simulated environment 410.

As described herein, the simulation system 400C may include the DSM 424. The DSM 424 may use one or more distributed shared memory protocols to maintain the state of the global simulation using the state of each of the objects (e.g., HIL objects, SIL objects, PIL objects, AI objects, etc.). As such, each of the compute nodes corresponding to the vehicle simulator component(s) 406, 420, and/or 422 may be in communication with the simulation component(s) 402 via the DSM 424. By using the DSM 424 and the associated protocols, real-time simulation may be possible. For example, as opposed to how network protocols (e.g., TCP, UDP, etc.) are used in massive multiplayer online (MMO) games, the simulation system 400 may use a distributed shared memory protocol to maintain the state of the global simulation and each instance of the simulation (e.g., by each vehicle, object, and/or sensor) in real-time.

Figure 4D:
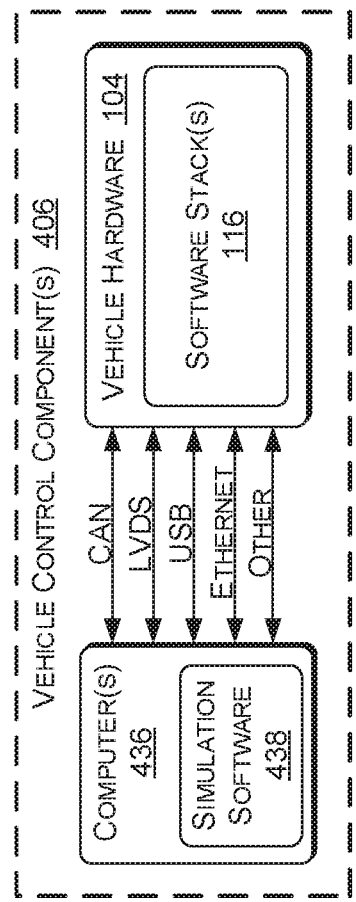

Now referring to FIG. 4D, FIG. 4D is an example illustration of a hardware-in-the-loop configuration, in accordance with some embodiments of the present disclosure. The vehicle simulator component(s) 406 may include the vehicle hardware 104, as described herein, and may include one or more computer(s) 436, one or more GPU(s) (not shown), and/or one or more CPU(s) (not shown). The computer(s) 436, GPU(s), and/or CPU(s) may manage or host the simulation software 438, or instance thereof, executing on the vehicle simulator component(s) 406. The vehicle hardware 104 may execute the software stack(s) 116 (e.g., an autonomous driving software stack, an IX software stack, etc.).

As described herein, by using the vehicle hardware 104, the other vehicle simulator component(s) 406 within the simulation environment 400 may need to be configured for communication with the vehicle hardware 104. For example, because the vehicle hardware 104 may be configured for installation within a physical vehicle (e.g., the vehicle 102), the vehicle hardware 104 may be configured to communicate over one or more connection types and/or communication protocols that are not standard in computing environments (e.g., in server-based platforms, in general-purpose computers, etc.). For example, a CAN interface, LVDS interface, USB interface, Ethernet interface, InfiniBand (IB) interface, and/or other interfaces may be used by the vehicle hardware 104 to communicate signals with other components of the physical vehicle. As such, in the simulation system 400, the vehicle simulator component(s) 406 (and/or other component(s) of the simulation system 400 in addition to, or alternative from, the vehicle simulator component(s) 406) may need to be configured for use with the vehicle hardware 104. In order to accomplish this, one or more CAN interfaces, LVDS interfaces, USB interfaces, Ethernet interfaces, and/or other interface may be used to provide for communication (e.g., over one or more communication protocols, such as LVDS) between vehicle hardware 104 and the other component(s) of the simulation system 400.

In some examples, the virtual vehicle that may correspond to the vehicle simulator component(s) 406 within the simulation system 400 may be modeled as a game object within an instance of a game engine. In addition, each of the virtual sensors of the virtual vehicle may be interfaced using sockets within the virtual vehicle's software stack(s) 116 executed on the vehicle hardware 104. In some examples, each of the virtual sensors of the virtual vehicle may include an instance of the game engine, in addition to the instance of the game engine associated with the simulation software 438 for the virtual vehicle. In examples where the vehicle simulator component(s) 406 include a plurality of GPUs, each of the sensors may be executed on a single GPU. In other examples, multiple sensors may be executed on a single GPU, or at least as many sensors as feasible to ensure real-time generation of the virtual sensor data.

Using HIL objects in the simulator system 400 may provide for a scalable solution that may simulate or emulate various driving conditions for autonomous software and hardware systems (e.g., NVIDIA's DRIVE AGX Pegasus™ compute platform and/or DRIVE PX Xavier™ compute platform). Some benefits of HIL objects may include the ability to test DNNs faster than real-time, the ability to scale verification with computing resources (e.g., rather than vehicles or test tracks), the ability to perform deterministic regression testing (e.g., the real-world environment is never the same twice, but a simulated environment can be), optimal ground truth labeling (e.g., no hand-labeling required), the ability to test scenarios difficult to produce in the real-world, rapid generation of test permutations, and the ability to test a larger space of permutations in simulation as compared to real-world.

Figure 4F:
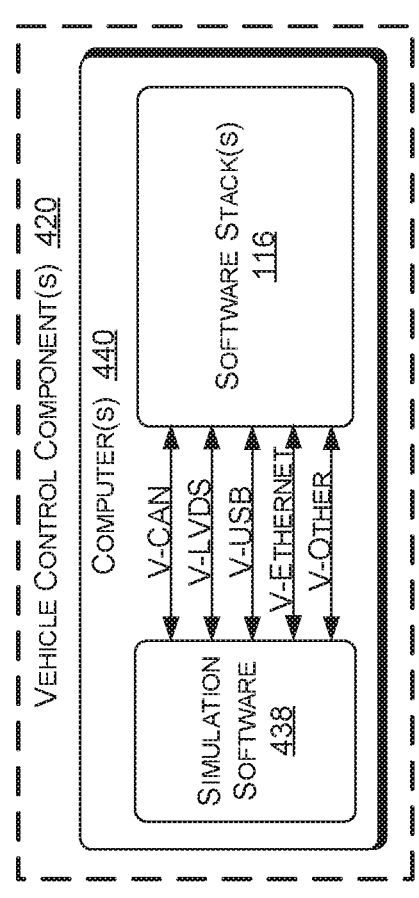
Figure 4E:
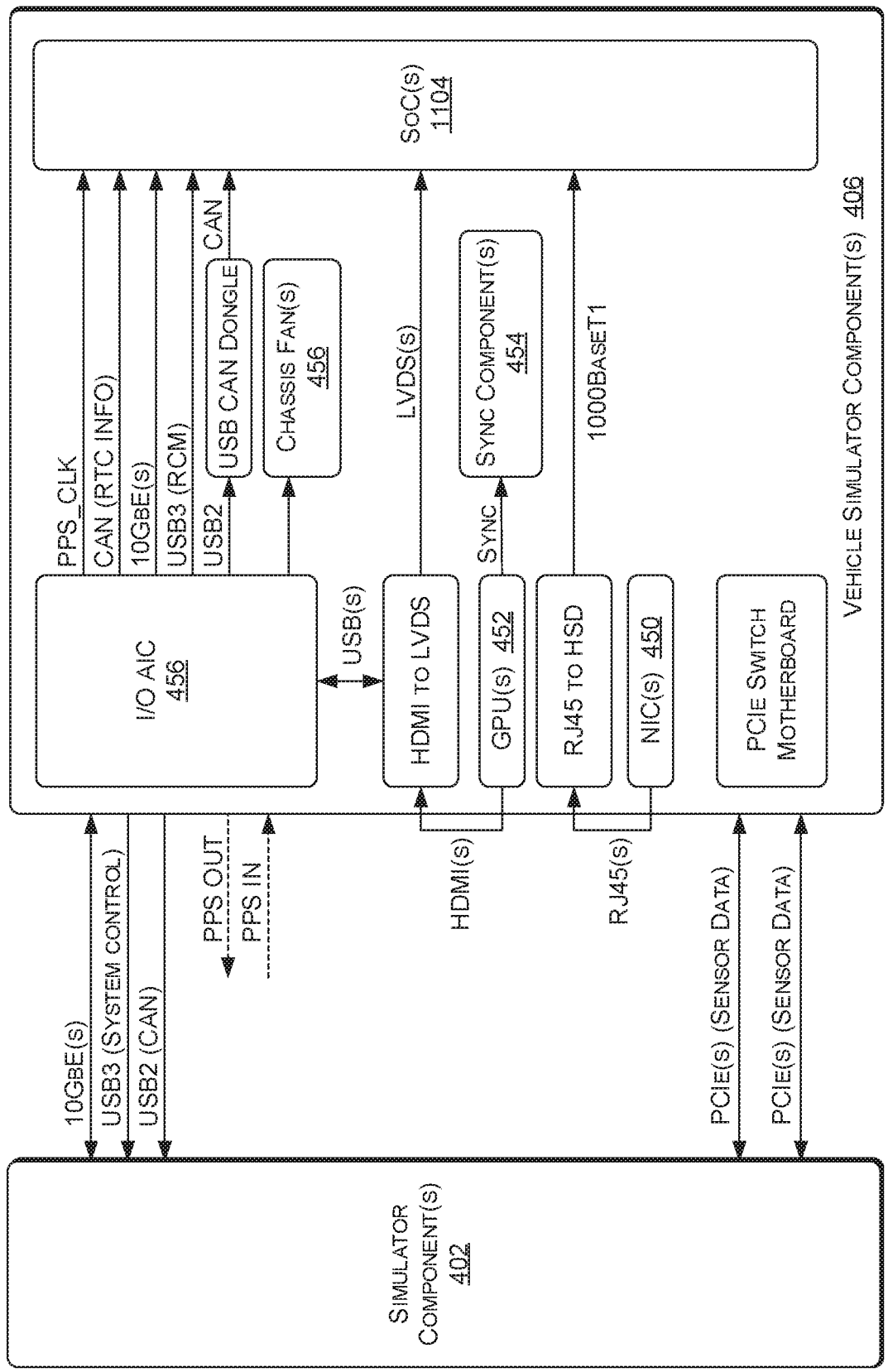

Now referring to FIG. 4E, FIG. 4E is an example illustration of a hardware-in-the-loop configuration, in accordance with some embodiments of the present disclosure. The HIL configuration of FIG. 4E may include vehicle simulator component(s) 406, including the SoC(s) 1104, a chassis fan(s) 456 and/or water-cooling system. The HIL configuration may include a two-box solution (e.g., the simulator component(s) 402 in a first box and the vehicle simulator component(s) 406 in a second box). Using this approach may reduce the amount of space the system occupies as well as reduce the number of external cables in data centers (e.g., by including multiple components together with the SoC(s) 1104 in the vehicle simulator component(s) 406—e.g., the first box). The vehicle simulator component(s) 406 may include one or more GPUs 452 (e.g., NVIDIA QUADRO GPU(s)) that may provide, in an example, non-limiting embodiment, 8 DP/HDMI video streams that may be synchronized using sync component(s) 454 (e.g., through a QUADRO Sync II Card). These GPU(s) 452 (and/or other GPU types) may provide the sensor input to the SoC(s) 1104 (e.g., to the vehicle hardware 104). In some examples, the vehicle simulator component(s) 406 may include a network interface (e.g., one or more network interface cards (NICs) 450) that may simulate or emulate RADAR sensors, LIDAR sensors, and/or IMU sensors (e.g., by providing 8 Gigabit ports with precision time protocol (PTP) support). In addition, the vehicle simulator component(s) 406 may include an input/output (I/O) analog integrated circuit. Registered Jack (RJ) interfaces (e.g., RJ45), high speed data (HSD) interfaces, USB interfaces, pulse per second (PPS) clocks, Ethernet (e.g., 10 Gb Ethernet (GbE)) interfaces, CAN interfaces, HDMI interfaces, and/or other interface types may be used to effectively transmit and communication data between and among the various component(s) of the system.

Now referring to FIG. 4F, FIG. 4F is an example illustration of a software-in-the-loop configuration, in accordance with some embodiments of the present disclosure. The vehicle simulator component(s) 420 may include computer(s) 440, GPU(s) (not shown), CPU(s) (not shown), and/or other components. The computer(s) 440, GPU(s), and/or CPU(s) may manage or host the simulation software 438, or instance thereof, executing on the vehicle simulator component(s) 420, and may host the software stack(s) 116. For example, the vehicle simulator component(s) 420 may simulate or emulate, using software, the vehicle hardware 104 in an effort to execute the software stack(s) 116 as accurately as possible.

In order to increase accuracy in SIL embodiments, the vehicle simulator component(s) 420 may be configured to communicate over one or more virtual connection types and/or communication protocols that are not standard in computing environments. For example, a virtual CAN interface, virtual LVDS interface, virtual USB interface, virtual Ethernet interface, and/or other virtual interfaces may be used by the computer(s) 440, CPU(s), and/or GPU(s) of the vehicle simulator component(s) 420 to provide for communication (e.g., over one or more communication protocols, such as LVDS) between the software stack(s) 116 and the simulation software 438 within the simulation system 400. For example, the virtual interfaces may include middleware that may be used to provide a continuous feedback loop with the software stack(s) 116. As such, the virtual interfaces may simulate or emulate the communications between the vehicle hardware 104 and the physical vehicle using one or more software protocols, hardware (e.g., CPU(s), GPU(s), computer(s) 440, etc.), or a combination thereof.

The computer(s) 440 in some examples, may include X86 CPU hardware, and one or more X86 CPUs may execute both the simulation software 438 and the software stack(s) 116. In other examples, the computer(s) 440 may include GPU hardware (e.g., an NVIDIA DGX system and/or cloud-based NVIDIA Tesla servers).

In some examples, the virtual vehicle that may correspond to the vehicle simulator component(s) 420 within the simulation system 400 may be modeled as a game object within an instance of a game engine. In addition, each of the virtual sensors of the virtual vehicle may be interfaced using sockets within the virtual vehicle's software stack(s) 116 executed on the vehicle simulator component(s) 420. In some examples, each of the virtual sensors of the virtual vehicle may include an instance of the game engine, in addition to the instance of the game engine associated with the simulation software 438 for the virtual vehicle. In examples where the vehicle simulator component(s) 406 include a plurality of GPUs, each of the sensors may be executed on a single GPU. In other examples, multiple sensors may be executed on a single GPU, or at least as many sensors as feasible to ensure real-time generation of the virtual sensor data.

Figure 5:
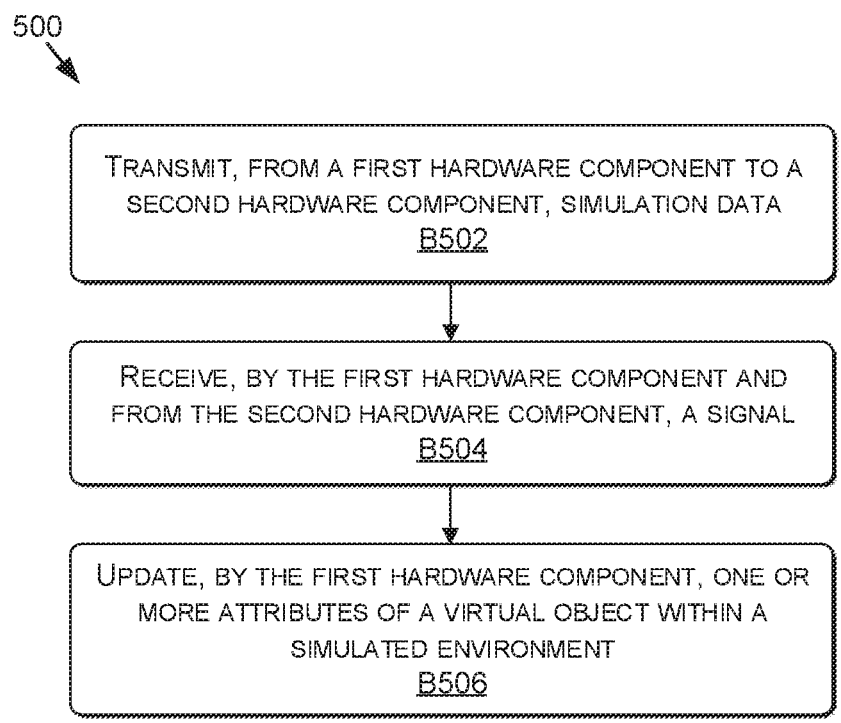
FIG. 5 is a flow diagram showing a method for generating a simulated environment using a hardware-in-the-loop (HIL) object, in accordance with some embodiments of the present disclosure.

Now referring to FIG. 5, each block of method 500, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 500 is described, by way of example, with respect to the simulation system 400 of FIGS. 4A-4C. However, the method may additionally or alternatively be executed by any one system, or any combination of systems, including, but not limited to, those described herein.

FIG. 5 is a flow diagram showing a method 500 for generating a simulated environment using a hardware-in-the-loop object, in accordance with some embodiments of the present disclosure. The method 500, at block B502, includes transmitting, from a first hardware component to a second hardware component, simulation data. For example, simulation component(s) 402 may transmit simulation data to one or more of the vehicle simulator component(s) 406, the vehicle simulator component(s) 420, and/or the vehicle simulator component(s) 422. In some examples, the simulation data may be representative of at least a portion of the simulated environment 410 hosted by the simulation component(s) 402, and may correspond to the simulated environment 410 with respect to at least one virtual sensor (e.g., implemented using a learned sensor model) of a virtual object (e.g., a HIL object, a SIL object, a PIL object, and/or an AI object). In an example where the virtual sensor is a virtual camera, the simulation data may correspond to at least the data from the simulation necessary to generate a field of view of the virtual camera within the simulated environment 410.

The method 500, at block B504, includes receiving a signal by the first hardware component and from the second hardware component. For example, the simulator component(s) 402 may receive a signal from one of the vehicle simulator component(s) 406, the vehicle simulator component(s) 420, and/or the vehicle simulator component(s) 422. The signal may be representative of an operation (e.g., control, path planning, object detection, etc.) corresponding to a virtual object (e.g., a HIL object, a SIL object, a PIL object, and/or an AI object) as determined by a software stack(s) 116 (e.g., based at least in part on the virtual sensor data). In some examples, such as where the virtual object is a HIL object, the signal (or data represented thereby) may be transmitted from the vehicle hardware 104 to one or more other vehicle simulator component(s) 406, and then the vehicle simulator component(s) 406 may transmit the signal to the simulator component(s) 402. In such examples, the signals between the vehicle simulator component(s) 406 (e.g., between the vehicle hardware 104 and one or more GPU(s), CPU(s), and/or computer(s) 436) may be transmitted via a CAN interface, a USB interface, an LVDS interface, an Ethernet interface, and/or another interface. In another example, such as where the virtual object is a SIL object, the signal (or data represented thereby) may be transmitted from the vehicle simulator component(s) 420 to the simulator component(s) 402, where the data included in the signal may be generated by the software stack(s) 116 executing on simulated or emulated vehicle hardware 104. In such examples, the vehicle simulator component(s) 420 may use a virtual CAN, a virtual LVDS interface, a virtual USB interface, a virtual Ethernet interface, and/or other virtual interfaces.

The method 500, at block B506, includes updating, by the first hardware component, one or more attributes of a virtual object within a simulated environment. For example, based at least in part on the signal received from the vehicle simulator component(s) 406, the vehicle simulator component(s) 420, and/or the vehicle simulator component(s) 422, the simulator component(s) 402 may update the global simulation (and the simulated environment may be updated accordingly). In some examples, the data represented by the signal may be used to update a location, orientation, speed, and/or other attributes of the virtual object hosted by the vehicle simulator component(s) 406, the vehicle simulator component(s) 420, and/or the vehicle simulator component(s) 422.

Figure 6A:
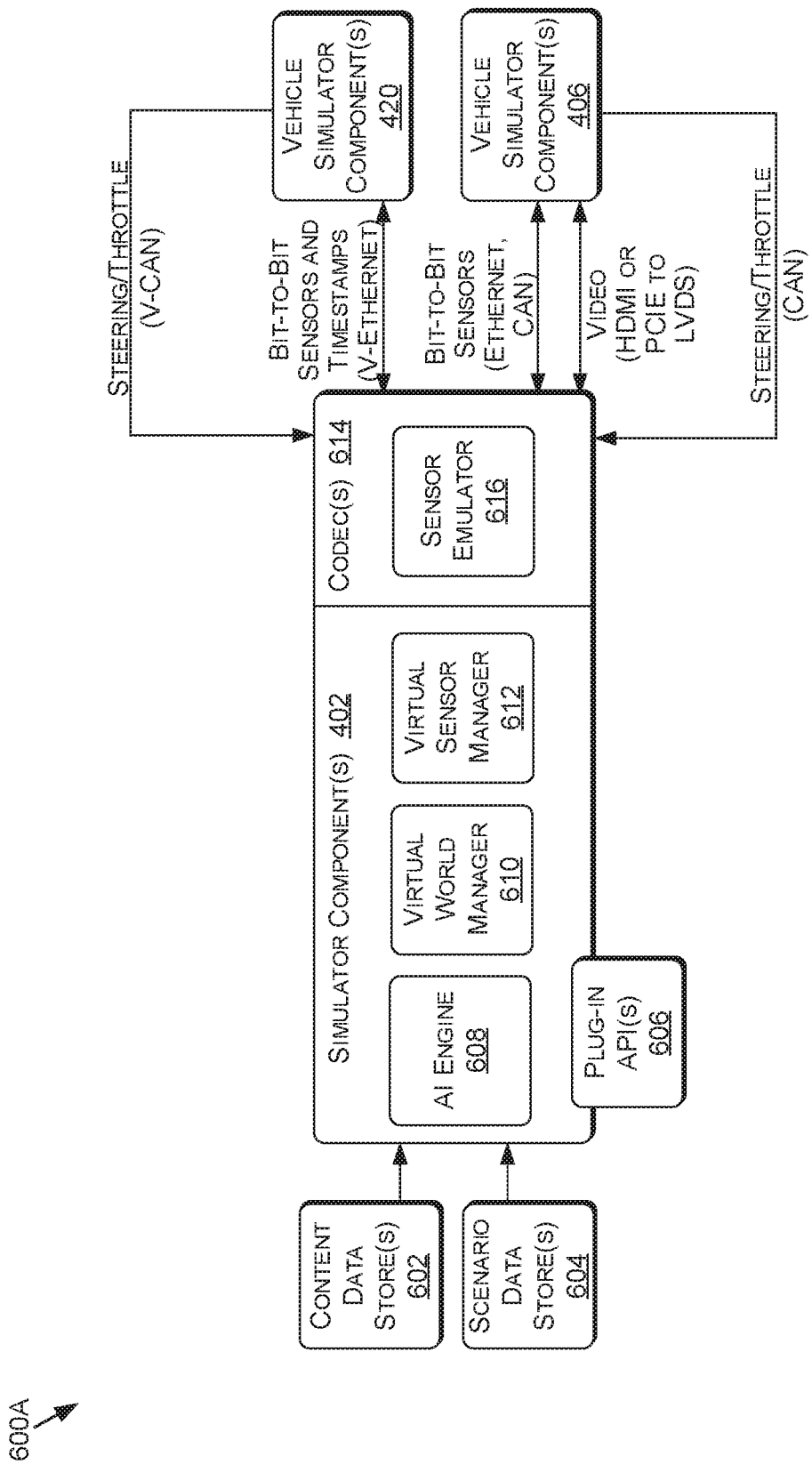
FIG. 6A is an example illustration of a simulation system at runtime, in accordance with some embodiments of the present disclosure.

Now referring to FIG. 6A, FIG. 6A is an example illustration of a simulation system 600 at runtime, in accordance with some embodiments of the present disclosure. Some or all of the components of the simulation system 600 may be used in the simulation system 400, and some or all of the components of the simulation system 400 may be used in the simulation system 600. As such, components, features, and/or functionality described with respect to the simulation system 400 may be associated with the simulation system 600, and vice versa. In addition, each of the simulation systems 600A and 600B (FIG. 6B) may include similar and/or shared components, features, and/or functionality.

The simulation system 600A (e.g., representing one example of simulation system 600) may include the simulator component(s) 402, codec(s) 614, content data store(s) 602, scenario data store(s) 604, vehicle simulator component(s) 420 (e.g., for a SIL object), and vehicle simulator component(s) 406 (e.g., for a HIL object). The content data store(s) 602 may include detailed content information for modeling cars, trucks, people, bicyclists, signs, buildings, trees, curbs, and/or other features of the simulated environment. The scenario data store(s) 604 may include scenario information that may include dangerous scenario information (e.g., that is unsafe to test in the real-world environment), such as a child in an intersection.

The simulator component(s) 402 may include an AI engine 608 that simulates traffic, pedestrians, weather, and/or other AI features of the simulated environment. The simulator component(s) 402 may include a virtual world manager 610 that manages the world state for the global simulation. The simulator component(s) 402 may further include a virtual sensor manger 612 that may mange the virtual sensors (any or all of which may be implemented using a corresponding learned sensor model). The AI engine 608 may model traffic similar to how traffic is modeled in an automotive video game, and may be done using a game engine, as described herein. In other examples, custom AI may be used to provide the determinism and computational level of detail necessary for large-scale reproducible automotive simulation. In some examples, traffic may be modeled using SIL objects, HIL objects, PIL objects, AI objects, and/or combination thereof. The system 600 may create a subclass of an AI controller that examines map data, computes a route, and drives the route while avoiding other cars. The AI controller may compute desired steering, acceleration, and/or braking, and may apply those values to the virtual objects. The vehicle properties used may include mass, max RPM, torque curves, and/or other properties. A physics engine may be used to determine states of AI objects. As described herein, for vehicles or other objects that may be far away and may not have an impact on a current sensor(s), the system may choose not to apply physics for those objects and only determine locations and/or instantaneous motion vectors. Ray-casting may be used for each wheel to ensure that the wheels of the vehicles are in contact. In some examples, traffic AI may operate according to a script (e.g., rules-based traffic). Traffic AI maneuvers for virtual objects may include lateral lane changes (e.g., direction, distance, duration, shape, etc.), longitudinal movement (e.g., matching speed, relative target, delta to target, absolute value), route following, and/or path following. The triggers for the traffic AI maneuvers may be time-based (e.g., three seconds), velocity-based (e.g., at sixty mph), proximity-based to map (e.g., within twenty feet of intersection), proximity-based to actor (e.g., within twenty feet of another object), lane clear, and/or others.

The AI engine 608 may model pedestrian AI similar to traffic AI, described herein, but for pedestrians. The pedestrians may be modeled similar to real pedestrians, and the system 600 may infer pedestrian conduct based on learned behaviors.

The simulator component(s) 402 may be used to adjust the time of day such that street lights turn on and off, headlights turn on and off, shadows, glares, and/or sunsets are considered, etc. In some examples, only lights within a threshold distance to the virtual object may be considered to increase efficiency.

Weather may be accounted for by the simulator component(s) 402 (e.g., by the virtual world manager 610). The weather may be used to update the coefficients of friction for the driving surfaces, and temperature information may be used to update tire interaction with the driving surfaces. Where rain or snow are present, the system 600 may generate meshes to describe where rainwater and snow may accumulate based on the structure of the scene, and the meshes may be employed when rain or snow are present in the simulation.

In some examples, as described herein, at least some of the simulator component(s) 402 may alternatively be included in the vehicle simulator component(s) 420 and/or 406. For example, the vehicle simulator component(s) 420 and/or the vehicle simulator component(s) 406 may include the virtual sensor manager 612 for managing each of the sensors of the associated virtual object. In addition, one or more of the codecs 614 may be included in the vehicle simulator component(s) 420 and/or the vehicle simulator component(s) 406. In such examples, the virtual sensor manager 612 may generate sensor data corresponding to a sensor of the virtual object (e.g., using a learned sensor model), and the sensor data may be used by sensor emulator 616 of the codec(s) 614 to encode the sensor data according to the sensor data format or type used by the software stack(s) 116 (e.g., the software stack(s) 116 executing on the vehicle simulator component(s) 420 and/or the vehicle simulator component(s) 406).

The codec(s) 614 may provide an interface to the software stack(s) 116. The codec(s) 614 (and/or other codec(s) described herein) may include an encoder/decoder framework. The codec(s) 614 may include CAN steering, throttle requests, and/or may be used to send sensor data to the software stack(s) 116 in SIL and HIL embodiments. The codec(s) 614 may be beneficial to the simulation systems described herein (e.g., 400 and 600). For example, as data is produced by the re-simulation systems 100 and the simulation systems 400 and 600, the data may be transmitted to the software stack(s) 116 such that the following standards may be met. The data may be transferred to the software stack(s) 116 such that minimal impact is introduced to the software stack(s) 116 and/or the vehicle hardware 104 (in HIL embodiments). This may result in more accurate simulations as the software stack(s) 116 and/or the vehicle hardware 104 may be operating in an environment that closely resembles deployment in a real-world environment. The data may be transmitted to the software stack(s) 116 such that the simulator and/or re-simulator may be agnostic to the actual hardware configuration of the system under test. This may reduce development overhead due to bugs or separate code paths depending on the simulation configuration. The data may be transmitted to the software stack(s) 116 such that the data may match (e.g., bit-to-bit) the data sent from a physical sensor of a physical vehicle (e.g., the vehicle 102). The data may be transmitted to efficiently in both SIL and HIL embodiments.

The sensor emulator 616 may emulate at least cameras, LIDAR sensors, and/or RADAR sensors, any or all of which may be implemented using a corresponding learned sensor model. Using a learned sensor model may obviate the need to model the sensor using ray-tracing, although in some embodiments, ray-tracing may additionally or alternatively be used. With respect to LIDAR sensors, some LIDAR sensors report tracked objects. As such, for each frame represented by the virtual sensor data, the simulator component(s) 402 may create a list of all tracked objects (e.g., trees, vehicles, pedestrians, foliage, etc.) within range of the virtual object having the virtual LIDAR sensors, and may cast virtual rays toward the tracked objects. When a significant number of rays strike a tracked object, that object may be added to the report of the LIDAR data. In some examples, the LIDAR sensors may be modeled using simple ray-casting without reflection, adjustable field of view, adjustable noise, and/or adjustable drop-outs. LIDAR with moving parts, limited fields of view, and/or variable resolutions may be simulated. For example, the LIDAR sensors may be modeled as solid state LIDAR and/or as Optix-based LIDAR. In examples, using Optix-based LIDAR, the rays may bounce from water, reflective materials, and/or windows. Texture may be assigned to roads, signs, and/or vehicles to model laser reflection at the wavelengths corresponding to the textures. RADAR may be implemented similarly to LIDAR. As described herein, RADAR and/or LIDAR may be simulated using learned sensors, ray-tracing techniques, and/or otherwise.

In some examples, the vehicle simulator component(s) 406, 420, and/or 422 may include a feedback loop with the simulator component(s) 402 (and/or the component(s) that generate the virtual sensor data). The feedback loop may be used to provide information for updating the virtual sensor data capture or generation. For example, for virtual cameras, the feedback loop may be based on sensor feedback, such as changes to exposure responsive to lighting conditions (e.g., increase exposure in dim lighting conditions so that the image data may be processed by the DNNs properly). As another example, for virtual LIDAR sensors, the feedback loop may be representative of changes to energy level (e.g., to boost energy to produce more useable or accurate LIDAR data).

GNNS sensors (e.g., GPS sensors) may be simulated within the simulation space to generate real-world coordinates. In order to this, noise functions may be used to approximate inaccuracy. As with any virtual sensors described herein, the virtual sensor data may be generated using a learned sensor model or otherwise, and transmitted to the software stack(s) 116 using the codec(s) 614 to be converted to a bit-to-bit correct signal (e.g., corresponding accurately to the signals generated by the physical sensors of the physical vehicles).

One or more plugin application programming interfaces (APIs) 606 may be used. The plugin APIs 606 may include first-party and/or third-party plugins. For example, third parties may customize the simulation system 600B using their own plugin APIs 606 for providing custom information, such as performance timings, suspension dynamics, tire dynamics, etc.

The plugin APIs 606 may include an ego-dynamics component(s) (not shown) that may receive information from the simulator component(s) 402 including position, velocity, car state, and/or other information, and may provide information to the simulator component(s) 402 including performance timings, suspension dynamics, tire dynamics, and/or other information. For examples, the simulator component(s) 402 may provide CAN throttle, steering, and the driving surface information to the ego-dynamics component(s). In some examples, the ego-dynamics component(s) may include an off-the-shelf vehicle dynamics package (e.g., IPG CARMAKER or VIRTUAL TEST DRIVE), while in other examples the ego-dynamics component(s) may be customized and/or received (e.g., from a first-party and/or a third-party).

The plugin APIs 606 may include a key performance indicator (KPI) API. The KPI API may receive CAN data, ground truth, and/or virtual object state information (e.g., from the software stack(s) 116) from the simulator component(s) 402 and may generate and/or provide a report (in real-time) that includes KPI's and/or commands to save state, restore state, and/or apply changes.

Figure 6B:
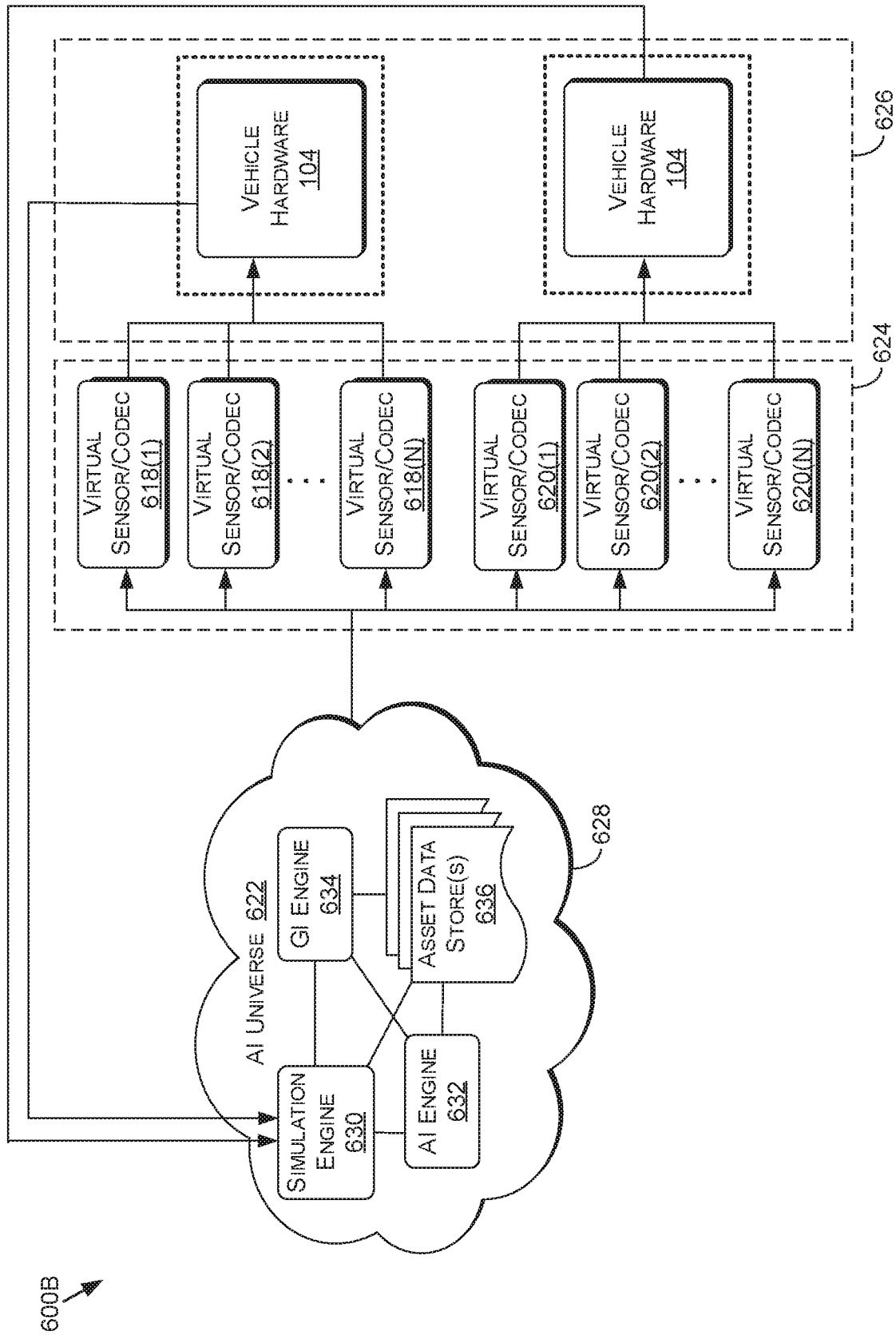
FIG. 6B includes a cloud-based architecture for a simulation system, in accordance with some embodiment of the present disclosure.

Now referring to FIG. 6B, FIG. 6B includes a cloud-based architecture for a simulation system 600B, in accordance with some embodiment of the present disclosure. The simulation system 600B may, at least partly, reside in the cloud and may communicate over one or more networks, such as but not limited to those described herein (e.g., with respect to network 1190 of FIG. 1D), with one or more GPU platforms 624 (e.g., that may include GPUs, CPUs, TPUS, and/or other processor types) and/or one or more HIL platforms 626 (e.g., which may include some or all of the components from the vehicle simulator component(s) 406, described herein).

A simulated environment 628 (e.g., which may be similar to the simulated environment 410 described herein) may be modeled by interconnected components including a simulation engine 630, an AI engine 632, a global illumination (GI) engine 634, an asset data store(s) 636, and/or other components. In some examples, these component(s) may be used to model a simulated environment (e.g., a virtual world) in a virtualized interactive platform (e.g., similar to a massive multiplayer online (MMO) game environment. The simulated environment may further include physics, traffic simulation, weather simulation, and/or other features and simulations for the simulated environment. GI engine 634 may calculate GI once and share the calculation with each of the nodes 618(1)-618(N) and 620(1)-620(N) (e.g., the calculation of GI may be view independent). The simulated environment 628 may include an AI universe 622 that provides data to GPU platforms 624 (e.g., GPU servers) that may create renderings for each sensor of the vehicle (e.g., at the virtual sensor/codec(s) 618 for a first virtual object and at the virtual sensor codec(s) 620 for a second virtual object). For example, the GPU platform 624 may receive data about the simulated environment 628 and may create sensor inputs for each of 618(1)-618(N), 620(1)-620(N), and/or virtual sensor/codec pairs corresponding to other virtual objects (depending on the embodiment). In examples where the virtual objects are simulated using HIL objects, the sensor inputs may be provided to the vehicle hardware 104 which may use the software stack(s) 116 to perform one or more operations and/or generate one or more commands, such as those described herein. In some examples, as described herein, the virtual sensor data from each of the virtual sensors may be encoded using a codec prior to being used by (or transmitted to) the software stack(s) 116. In addition, in some examples, each of the sensors may be executed on its own GPU within the GPU platform 624, while in other examples, two or more sensors may share the same GPU within the GPU platform 624.

The one or more operations or commands may be transmitted to the simulation engine 630 which may update the behavior of one or more of the virtual objects based on the operations and/or commands. For example, the simulation engine 630 may use the AI engine 632 to update the behavior of the AI agents as well as the virtual objects in the simulated environment 628. The simulation engine 630 may then update the object data and characteristics (e.g., within the asset data store(s) 636), may update the GI (and/or other aspects such as reflections, shadows, etc.), and then may generate and provide updated sensor inputs to the GPU platform 624. This process may repeat until a simulation is completed.

Figure 7:
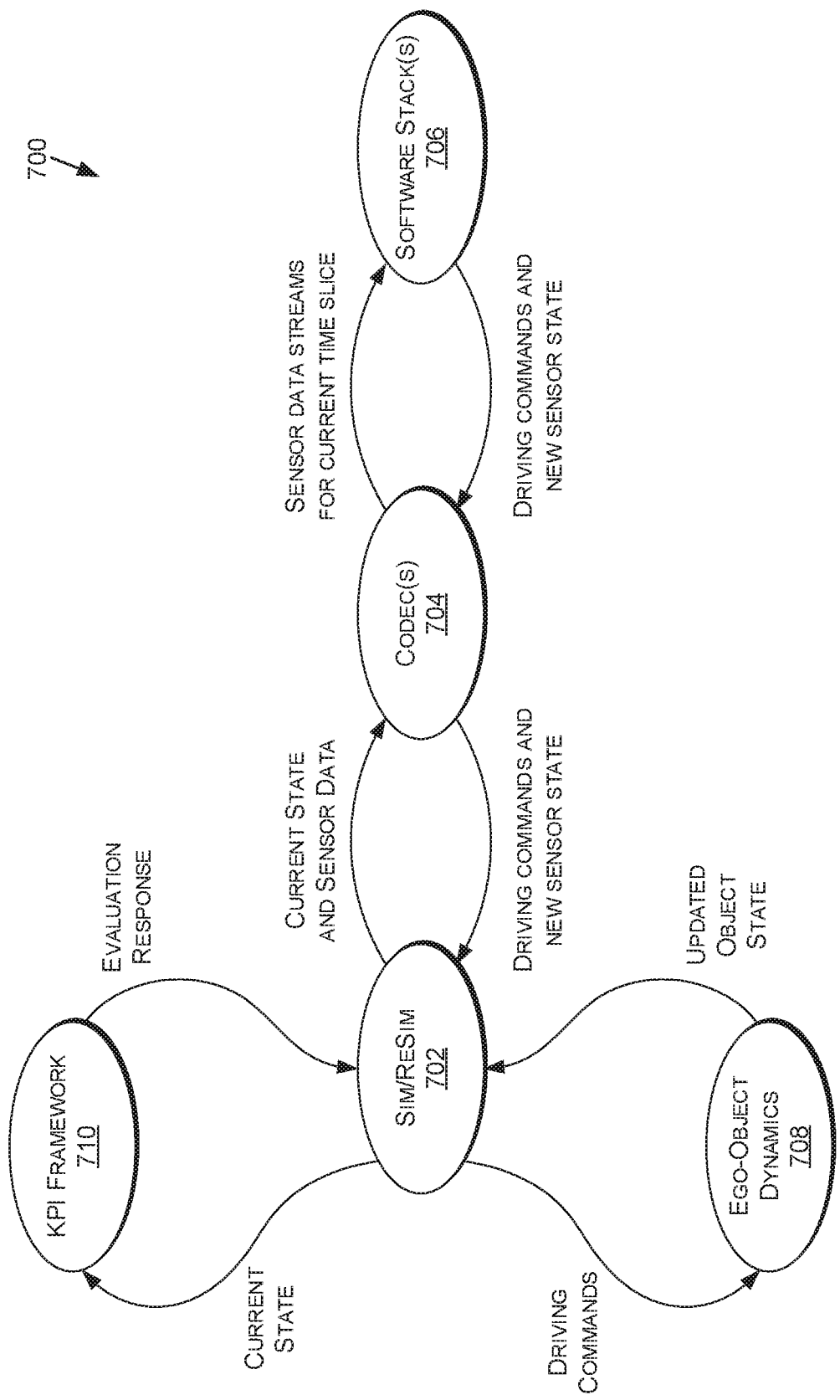
FIG. 7 includes a data flow diagram illustrating a process for re-simulation or simulation using one or more codecs, in accordance with some embodiments of the present disclosure.

Now referring to FIG. 7, FIG. 7 includes a data flow diagram illustrating a process 700 for re-simulation or simulation using one or more codecs, in accordance with some embodiments of the present disclosure. The process 700 may include a current state and/or sensor data be transmitted from the simulation and/or re-simulation to one or more codecs 704. At least some of the data (e.g., the sensor data) may then be encoded using the codec(s) 704 and provided to the software stack(s) 706 (e.g., similar to the software stack(s) 116) for a current time slice. The driving commands and new sensor state may then transmitted (e.g., via CAN or V-CAN) to the codec(s) 704 and back to the simulation and/or re-simulation. The driving commands generated originally by the software stack(s) 706 (e.g., by an autonomous driving software stack) may then be passed to ego-object dynamics which may use custom or built-in dynamics to update the object state for the particular type of virtual object being simulated and the updated object state may be passed back to the simulation and/or re-simulation. The simulation system may use the object's state, commands, and/or information, in addition to using traffic AI, pedestrian AI, and/or other features of the simulation platform, to generate or update the simulated environment (e.g., to a current state). The current state may be passed to the KPI framework (e.g., at the same time as the driving commands being passed to the ego-object dynamics 708, in some embodiments), and the KPI framework 710 may monitor and evaluate the current simulation and/or re-simulation. In some examples, the codec(s) 704 may buffer simulation data to increase performance and/or reduce latency of the system.

Figure 8:
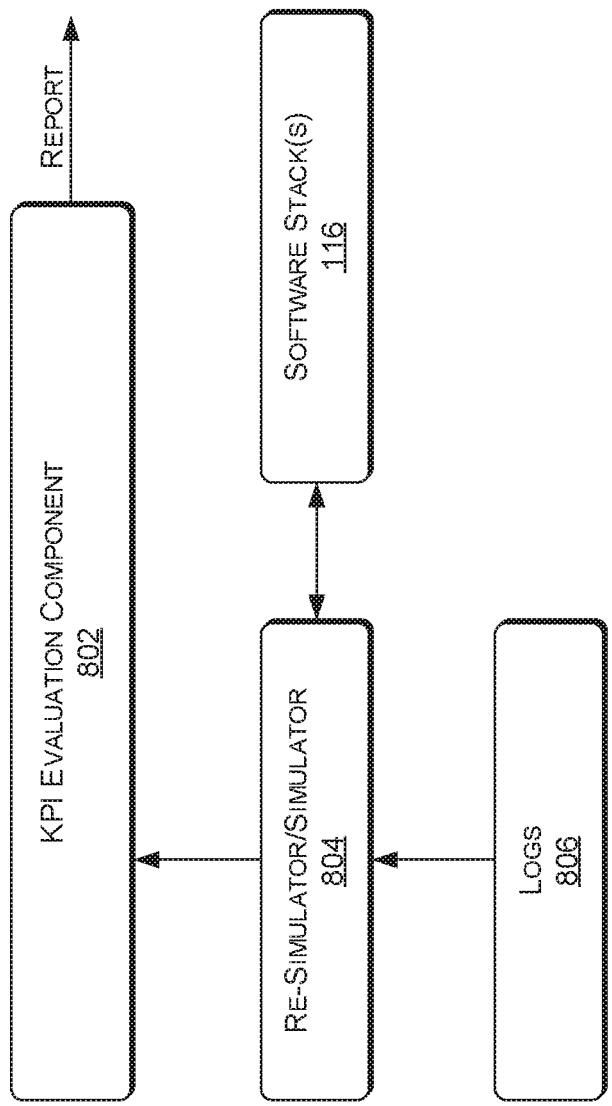
FIG. 8 includes a data flow diagram for key performance indicator (KPI) analysis and observation, in accordance with some embodiments of the present disclosure.

Now referring to FIG. 8, FIG. 8 includes a data flow diagram for key performance indicator (KPI) analysis and observation, in accordance with some embodiments of the present disclosure. A KPI evaluation component may evaluate the performance of the virtual object(s) (e.g., vehicles, robots, etc.). Logs 806 may be generated and passed to re-simulator/simulator 804. The re-simulator/simulator 804 may provide sensor data to the software stack(s) 116 which may be executed using HIL, SIL, or a combination thereof. The KPI evaluation component 802 may use different metrics for each simulation or re-simulation instance. For examples, for re-simulation, KPI evaluation component may provide access to the original re-played CAN data and/or the newly generated CAN data from the software stack(s) 116 (e.g., from HIL or SIL). In some examples, performance could be as simple as testing that the new CAN data does not create a false positive—such as by triggering Automatic Emergency Braking (AEB), or another ADAS functionality. For example, the KPI evaluation component 802 may determine whether the new CAN data triggers a blind spot warning, or a lane departure warning. As a result, the system may help reduce the false positives that plague conventional ADAS systems. The KPI evaluation component 802 may also determine whether the new CAN data fails to trigger a warning that should have been implemented.

In some examples, the KPI evaluation component 802 may also provide for more complex comparisons. For example, the KPI evaluation component 802 may be as complex as running analytics on the two differing CAN streams to find deviations. The KPI evaluation component 802 may compare the new CAN data against the original CAN data, and may evaluate both trajectories to determine which trajectory would best meet the systems safety goals. In some examples, the KPI evaluation component 802 may use one or more methods described in U.S. Provisional Application No. 62/625,351, or U.S. Non-Provisional patent application Ser. No. 16/256,780, each hereby incorporated by reference in its entirety. In other examples, the KPI Evaluation component 802 may use one or of the methods described in U.S. Provisional Application No. 62/628,831, or U.S. Non-Provisional patent application Ser. No. 16/269,921, each hereby incorporated by reference in its entirety.

For example, safety procedures may be determined based on safe time of arrival calculations.

In some examples, the KPI evaluation component 802 may also use the method described in U.S. Provisional Application No. 62/622,538 or U.S. Non-Provisional patent application Ser. No. 16/258,272, hereby incorporated by reference in its entirety, which may be used to detect hazardous driving using machine learning. For example, machine learning and deep neural networks (DNNs) may be used for redundancy and for path checking e.g., for a rationality checker as part of functional safety for autonomous driving. These techniques may be extended for use with the KPI evaluation component 802 to evaluate the performance of the system.

The KPI Evaluation component may also use additional approaches to assess the performance of the system. For example, the KPI evaluation component 802 may consider whether the time to arrival (TTA) in the path of the cross-traffic is less than a threshold time—e.g. two seconds. The threshold may vary depending on the speed of the vehicle, road conditions, weather, traffic, and/or other variables. For example, the threshold duration may be two seconds for speeds up to twenty MPH, and one second for any greater speed. Alternatively, the threshold duration may be reduced or capped whenever the system detects hazardous road conditions such as wet roads, ice, or snow. In some examples, hazardous road conditions may be detected by a DNN trained to detect such conditions.

With respect to simulation, the KPI evaluation component may include an API, as described herein. The KPI evaluation component 802 may include additional inputs and/or provide more functionality. For example, the simulator may be able to share the "ground truth" for the scene, and may be able to determine the capability of the virtual object with respect to avoiding collisions, staying-in-lane, and/or performing other behaviors. For examples, the KPI evaluation component 802 may be more than a passive witness to the experiment, and may include an API to save the state of any ongoing simulation, change state or trigger behaviors, and continue with those changes. This may allow the KPI evaluation component to not only evaluate the car performance but to try to explore the space of potential dangerous scenarios.

Figure 9:
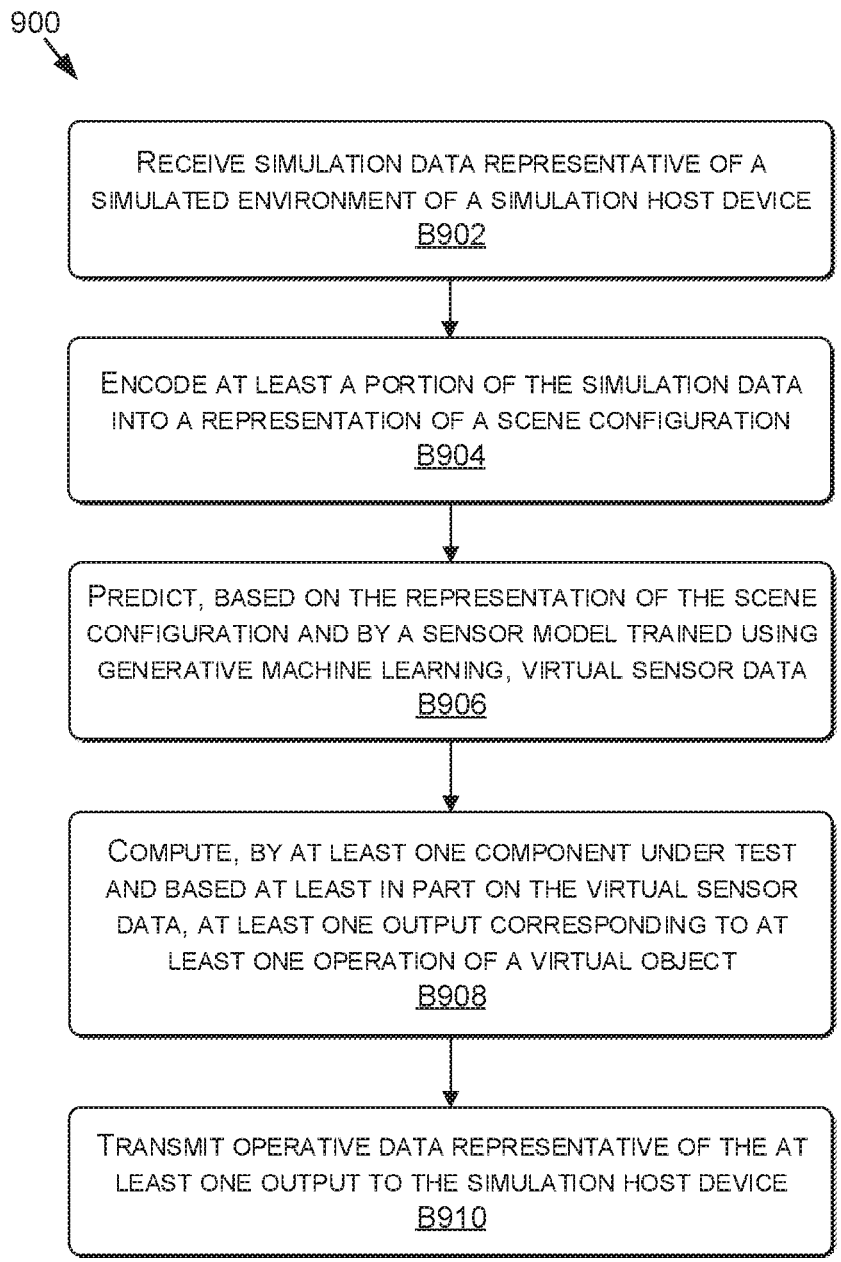
FIG. 9 is a flow diagram showing a method for controlling a virtual object in a simulated environment, in accordance with some embodiments of the present disclosure.
Figure 10:
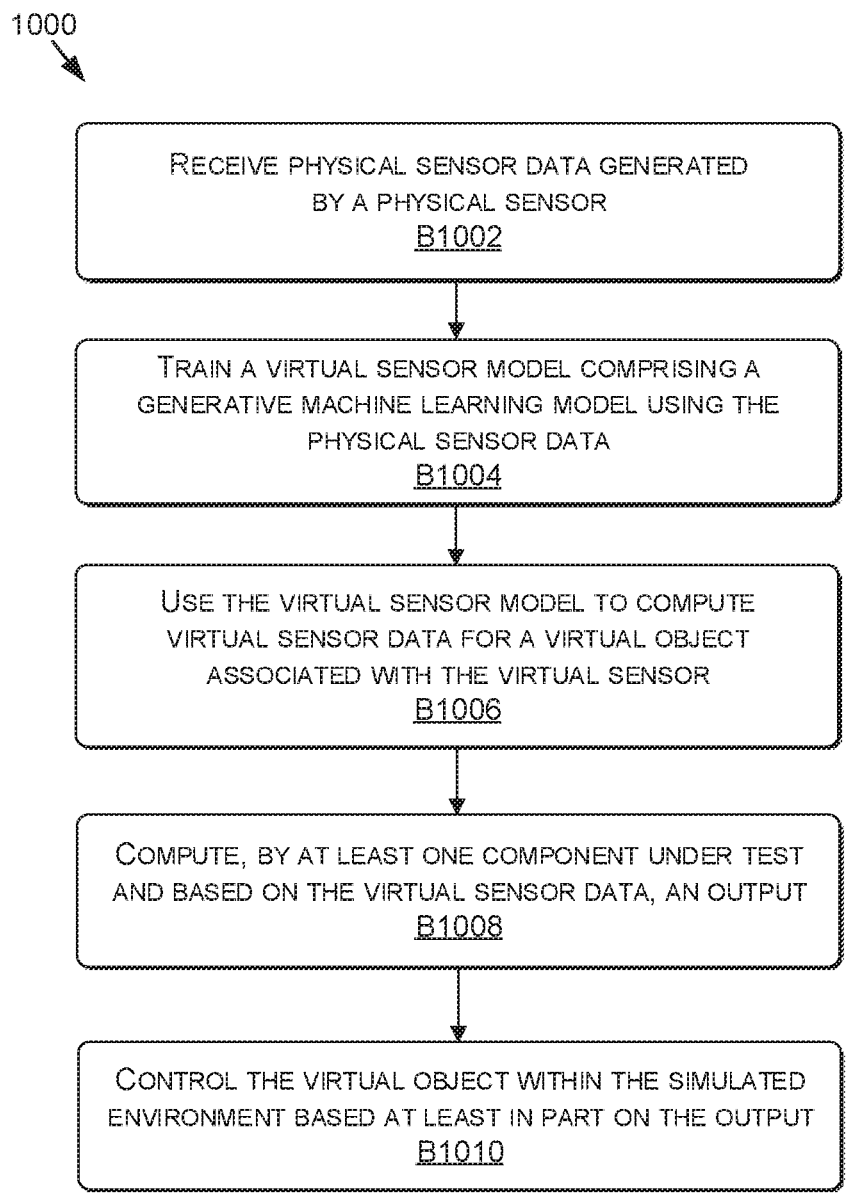
FIG. 10 is a flow diagram showing a method for controlling a virtual object in a simulated environment using a generative machine learning sensor model trained on physical sensor data, in accordance with some embodiments of the present disclosure.

Now referring to FIGS. 9 and 10, each block of methods 900 and 1000, described herein, comprises a computing process that may be performed using any combination of hardware, firmware, and/or software. For instance, various functions may be carried out by one or more processors executing instructions stored in memory. The methods may also be embodied as computer-usable instructions stored on computer storage media. The methods may be provided by a standalone application, a service or hosted service (standalone or in combination with another hosted service), or a plug-in to another product, to name a few. In addition, methods 900 and 1000 are described, by way of example, with respect to the re-simulation system 100 of FIG. 1, the simulation system 400 of FIGS. 4A-4C, and the simulation system 600 of FIGS. 6A-6B. However, these methods may additionally or alternatively be executed by any one system, or any combination of systems, including, but not limited to, those described herein.

FIG. 9 is a flow diagram showing a method 900 for controlling a virtual object in a simulated environment, in accordance with some embodiments of the present disclosure. The method 900, at block B902, includes receiving simulation data representative of a simulated environment from a simulation host device. For example, the vehicle simulator component(s) 406, 420, and/or 422 may receive, from the simulator component(s) 402, simulation data representative of the simulated environment 410. In some examples, the simulation data received may be the simulation data corresponding to the sensors of the virtual object hosted by the vehicle simulator component(s), any or all of which may be generated using corresponding learned sensor models.

The method 900, at block B904, includes encoding at least a portion of the simulation data into a representation of a scene configuration. For example, a representation of a scene configuration may include virtual sensor data (e.g., virtual LIDAR data, virtual RADAR data, virtual ultrasonic sensor data, virtual camera image(s), etc.), properties of virtual objects in the scene such as positions or dimensions (e.g., depth maps), classification data identifying virtual objects in the scene, some combination thereof, and/or the like. The representation of the scene configuration may be encoded using any number of data structures and/or channels (e.g., concatenated vectors, matrices, tensors, images, etc.).

The method 900, at block B906, includes predicting sensor data based on the representation of the scene configuration, using a sensor model trained using generative machine learning (e.g., the sensor model 120 of FIG. 1). The sensor model may predict virtual sensor data to simulate a particular type of sensor at a particular location and orientation in the simulated environment. As such, the virtual sensor data may be representative of the simulated environment as perceived by a virtual sensor at a particular location and orientation within the simulated environment.

In some embodiments, virtual sensor data may be generated for each of a dynamically configurable number of virtual sensors, any or all of which may be implemented using a learned sensor model. For example, the vehicle simulator component(s) 406, 420, and/or 422 may generate virtual sensor data using the simulation data for each of the virtual sensors of the vehicle. The virtual sensor data may be representative of the simulated environment 410 as perceived by at least one virtual sensor of a dynamically configurable number of virtual sensors of a virtual object within the simulated environment 410 (e.g., sensor data of a field of view of a virtual camera(s), sensor data of an orientation of the virtual vehicle using virtual IMU sensors, etc.). The number of virtual sensors used may be dynamically configurable such that one sensor may be used in a first simulation, five in another, ten in another, etc. In some examples, the dynamic configuration may be determined based on vehicle types (e.g., a first vehicle of year X, make Y, model Z may include 20 sensors, while a second vehicle of year A, make B, model C may include 30 sensors). In such examples, the simulation system 400, 600 may be dynamically configurable to generate virtual sensor data for each of the virtual sensors of each, or any vehicle in the simulated environment. In addition, any number of different virtual objects may be simulated within the simulated environment at any one time. As such, for each of a first virtual object (e.g., executing on a first set of vehicle simulator component(s) 406), a second virtual object (e.g., executing on a second set of vehicle simulator component(s) 420), and/or any other virtual objects, a same or different number of virtual sensors and/or type of virtual sensors may generate virtual sensor data. The virtual sensor data for each virtual sensor may be representative of any other virtual objects as perceived by the respective virtual sensor. As such, the simulation system 400, 600 (e.g., using the DSM 424) may generate virtual sensor data for each of the virtual sensors that reflects the simulation state of the simulated environment with respect to each other virtual object. In this way, the simulation system is scalable and configurable to any number of virtual objects each having any number of virtual sensors that may each be processed in real-time.

In some embodiments, the virtual sensor data may be encoded, for example, using one or more codecs (e.g., codec(s) 614) to generate encoded sensor data. In some examples, the virtual sensor data may be encoded to a format that is familiar to the software stack(s) 116 of the virtual object.

The method 900, at block B908, includes computing, by at least one component under test and based at least in part on the virtual sensor data, at least one output. For example, the at least one output may be computed by one of the vehicle simulator component(s) 406, the vehicle simulator component(s) 420, and/or the vehicle simulator component(s) 422. The at least one output may be representative of an operation (e.g., control, path planning, object detection, etc.) corresponding to a virtual object (e.g., a HIL object, a SIL object, a PIL object, and/or an AI object) as determined by a software stack(s) 116 (e.g., based at least in part on the virtual sensor data). In some examples, such as where the virtual object is a HIL object, the signal (or data represented thereby) may be transmitted from the vehicle hardware 104 to one or more other vehicle simulator component(s) 406, and then the vehicle simulator component(s) 406 may transmit the signal to the simulator component(s) 402. In such examples, the signals between the vehicle simulator component(s) 406 (e.g., between the vehicle hardware 104 and one or more GPU(s), CPU(s), and/or computer(s) 436) may be transmitted via a CAN interface, a USB interface, an LVDS interface, an Ethernet interface, and/or another interface. In another example, such as where the virtual object is a SIL object, the signal (or data represented thereby) may be transmitted from the vehicle simulator component(s) 420 to the simulator component(s) 402, where the data included in the at least one output may be generated by the software stack(s) 116 executing on simulated or emulated vehicle hardware 104. In such examples, the vehicle simulator component(s) 420 may use a virtual CAN, a virtual LVDS interface, a virtual USB interface, a virtual Ethernet interface, and/or other virtual interfaces.

The method 900, at block B910, includes transmitting, to the simulation host device, operative data representative of the at least one output. For example, the at least one output (or data representative thereof) may be transmitted in a signal to the simulation component(s) 402 to update the global simulation, and thus the simulation environment.

FIG. 10 is a flow diagram showing a method 1000 for controlling a virtual object in a simulated environment using a generative machine learning sensor model trained on physical sensor data, in accordance with some embodiments of the present disclosure. The method 1000, at block B1002, includes receiving physical sensor data generated by a physical sensor. For example, the vehicle(s) 102 (e.g., a physical or physical vehicle(s)) may generate physical sensor data representative of a physical environment as perceived by the physical sensor and the simulation system may receive the physical sensor data.

The method 1000, at block B1004, includes training a virtual sensor model comprising a generative machine learning model using the physical sensor data. For example, a sensor model may be learned using generative machine learning by applying training data generated from the physical sensor data. In one non-limiting example, the virtual sensor model includes a generative adversarial network (GAN). Generally, the virtual sensor model may simulate any type of sensor, such as a RADAR sensor, a LIDAR sensor, or an ultrasonic sensor.

The method 1000, at block B1006, includes using the virtual sensor model to compute virtual sensor data for a virtual object associated with the virtual sensor. For example, the vehicle simulator component(s) 406, 420, and/or 422 may generate virtual sensor data using one or more virtual sensors and/or one or more codecs.

The method 1000, at block B1008, includes computing an output, by at least one component under test, based on the virtual sensor data. For example, the output may be computed by one of the vehicle simulator component(s) 406, the vehicle simulator component(s) 420, and/or the vehicle simulator component(s) 422. The at least one output may be representative of an operation (e.g., control, path planning, object detection, etc.) corresponding to a virtual object (e.g., a HIL object, a SIL object, a PIL object, and/or an AI object) associated with the virtual sensor. As described herein, the virtual sensor data may be encoded prior to use by the trained DNN.

The method 1000, at block B1010, includes controlling the virtual object within the simulated environment based at least in part on the output. For example, the virtual object (e.g., virtual vehicle) may be controlled within the simulated environment based at least in part on the output. In other examples, the outputs may be used for control. For example, the outputs may be object detection, lane detection, drivable free-space detection, safety procedure determination, etc. In any example, the outputs may be tested using one or more KPI's to determine the accuracy and effectiveness of the trained DNNs in any of a number of scenarios and environments. As such, where the trained DNNs suffer, fine-tuning may be executed to improve, validate, and verify the DNNs prior to deployment of the DNNs in real-world, physical vehicles (e.g., the vehicle 102).

Example Autonomous Vehicle

Figure 11A:
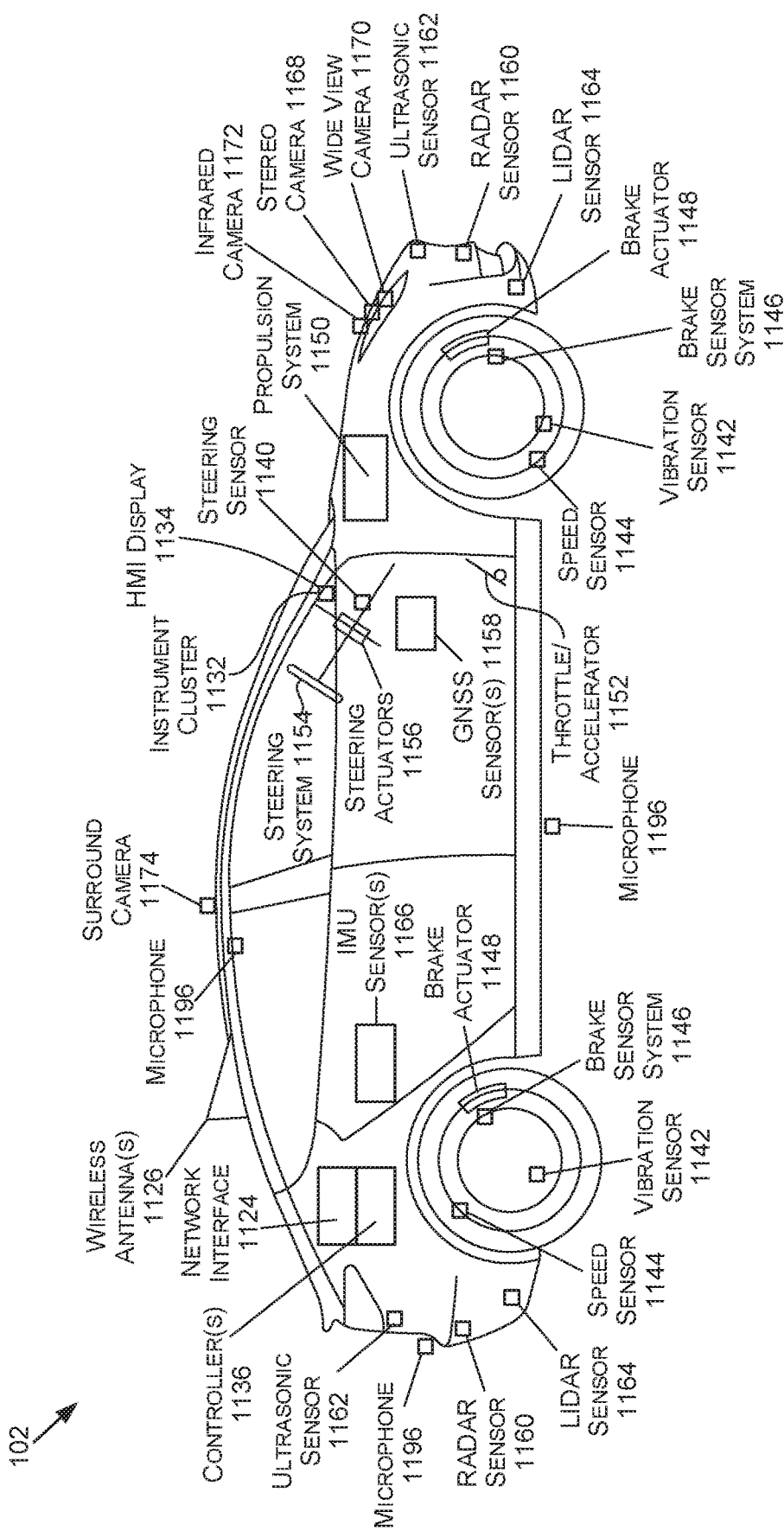
FIG. 11A is an illustration of an example autonomous vehicle, in accordance with some embodiments of the present disclosure.

FIG. 11A is an illustration of an example autonomous vehicle 102, in accordance with some embodiments of the present disclosure. The autonomous vehicle 102 (alternatively referred to herein as the "vehicle 102") may include a passenger vehicle, such as a car, a truck, a bus, and/or another type of vehicle that accommodates one or more passengers. Autonomous vehicles are generally described in terms of automation levels, defined by the National Highway Traffic Safety Administration (NHTSA), a division of the US Department of Transportation, and the Society of Automotive Engineers (SAE) "Taxonomy and Definitions for Terms Related to Driving Automation Systems for On-Road Motor Vehicles" (Standard No. J3016-201806, published on Jun. 15, 2018, Standard No. J3016-201609, published on Sep. 30, 2016, and previous and future versions of this standard). The vehicle 102 may be capable of functionality in accordance with one or more of Level 3-Level 5 of the autonomous driving levels. For example, the vehicle 102 may be capable of conditional automation (Level 3), high automation (Level 4), and/or full automation (Level 5), depending on the embodiment.

The vehicle 102 may include components such as a chassis, a vehicle body, wheels (e.g., 2, 4, 6, 8, 18, etc.), tires, axles, and other components of a vehicle. The vehicle 102 may include a propulsion system 1150, such as an internal combustion engine, hybrid electric power plant, an all-electric engine, and/or another propulsion system type. The propulsion system 1150 may be connected to a drive train of the vehicle 102, which may include a transmission, to enable the propulsion of the vehicle 102. The propulsion system 1150 may be controlled in response to receiving signals from the throttle/accelerator 1152.

A steering system 1154, which may include a steering wheel, may be used to steer the vehicle 102 (e.g., along a desired path or route) when the propulsion system 1150 is operating (e.g., when the vehicle is in motion). The steering system 1154 may receive signals from a steering actuator 1156. The steering wheel may be optional for full automation (Level 5) functionality.

The brake sensor system 1146 may be used to operate the vehicle brakes in response to receiving signals from the brake actuators 1148 and/or brake sensors.

Controller(s) 1136, which may include one or more system on chips (SoCs) 1104 (FIG. 11C) and/or GPU(s), may provide signals (e.g., representative of commands) to one or more components and/or systems of the vehicle 102. For example, the controller(s) may send signals to operate the vehicle brakes via one or more brake actuators 1148, to operate the steering system 1154 via one or more steering actuators 1156, to operate the propulsion system 1150 via one or more throttle/accelerators 1152. The controller(s) 1136 may include one or more onboard (e.g., integrated) computing devices (e.g., supercomputers) that process sensor signals, and output operation commands (e.g., signals representing commands) to enable autonomous driving and/or to assist a human driver in driving the vehicle 102. The controller(s) 1136 may include a first controller 1136 for autonomous driving functions, a second controller 1136 for functional safety functions, a third controller 1136 for artificial intelligence functionality (e.g., computer vision), a fourth controller 1136 for infotainment functionality, a fifth controller 1136 for redundancy in emergency conditions, and/or other controllers. In some examples, a single controller 1136 may handle two or more of the above functionalities, two or more controllers 1136 may handle a single functionality, and/or any combination thereof.

The controller(s) 1136 may provide the signals for controlling one or more components and/or systems of the vehicle 102 in response to sensor data received from one or more sensors (e.g., sensor inputs). The sensor data may be received from, for example and without limitation, global navigation satellite systems sensor(s) 1158 (e.g., Global Positioning System sensor(s)), RADAR sensor(s) 1160, ultrasonic sensor(s) 1162, LIDAR sensor(s) 1164, inertial measurement unit (IMU) sensor(s) 1166 (e.g., accelerometer(s), gyroscope(s), magnetic compass(es), magnetometer(s), etc.), ego-motion sensors, microphone(s) 1196, stereo camera(s) 1168, wide-view camera(s) 1170 (e.g., fisheye cameras), infrared camera(s) 1172, surround camera(s) 1174 (e.g., 360 degree cameras), long-range and/or mid-range camera(s) 1198, speed sensor(s) 1144 (e.g., for measuring the speed of the vehicle 102), vibration sensor(s) 1142, steering sensor(s) 1140, brake sensor(s) (e.g., as part of the brake sensor system 1146), and/or other sensor types.

One or more of the controller(s) 1136 may receive inputs (e.g., represented by input data) from an instrument cluster 1132 of the vehicle 102 and provide outputs (e.g., represented by output data, display data, etc.) via a human-machine interface (HMI) display 1134, an audible annunciator, a loudspeaker, and/or via other components of the vehicle 102. The outputs may include information such as vehicle velocity, speed, time, map data (e.g., the HD map 1122 of FIG. 11C), location data (e.g., the vehicle's 102 location, such as on a map), direction, location of other vehicles (e.g., an occupancy grid), information about objects and status of objects as perceived by the controller(s) 1136, etc. For example, the HMI display 1134 may display information about the presence of one or more objects (e.g., a street sign, caution sign, traffic light changing, etc.), and/or information about driving maneuvers the vehicle has made, is making, or will make (e.g., changing lanes now, taking exit 34B in two miles, etc.).

The vehicle 102 further includes a network interface 1124 which may use one or more wireless antenna(s) 1126 and/or modem(s) to communicate over one or more networks. For example, the network interface 1124 may be capable of communication over LTE, WCDMA, UMTS, GSM, CDMA2000, etc. The wireless antenna(s) 1126 may also enable communication between objects in the environment (e.g., vehicles, mobile devices, etc.), using local area network(s), such as Bluetooth, Bluetooth LE, Z-Wave, ZigBee, etc., and/or low power wide-area network(s) (LPWANs), such as LoRaWAN, SigFox, etc.

Figure 11B:
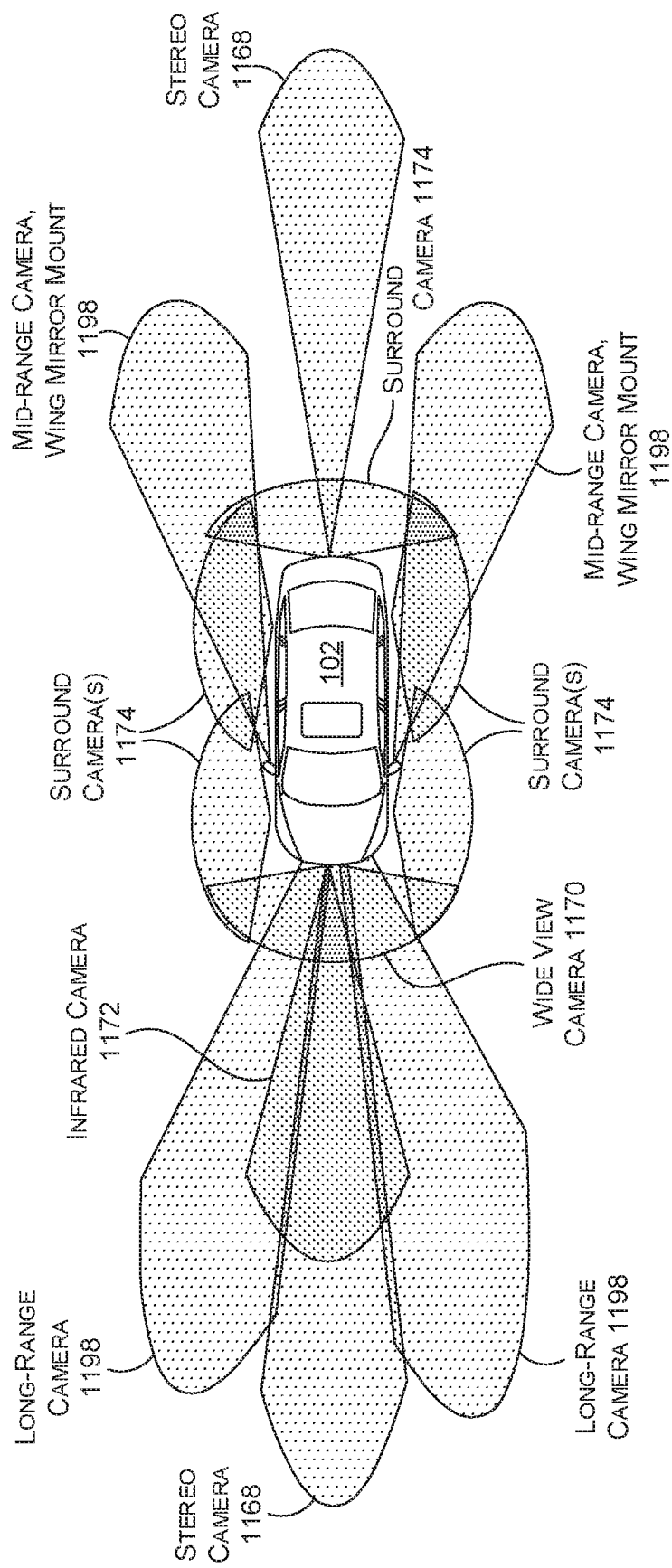
FIG. 11B is an example of camera locations and fields of view for the example autonomous vehicle of FIG. 11A, in accordance with some embodiments of the present disclosure.

FIG. 11B is an example of camera locations and fields of view for the example autonomous vehicle 102 of FIG. 11A, in accordance with some embodiments of the present disclosure. The cameras and respective fields of view are one example embodiment and are not intended to be limiting. For example, additional and/or alternative cameras may be included and/or the cameras may be located at different locations on the vehicle 102.

The camera types for the cameras may include, but are not limited to, digital cameras that may be adapted for use with the components and/or systems of the vehicle 102. The camera(s) may operate at automotive safety integrity level (ASIL) B and/or at another ASIL. The camera types may be capable of any image capture rate, such as 60 frames per second (fps), 1120 fps, 240 fps, etc., depending on the embodiment. The cameras may be capable of using rolling shutters, global shutters, another type of shutter, or a combination thereof. In some examples, the color filter array may include a red clear clear clear (RCCC) color filter array, a red clear clear blue (RCCB) color filter array, a red blue green clear (RBGC) color filter array, a Foveon X3 color filter array, a Bayer sensors (RGGB) color filter array, a monochrome sensor color filter array, and/or another type of color filter array. In some embodiments, clear pixel cameras, such as cameras with an RCCC, an RCCB, and/or an RBGC color filter array, may be used in an effort to increase light sensitivity.

In some examples, one or more of the camera(s) may be used to perform advanced driver assistance systems (ADAS) functions (e.g., as part of a redundant or fail-safe design). For example, a Multi-Function Mono Camera may be installed to provide functions including lane departure warning, traffic sign assist and intelligent headlamp control. One or more of the camera(s) (e.g., all of the cameras) may record and provide image data (e.g., video) simultaneously.

One or more of the cameras may be mounted in a mounting assembly, such as a custom designed (3-D printed) assembly, in order to cut out stray light and reflections from within the car (e.g., reflections from the dashboard reflected in the windshield mirrors) which may interfere with the camera's image data capture abilities. With reference to wing-mirror mounting assemblies, the wing-mirror assemblies may be custom 3-D printed so that the camera mounting plate matches the shape of the wing-mirror. In some examples, the camera(s) may be integrated into the wing-mirror. For side-view cameras, the camera(s) may also be integrated within the four pillars at each corner of the cabin.

Cameras with a field of view that include portions of the environment in front of the vehicle 102 (e.g., front-facing cameras) may be used for surround view, to help identify forward facing paths and obstacles, as well aid in, with the help of one or more controllers 1136 and/or control SoCs, providing information critical to generating an occupancy grid and/or determining the preferred vehicle paths. Front-facing cameras may be used to perform many of the same ADAS functions as LIDAR, including emergency braking, pedestrian detection, and collision avoidance. Front-facing cameras may also be used for ADAS functions and systems including Lane Departure Warnings ("LDW"), Autonomous Cruise Control ("ACC"), and/or other functions such as traffic sign recognition.

A variety of cameras may be used in a front-facing configuration, including, for example, a monocular camera platform that includes a CMOS (complementary metal oxide semiconductor) color imager. Another example may be a wide-view camera(s) 1170 that may be used to perceive objects coming into view from the periphery (e.g., pedestrians, crossing traffic or bicycles). Although only one wide-view camera is illustrated in FIG. 11B, there may any number of wide-view cameras 1170 on the vehicle 102. In addition, long-range camera(s) 1198 (e.g., a long-view stereo camera pair) may be used for depth-based object detection, especially for objects for which a neural network has not yet been trained. The long-range camera(s) 1198 may also be used for object detection and classification, as well as basic object tracking.

One or more stereo cameras 1168 may also be included in a front-facing configuration. The stereo camera(s) 1168 may include an integrated control unit comprising a scalable processing unit, which may provide a programmable logic (FPGA) and a multi-core micro-processor with an integrated CAN or Ethernet interface on a single chip. Such a unit may be used to generate a 3-D map of the vehicle's environment, including a distance estimate for all the points in the image. An alternative stereo camera(s) 1168 may include a compact stereo vision sensor(s) that may include two camera lenses (one each on the left and right) and an image processing chip that may measure the distance from the vehicle to the target object and use the generated information (e.g., metadata) to activate the autonomous emergency braking and lane departure warning functions. Other types of stereo camera(s) 1168 may be used in addition to, or alternatively from, those described herein.

Cameras with a field of view that include portions of the environment to the side of the vehicle 102 (e.g., side-view cameras) may be used for surround view, providing information used to create and update the occupancy grid, as well as to generate side impact collision warnings. For example, surround camera(s) 1174 (e.g., four surround cameras 1174 as illustrated in FIG. 11B) may be positioned to on the vehicle 102. The surround camera(s) 1174 may include wide-view camera(s) 1170, fisheye camera(s), 360 degree camera(s), and/or the like. Four example, four fisheye cameras may be positioned on the vehicle's front, rear, and sides. In an alternative arrangement, the vehicle may use three surround camera(s) 1174 (e.g., left, right, and rear), and may leverage one or more other camera(s) (e.g., a forward-facing camera) as a fourth surround view camera.

Cameras with a field of view that include portions of the environment to the rear of the vehicle 102 (e.g., rear-view cameras) may be used for park assistance, surround view, rear collision warnings, and creating and updating the occupancy grid. A wide variety of cameras may be used including, but not limited to, cameras that are also suitable as a front-facing camera(s) (e.g., long-range and/or mid-range camera(s) 1198, stereo camera(s) 1168), infrared camera(s) 1172, etc.), as described herein.

Figure 11C:
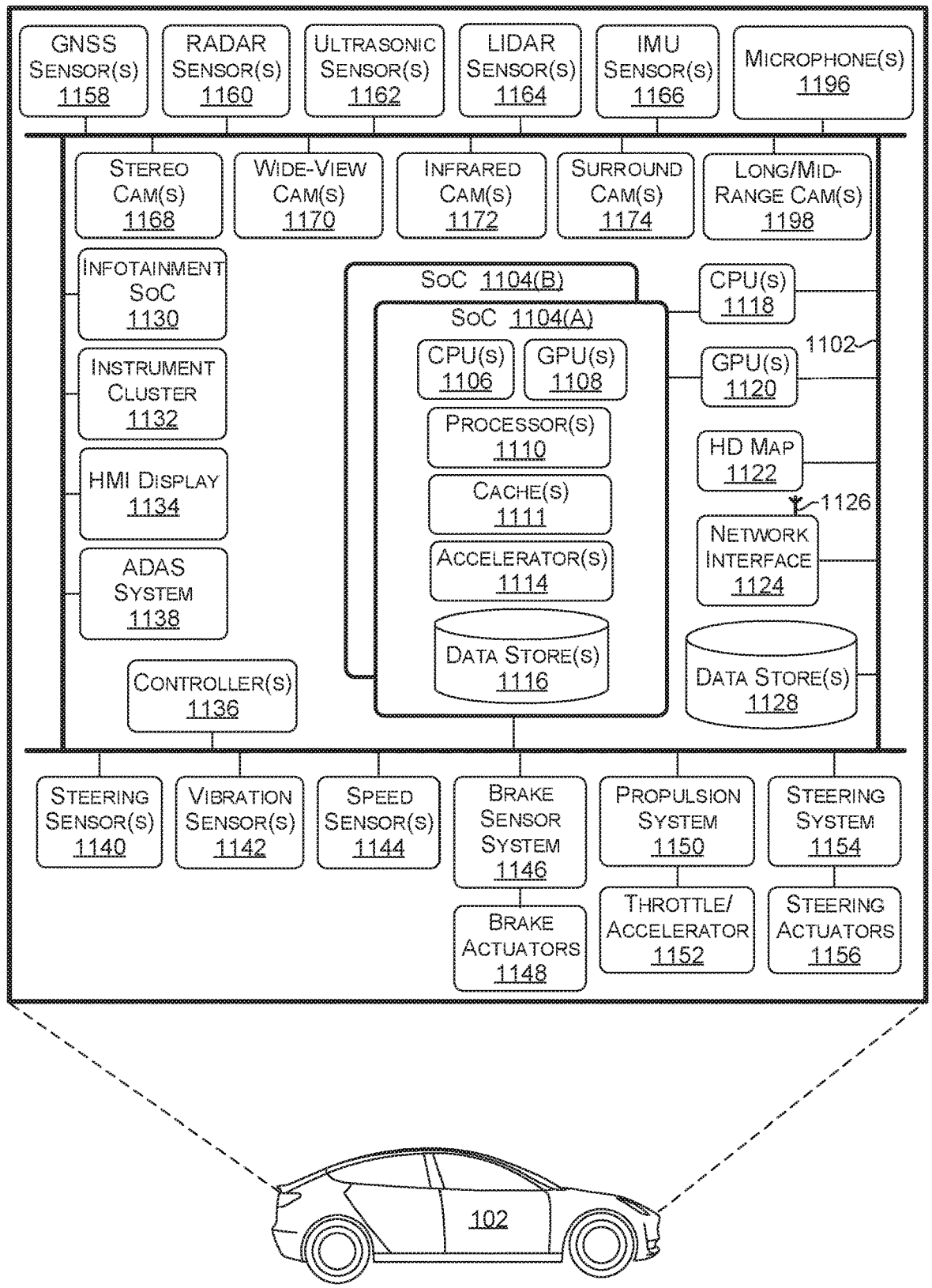
FIG. 11C is a block diagram of an example system architecture for the example autonomous vehicle of FIG. 11A, in accordance with some embodiments of the present disclosure.

FIG. 11C is a block diagram of an example system architecture for the example autonomous vehicle 102 of FIG. 11A, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Each of the components, features, and systems of the vehicle 102 in FIG. 11C are illustrated as being connected via bus 1102. The bus 1102 may include a Controller Area Network (CAN) data interface (alternatively referred to herein as a "CAN bus"). A CAN may be a network inside the vehicle 102 used to aid in control of various features and functionality of the vehicle 102, such as actuation of brakes, acceleration, braking, steering, windshield wipers, etc. A CAN bus may be configured to have dozens or even hundreds of nodes, each with its own unique identifier (e.g., a CAN ID). The CAN bus may be read to find steering wheel angle, ground speed, engine revolutions per minute (RPMs), button positions, and/or other vehicle status indicators. The CAN bus may be ASIL B compliant.

Although the bus 1102 is described herein as being a CAN bus, this is not intended to be limiting. For example, in addition to, or alternatively from, the CAN bus, FlexRay and/or Ethernet may be used. Additionally, although a single line is used to represent the bus 1102, this is not intended to be limiting. For example, there may be any number of busses 1102, which may include one or more CAN busses, one or more FlexRay busses, one or more Ethernet busses, and/or one or more other types of busses using a different protocol. In some examples, two or more busses 1102 may be used to perform different functions, and/or may be used for redundancy. For example, a first bus 1102 may be used for collision avoidance functionality and a second bus 1102 may be used for actuation control. In any example, each bus 1102 may communicate with any of the components of the vehicle 102, and two or more busses 1102 may communicate with the same components. In some examples, each SoC 1104, each controller 1136, and/or each computer within the vehicle may have access to the same input data (e.g., inputs from sensors of the vehicle 102), and may be connected to a common bus, such the CAN bus.

The vehicle 102 may include one or more controller(s) 1136, such as those described herein with respect to FIG. 11A. The controller(s) 1136 may be used for a variety of functions. The controller(s) 1136 may be coupled to any of the various other components and systems of the vehicle 102, and may be used for control of the vehicle 102, artificial intelligence of the vehicle 102, infotainment for the vehicle 102, and/or the like.

The vehicle 102 may include a system(s) on a chip (SoC) 1104. The SoC 1104 may include CPU(s) 1106, GPU(s) 1108, processor(s) 1110, cache(s) 1112, accelerator(s) 1114, data store(s) 1116, and/or other components and features not illustrated. The SoC(s) 1104 may be used to control the vehicle 102 in a variety of platforms and systems. For example, the SoC(s) 1104 may be combined in a system (e.g., the system of the vehicle 102) with an HD map 1122 which may obtain map refreshes and/or updates via a network interface 1124 from one or more servers (e.g., server(s) 1178 of FIG. 11D).

The CPU(s) 1106 may include a CPU cluster or CPU complex (alternatively referred to herein as a "CCPLEX"). The CPU(s) 1106 may include multiple cores and/or L2 caches. For example, in some embodiments, the CPU(s) 1106 may include eight cores in a coherent multi-processor configuration. In some embodiments, the CPU(s) 1106 may include four dual-core clusters where each cluster has a dedicated L2 cache (e.g., a 2 MB L2 cache). The CPU(s) 1106 (e.g., the CCPLEX) may be configured to support simultaneous cluster operation enabling any combination of the clusters of the CPU(s) 1106 to be active at any given time.

The CPU(s) 1106 may implement power management capabilities that include one or more of the following features: individual hardware blocks may be clock-gated automatically when idle to save dynamic power; each core clock may be gated when the core is not actively executing instructions due to execution of WFI/WFE instructions; each core may be independently power-gated; each core cluster may be independently clock-gated when all cores are clock-gated or power-gated; and/or each core cluster may be independently power-gated when all cores are power-gated. The CPU(s) 1106 may further implement an enhanced algorithm for managing power states, where allowed power states and expected wakeup times are specified, and the hardware/microcode determines the best power state to enter for the core, cluster, and CCPLEX. The processing cores may support simplified power state entry sequences in software with the work offloaded to microcode.

The GPU(s) 1108 may include an integrated GPU (alternatively referred to herein as an "iGPU"). The GPU(s) 1108 may be programmable and may be efficient for parallel workloads. The GPU(s) 1108, in some examples, may use an enhanced tensor instruction set. The GPU(s) 1108 may include one or more streaming microprocessors, where each streaming microprocessor may include an L1 cache (e.g., an L1 cache with at least 96 KB storage capacity), and two or more of the streaming microprocessors may share an L2 cache (e.g., an L2 cache with a 512 KB storage capacity). In some embodiments, the GPU(s) 1108 may include at least eight streaming microprocessors. The GPU(s) 1108 may use compute application programming interface(s) (API(s)). In addition, the GPU(s) 1108 may use one or more parallel computing platforms and/or programming models (e.g., NVIDIA's CUDA).

The GPU(s) 1108 may be power-optimized for best performance in automotive and embedded use cases. For example, the GPU(s) 1108 may be fabricated on a Fin field-effect transistor (FinFET). However, this is not intended to be limiting and the GPU(s) 1108 may be fabricated using other semiconductor manufacturing processes. Each streaming microprocessor may incorporate a number of mixed-precision processing cores partitioned into multiple blocks. For example, and without limitation, 64 PF32 cores and 32 PF64 cores may be partitioned into four processing blocks. In such an example, each processing block may be allocated 16 FP32 cores, 8 FP64 cores, 16 INT32 cores, two mixed-precision NVIDIA TENSOR COREs for deep learning matrix arithmetic, an L0 instruction cache, a warp scheduler, a dispatch unit, and/or a 64 KB register file. In addition, the streaming microprocessors may include independent parallel integer and floating-point data paths to provide for efficient execution of workloads with a mix of computation and addressing calculations. The streaming microprocessors may include independent thread scheduling capability to enable finer-grain synchronization and cooperation between parallel threads. The streaming microprocessors may include a combined L1 data cache and shared memory unit in order to improve performance while simplifying programming.

The GPU(s) 1108 may include a high bandwidth memory (HBM) and/or a 16 GB HBM2 memory subsystem to provide, in some examples, about 900 GB/second peak memory bandwidth. In some examples, in addition to, or alternatively from, the HBM memory, a synchronous graphics random-access memory (SGRAM) may be used, such as a graphics double data rate type five synchronous random-access memory (GDDR5).

The GPU(s) 1108 may include unified memory technology including access counters to allow for more accurate migration of memory pages to the processor that accesses them most frequently, thereby improving efficiency for memory ranges shared between processors. In some examples, address translation services (ATS) support may be used to allow the GPU(s) 1108 to access the CPU(s) 1106 page tables directly. In such examples, when the GPU(s) 1108 memory management unit (MMU) experiences a miss, an address translation request may be transmitted to the CPU(s) 1106. In response, the CPU(s) 1106 may look in its page tables for the virtual-to-physical mapping for the address and transmits the translation back to the GPU(s) 1108. As such, unified memory technology may allow a single unified virtual address space for memory of both the CPU(s) 1106 and the GPU(s) 1108, thereby simplifying the GPU(s) 1108 programming and porting of applications to the GPU(s) 1108.

In addition, the GPU(s) 1108 may include an access counter that may keep track of the frequency of access of the GPU(s) 1108 to memory of other processors. The access counter may help ensure that memory pages are moved to the physical memory of the processor that is accessing the pages most frequently.

The SoC(s) 1104 may include any number of cache(s) 1112, including those described herein. For example, the cache(s) 1112 may include an L3 cache that is available to both the CPU(s) 1106 and the GPU(s) 1108 (e.g., that is connected both the CPU(s) 1106 and the GPU(s) 1108). The cache(s) 1112 may include a write-back cache that may keep track of states of lines, such as by using a cache coherence protocol (e.g., MEI, MESI, MSI, etc.). The L3 cache may include 4 MB or more, depending on the embodiment, although smaller cache sizes may be used.

The SoC(s) 1104 may include one or more accelerators 1114 (e.g., hardware accelerators, software accelerators, or a combination thereof). For example, the SoC(s) 1104 may include a hardware acceleration cluster that may include optimized hardware accelerators and/or large on-chip memory. The large on-chip memory (e.g., 4 MB of SRAM), may enable the hardware acceleration cluster to accelerate neural networks and other calculations. The hardware acceleration cluster may be used to complement the GPU(s) 1108 and to off-load some of the tasks of the GPU(s) 1108 (e.g., to free up more cycles of the GPU(s) 1108 for performing other tasks). As an example, the accelerator(s) 1114 may be used for targeted workloads (e.g., perception, convolutional neural networks (CNNs), etc.) that are stable enough to be amenable to acceleration. The term "CNN," as used herein, may include all types of CNNs, including region-based or regional convolutional neural networks (RCNNs) and Fast RCNNs (e.g., as used for object detection).

The accelerator(s) 1114 (e.g., the hardware acceleration cluster) may include a deep learning accelerator(s) (DLA). The DLA(s) may include one or more Tensor processing units (TPUs) that may be configured to provide an additional ten trillion operations per second for deep learning applications and inferencing. The TPUs may be accelerators configured to, and optimized for, performing image processing functions (e.g., for CNNs, RCNNs, etc.). The DLA(s) may further be optimized for a specific set of neural network types and floating point operations, as well as inferencing. The design of the DLA(s) may provide more performance per millimeter than a general-purpose GPU, and vastly exceeds the performance of a CPU. The TPU(s) may perform several functions, including a single-instance convolution function, supporting, for example, INT8, INT16, and FP16 data types for both features and weights, as well as post-processor functions.

The DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

The DLA(s) may perform any function of the GPU(s) 1108, and by using an inference accelerator, for example, a designer may target either the DLA(s) or the GPU(s) 1108 for any function. For example, the designer may focus processing of CNNs and floating point operations on the DLA(s) and leave other functions to the GPU(s) 1108 and/or other accelerator(s) 1114.

The accelerator(s) 1114 (e.g., the hardware acceleration cluster) may include a programmable vision accelerator(s) (PVA), which may alternatively be referred to herein as a computer vision accelerator. The PVA(s) may be designed and configured to accelerate computer vision algorithms for the advanced driver assistance systems (ADAS), autonomous driving, and/or augmented reality (AR) and/or virtual reality (VR) applications. The PVA(s) may provide a balance between performance and flexibility. For example, each PVA(s) may include, for example and without limitation, any number of reduced instruction set computer (RISC) cores, direct memory access (DMA), and/or any number of vector processors.

The RISC cores may interact with image sensors (e.g., the image sensors of any of the cameras described herein), image signal processor(s), and/or the like. Each of the RISC cores may include any amount of memory. The RISC cores may use any of a number of protocols, depending on the embodiment. In some examples, the RISC cores may execute a real-time operating system (RTOS). The RISC cores may be implemented using one or more integrated circuit devices, application specific integrated circuits (ASICs), and/or memory devices. For example, the RISC cores may include an instruction cache and/or a tightly coupled RAM.

The DMA may enable components of the PVA(s) to access the system memory independently of the CPU(s) 1106. The DMA may support any number of features used to provide optimization to the PVA including, but not limited to, supporting multi-dimensional addressing and/or circular addressing. In some examples, the DMA may support up to six or more dimensions of addressing, which may include block width, block height, block depth, horizontal block stepping, vertical block stepping, and/or depth stepping.

The vector processors may be programmable processors that may be designed to efficiently and flexibly execute programming for computer vision algorithms and provide signal processing capabilities. In some examples, the PVA may include a PVA core and two vector processing subsystem partitions. The PVA core may include a processor subsystem, DMA engine(s) (e.g., two DMA engines), and/or other peripherals. The vector processing subsystem may operate as the primary processing engine of the PVA, and may include a vector processing unit (VPU), an instruction cache, and/or vector memory (e.g., VMEM). A VPU core may include a digital signal processor such as, for example, a single instruction, multiple data (SIMD), very long instruction word (VLIW) digital signal processor. The combination of the SIMD and VLIW may enhance throughput and speed.

Each of the vector processors may include an instruction cache and may be coupled to dedicated memory. As a result, in some examples, each of the vector processors may be configured to execute independently of the other vector processors. In other examples, the vector processors that are included in a particular PVA may be configured to employ data parallelism. For example, in some embodiments, the plurality of vector processors included in a single PVA may execute the same computer vision algorithm, but on different regions of an image. In other examples, the vector processors included in a particular PVA may simultaneously execute different computer vision algorithms, on the same image, or even execute different algorithms on sequential images or portions of an image. Among other things, any number of PVAs may be included in the hardware acceleration cluster and any number of vector processors may be included in each of the PVAs. In addition, the PVA(s) may include additional error correcting code (ECC) memory, to enhance overall system safety.

The accelerator(s) 1114 (e.g., the hardware acceleration cluster) may include a computer vision network on-chip and SRAM, for providing a high-bandwidth, low latency SRAM for the accelerator(s) 1114. In some examples, the on-chip memory may include at least 4 MB SRAM, consisting of, for example and without limitation, eight field-configurable memory blocks, that may be accessible by both the PVA and the DLA. Each pair of memory blocks may include an advanced peripheral bus (APB) interface, configuration circuitry, a controller, and a multiplexer. Any type of memory may be used. The PVA and DLA may access the memory via a backbone that provides the PVA and DLA with high-speed access to memory. The backbone may include a computer vision network on-chip that interconnects the PVA and the DLA to the memory (e.g., using the APB).

The computer vision network on-chip may include an interface that determines, before transmission of any control signal/address/data, that both the PVA and the DLA provide ready and valid signals. Such an interface may provide for separate phases and separate channels for transmitting control signals/addresses/data, as well as burst-type communications for continuous data transfer. This type of interface may comply with ISO 26262 or IEC 61508 standards, although other standards and protocols may be used.

In some examples, the SoC(s) 1104 may include a real-time ray-tracing hardware accelerator, such as described in U.S. patent application Ser. No. 16/101,232, filed on Aug. 10, 2018. The real-time ray-tracing hardware accelerator may be used to quickly and efficiently determine the positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses.

The accelerator(s) 1114 (e.g., the hardware accelerator cluster) have a wide array of uses for autonomous driving. The PVA may be a programmable vision accelerator that may be used for key processing stages in ADAS and autonomous vehicles. The PVA's capabilities are a good match for algorithmic domains needing predictable processing, at low power and low latency. In other words, the PVA performs well on semi-dense or dense regular computation, even on small data sets, which need predictable run-times with low latency and low power. Thus, in the context of platforms for autonomous vehicles, the PVAs are designed to run classic computer vision algorithms, as they are efficient at object detection and operating on integer math.

For example, according to one embodiment of the technology, the PVA is used to perform computer stereo vision. A semi-global matching-based algorithm may be used in some examples, although this is not intended to be limiting. Many applications for Level 3-5 autonomous driving require motion estimation/stereo matching on-the-fly (e.g., structure from motion, pedestrian recognition, lane detection, etc.). The PVA may perform computer stereo vision function on inputs from two monocular cameras.

In some examples, the PVA may be used to perform dense optical flow. According to process raw RADAR data (e.g., using a 4D Fast Fourier Transform) to provide Processed RADAR. In other examples, the PVA is used for time of flight depth processing, by processing raw time of flight data to provide processed time of flight data, for example.

The DLA may be used to run any type of network to enhance control and driving safety, including for example, a neural network that outputs a measure of confidence for each object detection. Such a confidence value may be interpreted as a probability, or as providing a relative "weight" of each detection compared to other detections. This confidence value enables the system to make further decisions regarding which detections should be considered as true positive detections rather than false positive detections. For example, the system may set a threshold value for the confidence and consider only the detections exceeding the threshold value as true positive detections. In an automatic emergency braking (AEB) system, false positive detections would cause the vehicle to automatically perform emergency braking, which is obviously undesirable. Therefore, only the most confident detections should be considered as triggers for AEB. The DLA may run a neural network for regressing the confidence value. The neural network may take as its input at least some subset of parameters, such as bounding box dimensions, ground plane estimate obtained (e.g. from another subsystem), inertial measurement unit (IMU) sensor 1166 output that correlates with the vehicle 102 orientation, distance, 3D location estimates of the object obtained from the neural network and/or other sensors (e.g., LIDAR sensor(s) 1164 or RADAR sensor(s) 1160), among others.

The SoC(s) 1104 may include data store(s) 1116 (e.g., memory). The data store(s) 1116 may be on-chip memory of the SoC(s) 1104, which may store neural networks to be executed on the GPU and/or the DLA. In some examples, the data store(s) 1116 may be large enough in capacity to store multiple instances of neural networks for redundancy and safety. The data store(s) 1112 may comprise L2 or L3 cache(s) 1112. Reference to the data store(s) 1116 may include reference to the memory associated with the PVA, DLA, and/or other accelerator(s) 1114, as described herein.

The SoC(s) 1104 may include one or more processor(s) 1110 (e.g., embedded processors). The processor(s) 1110 may include a boot and power management processor that may be a dedicated processor and subsystem to handle boot power and management functions and related security enforcement. The boot and power management processor may be a part of the SoC(s) 1104 boot sequence and may provide runtime power management services. The boot power and management processor may provide clock and voltage programming, assistance in system low power state transitions, management of SoC(s) 1104 thermals and temperature sensors, and/or management of the SoC(s) 1104 power states. Each temperature sensor may be implemented as a ring-oscillator whose output frequency is proportional to temperature, and the SoC(s) 1104 may use the ring-oscillators to detect temperatures of the CPU(s) 1106, GPU(s) 1108, and/or accelerator(s) 1114. If temperatures are determined to exceed a threshold, the boot and power management processor may enter a temperature fault routine and put the SoC(s) 1104 into a lower power state and/or put the vehicle 102 into a chauffeur to safe stop mode (e.g., bring the vehicle 102 to a safe stop).

The processor(s) 1110 may further include a set of embedded processors that may serve as an audio processing engine. The audio processing engine may be an audio subsystem that enables full hardware support for multi-channel audio over multiple interfaces, and a broad and flexible range of audio I/O interfaces. In some examples, the audio processing engine is a dedicated processor core with a digital signal processor with dedicated RAM.

The processor(s) 1110 may further include an always on processor engine that may provide necessary hardware features to support low power sensor management and wake use cases. The always on processor engine may include a processor core, a tightly coupled RAM, supporting peripherals (e.g., timers and interrupt controllers), various I/O controller peripherals, and routing logic.

The processor(s) 1110 may further include a safety cluster engine that includes a dedicated processor subsystem to handle safety management for automotive applications. The safety cluster engine may include two or more processor cores, a tightly coupled RAM, support peripherals (e.g., timers, an interrupt controller, etc.), and/or routing logic. In a safety mode, the two or more cores may operate in a lockstep mode and function as a single core with comparison logic to detect any differences between their operations.

The processor(s) 1110 may further include a real-time camera engine that may include a dedicated processor subsystem for handling real-time camera management.

The processor(s) 1110 may further include a high-dynamic range signal processor that may include an image signal processor that is a hardware engine that is part of the camera processing pipeline.

The processor(s) 1110 may include a video image compositor that may be a processing block (e.g., implemented on a microprocessor) that implements video post-processing functions needed by a video playback application to produce the final image for the player window. The video image compositor may perform lens distortion correction on wide-view camera(s) 1170, surround camera(s) 1174, and/or on in-cabin monitoring camera sensors. In-cabin monitoring camera sensor is preferably monitored by a neural network running on another instance of the Advanced SoC, configured to identify in cabin events and respond accordingly. An in-cabin system may perform lip reading to activate cellular service and place a phone call, dictate emails, change the vehicle's destination, activate or change the vehicle's infotainment system and settings, or provide voice-activated web surfing. Certain functions are available to the driver only when the vehicle is operating in an autonomous mode, and are disabled otherwise.

The video image compositor may include enhanced temporal noise reduction for both spatial and temporal noise reduction. For example, where motion occurs in a video, the noise reduction weights spatial information appropriately, decreasing the weight of information provided by adjacent frames. Where an image or portion of an image does not include motion, the temporal noise reduction performed by the video image compositor may use information from the previous image to reduce noise in the current image.

The video image compositor may also be configured to perform stereo rectification on input stereo lens frames. The video image compositor may further be used for user interface composition when the operating system desktop is in use, and the GPU(s) 1108 is not required to continuously render new surfaces. Even when the GPU(s) 1108 is powered on and active doing 3D rendering, the video image compositor may be used to offload the GPU(s) 1108 to improve performance and responsiveness.

The SoC(s) 1104 may further include a mobile industry processor interface (MIPI) camera serial interface for receiving video and input from cameras, a high-speed interface, and/or a video input block that may be used for camera and related pixel input functions. The SoC(s) 1104 may further include an input/output controller(s) that may be controlled by software and may be used for receiving I/O signals that are uncommitted to a specific role.

The SoC(s) 1104 may further include a broad range of peripheral interfaces to enable communication with peripherals, audio codecs, power management, and/or other devices. The SoC(s) 1104 may be used to process data from cameras (e.g., connected over Gigabit Multimedia Serial Link and Ethernet), sensors (e.g., LIDAR sensor(s) 1164, RADAR sensor(s) 1160, etc. that may be connected over Ethernet), data from bus 1102 (e.g., speed of vehicle 102, steering wheel position, etc.), data from GNSS sensor(s) 1158 (e.g., connected over Ethernet or CAN bus). The SoC(s) 1104 may further include dedicated high-performance mass storage controllers that may include their own DMA engines, and that may be used to free the CPU(s) 1106 from routine data management tasks.

The SoC(s) 1104 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. The SoC(s) 1104 may be faster, more reliable, and even more energy-efficient and space-efficient than conventional systems. For example, the accelerator(s) 1114, when combined with the CPU(s) 1106, the GPU(s) 1108, and the data store(s) 1116, may provide for a fast, efficient platform for level 3-5 autonomous vehicles.

The technology thus provides capabilities and functionality that cannot be achieved by conventional systems. For example, computer vision algorithms may be executed on CPUs, which may be configured using high-level programming language, such as the C programming language, to execute a wide variety of processing algorithms across a wide variety of visual data. However, CPUs are oftentimes unable to meet the performance requirements of many computer vision applications, such as those related to execution time and power consumption, for example. In particular, many CPUs are unable to execute complex object detection algorithms in real-time, which is a requirement of in-vehicle ADAS applications, and a requirement for practical Level 3-5 autonomous vehicles.

In contrast to conventional systems, by providing a CPU complex, GPU complex, and a hardware acceleration cluster, the technology described herein allows for multiple neural networks to be performed simultaneously and/or sequentially, and for the results to be combined together to enable Level 3-5 autonomous driving functionality. For example, a CNN executing on the DLA or dGPU (e.g., the GPU(s) 1120) may include a text and word recognition, allowing the supercomputer to read and understand traffic signs, including signs for which the neural network has not been specifically trained. The DLA may further include a neural network that is able to identify, interpret, and provides semantic understanding of the sign, and to pass that semantic understanding to the path planning modules running on the CPU Complex.

As another example, multiple neural networks may be run simultaneously, as is required for Level 3, 4, or 5 driving. For example, a warning sign consisting of "Caution: flashing lights indicate icy conditions," along with an electric light, may be independently or collectively interpreted by several neural networks. The sign itself may be identified as a traffic sign by a first deployed neural network (e.g., a neural network that has been trained), the text "Flashing lights indicate icy conditions" may be interpreted by a second deployed neural network, which informs the vehicle's path planning software (preferably executing on the CPU Complex) that when flashing lights are detected, icy conditions exist. The flashing light may be identified by operating a third deployed neural network over multiple frames, informing the vehicle's path-planning software of the presence (or absence) of flashing lights. All three neural networks may run simultaneously, such as within the DLA and/or on the GPU(s) 1108.

In some examples, a CNN for facial recognition and vehicle owner identification may use data from camera sensors to identify the presence of an authorized driver and/or owner of the vehicle 102. The always on sensor processing engine may be used to unlock the vehicle when the owner approaches the driver door and turn on the lights, and, in security mode, to disable the vehicle when the owner leaves the vehicle. In this way, the SoC(s) 1104 provide for security against theft and/or carjacking.

In another example, a CNN for emergency vehicle detection and identification may use data from microphones 1196 to detect and identify emergency vehicle sirens. In contrast to conventional systems, that use general classifiers to detect sirens and manually extract features, the SoC(s) 1104 use the CNN for classifying environmental and urban sounds, as well as classifying visual data. In a preferred embodiment, the CNN running on the DLA is trained to identify the relative closing speed of the emergency vehicle (e.g., by using the Doppler effect). The CNN may also be trained to identify emergency vehicles specific to the local area in which the vehicle is operating, as identified by GNSS sensor(s) 1158. Thus, for example, when operating in Europe the CNN will seek to detect European sirens, and when in the United States the CNN will seek to identify only North American sirens. Once an emergency vehicle is detected, a control program may be used to execute an emergency vehicle safety routine, slowing the vehicle, pulling over to the side of the road, parking the vehicle, and/or idling the vehicle, with the assistance of ultrasonic sensors 1162, until the emergency vehicle(s) passes.

The vehicle may include a CPU(s) 1118 (e.g., discrete CPU(s), or dCPU(s)), that may be coupled to the SoC(s) 1104 via a high-speed interconnect (e.g., PCIe). The CPU(s) 1118 may include an X86 processor, for example. The CPU(s) 1118 may be used to perform any of a variety of functions, including arbitrating potentially inconsistent results between ADAS sensors and the SoC(s) 1104, and/or monitoring the status and health of the controller(s) 1136 and/or infotainment SoC 1130, for example.

The vehicle 102 may include a GPU(s) 1120 (e.g., discrete GPU(s), or dGPU(s)), that may be coupled to the SoC(s) 1104 via a high-speed interconnect (e.g., NVIDIA's NVLINK). The GPU(s) 1120 may provide additional artificial intelligence functionality, such as by executing redundant and/or different neural networks, and may be used to train and/or update neural networks based on input (e.g., sensor data) from sensors of the vehicle 102.

The vehicle 102 may further include the network interface 1124 which may include one or more wireless antennas 1126 (e.g., one or more wireless antennas for different communication protocols, such as a cellular antenna, a Bluetooth antenna, etc.). The network interface 1124 may be used to enable wireless connectivity over the Internet with the cloud (e.g., with the server(s) 1178 and/or other network devices), with other vehicles, and/or with computing devices (e.g., client devices of passengers). To communicate with other vehicles, a direct link may be established between the two vehicles and/or an indirect link may be established (e.g., across networks and over the Internet). Direct links may be provided using a vehicle-to-vehicle communication link. The vehicle-to-vehicle communication link may provide the vehicle 102 information about vehicles in proximity to the vehicle 102 (e.g., vehicles in front of, on the side of, and/or behind the vehicle 102). This functionality may be part of a cooperative adaptive cruise control functionality of the vehicle 102.

The network interface 1124 may include a SoC that provides modulation and demodulation functionality and enables the controller(s) 1136 to communicate over wireless networks. The network interface 1124 may include a radio frequency front-end for up-conversion from baseband to radio frequency, and down conversion from radio frequency to baseband. The frequency conversions may be performed through well-known processes, and/or may be performed using super-heterodyne processes. In some examples, the radio frequency front end functionality may be provided by a separate chip. The network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

The vehicle 102 may further include data store(s) 1128 which may include off-chip (e.g., off the SoC(s) 1104) storage. The data store(s) 1128 may include one or more storage elements including RAM, SRAM, DRAM, VRAM, Flash, hard disks, and/or other components and/or devices that may store at least one bit of data.

The vehicle 102 may further include GNSS sensor(s) 1158. The GNSS sensor(s) 1158 (e.g., GPS and/or assisted GPS sensors), to assist in mapping, perception, occupancy grid generation, and/or path planning functions. Any number of GNSS sensor(s) 1158 may be used, including, for example and without limitation, a GPS using a USB connector with an Ethernet to Serial (RS-232) bridge.

The vehicle 102 may further include RADAR sensor(s) 1160. The RADAR sensor(s) 1160 may be used by the vehicle 102 for long-range vehicle detection, even in darkness and/or severe weather conditions. RADAR functional safety levels may be ASIL B. The RADAR sensor(s) 1160 may use the CAN and/or the bus 1102 (e.g., to transmit data generated by the RADAR sensor(s) 1160) for control and to access object tracking data, with access to Ethernet to access raw data in some examples. A wide variety of RADAR sensor types may be used. For example, and without limitation, the RADAR sensor(s) 1160 may be suitable for front, rear, and side RADAR use. In some example, Pulse Doppler RADAR sensor(s) are used.

The RADAR sensor(s) 1160 may include different configurations, such as long range with narrow field of view, short range with wide field of view, short range side coverage, etc. In some examples, long-range RADAR may be used for adaptive cruise control functionality. The long-range RADAR systems may provide a broad field of view realized by two or more independent scans, such as within a 250 m range. The RADAR sensor(s) 1160 may help in distinguishing between static and moving objects, and may be used by ADAS systems for emergency brake assist and forward collision warning. Long-range RADAR sensors may include monostatic multimodal RADAR with multiple (e.g., six or more) fixed RADAR antennae and a high-speed CAN and FlexRay interface. In an example with six antennae, the central four antennae may create a focused beam pattern, designed to record the vehicle's 102 surroundings at higher speeds with minimal interference from traffic in adjacent lanes. The other two antennae may expand the field of view, making it possible to quickly detect vehicles entering or leaving the vehicle's 102 lane.

Mid-range RADAR systems may include, as an example, a range of up to 1160 m (front) or 80 m (rear), and a field of view of up to 42 degrees (front) or 1150 degrees (rear). Short-range RADAR systems may include, without limitation, RADAR sensors designed to be installed at both ends of the rear bumper. When installed at both ends of the rear bumper, such a RADAR sensor systems may create two beams that constantly monitor the blind spot in the rear and next to the vehicle.

Short-range RADAR systems may be used in an ADAS system for blind spot detection and/or lane change assist.

The vehicle 102 may further include ultrasonic sensor(s) 1162. The ultrasonic sensor(s) 1162, which may be positioned at the front, back, and/or the sides of the vehicle 102, may be used for park assist and/or to create and update an occupancy grid. A wide variety of ultrasonic sensor(s) 1162 may be used, and different ultrasonic sensor(s) 1162 may be used for different ranges of detection (e.g., 2.5 m, 4 m). The ultrasonic sensor(s) 1162 may operate at functional safety levels of ASIL B.

The vehicle 102 may include LIDAR sensor(s) 1164. The LIDAR sensor(s) 1164 may be used for object and pedestrian detection, emergency braking, collision avoidance, and/or other functions. The LIDAR sensor(s) 1164 may be functional safety level ASIL B. In some examples, the vehicle 102 may include multiple LIDAR sensors 1164 (e.g., two, four, six, etc.) that may use Ethernet (e.g., to provide data to a Gigabit Ethernet switch).

In some examples, the LIDAR sensor(s) 1164 may be capable of providing a list of objects and their distances for a 360-degree field of view. Commercially available LIDAR sensor(s) 1164 may have an advertised range of approximately 102 m, with an accuracy of 2 cm-3 cm, and with support for a 102 Mbps Ethernet connection, for example. In some examples, one or more non-protruding LIDAR sensors 1164 may be used. In such examples, the LIDAR sensor(s) 1164 may be implemented as a small device that may be embedded into the front, rear, sides, and/or corners of the vehicle 102. The LIDAR sensor(s) 1164, in such examples, may provide up to a 1120-degree horizontal and 35-degree vertical field-of-view, with a 200$m$ range even for low-reflectivity objects. Front-mounted LIDAR sensor(s) 1164 may be configured for a horizontal field of view between 45 degrees and 135 degrees.

In some examples, LIDAR technologies, such as 3D flash LIDAR, may also be used. 3D Flash LIDAR uses a flash of a laser as a transmission source, to illuminate vehicle surroundings up to approximately 200 m. A flash LIDAR unit includes a receptor, which records the laser pulse transit time and the reflected light on each pixel, which in turn corresponds to the range from the vehicle to the objects. Flash LIDAR may allow for highly accurate and distortion-free images of the surroundings to be generated with every laser flash. In some examples, four flash LIDAR sensors may be deployed, one at each side of the vehicle 102. Available 3D flash LIDAR systems include a solid-state 3D staring array LIDAR camera with no moving parts other than a fan (e.g., a non-scanning LIDAR device). The flash LIDAR device may use a 5 nanosecond class I (eye-safe) laser pulse per frame and may capture the reflected laser light in the form of 3D range point clouds and co-registered intensity data. By using flash LIDAR, and because flash LIDAR is a solid-state device with no moving parts, the LIDAR sensor(s) 1164 may be less susceptible to motion blur, vibration, and/or shock.

The vehicle may further include IMU sensor(s) 1166. The IMU sensor(s) 1166 may be located at a center of the rear axle of the vehicle 102, in some examples. The IMU sensor(s) 1166 may include, for example and without limitation, an accelerometer(s), a magnetometer(s), a gyroscope(s), a magnetic compass(es), and/or other sensor types. In some examples, such as in six-axis applications, the IMU sensor(s) 1166 may include accelerometers and gyroscopes, while in nine-axis applications, the IMU sensor(s) 1166 may include accelerometers, gyroscopes, and magnetometers.

In some embodiments, the IMU sensor(s) 1166 may be implemented as a miniature, high performance GPS-Aided Inertial Navigation System (GPS/INS) that combines micro-electro-mechanical systems (MEMS) inertial sensors, a high-sensitivity GPS receiver, and advanced Kalman filtering algorithms to provide estimates of position, velocity, and attitude. As such, in some examples, the IMU sensor(s) 1166 may enable the vehicle 102 to estimate heading without requiring input from a magnetic sensor by directly observing and correlating the changes in velocity from GPS to the IMU sensor(s) 1166. In some examples, the IMU sensor(s) 1166 and the GNSS sensor(s) 1158 may be combined in a single integrated unit.

The vehicle may include microphone(s) 1196 placed in and/or around the vehicle 102. The microphone(s) 1196 may be used for emergency vehicle detection and identification, among other things.

The vehicle may further include any number of camera types, including stereo camera(s) 1168, wide-view camera(s) 1170, infrared camera(s) 1172, surround camera(s) 1174, long-range and/or mid-range camera(s) 1198, and/or other camera types. The cameras may be used to capture image data around an entire periphery of the vehicle 102. The types of cameras used depends on the embodiments and requirements for the vehicle 102, and any combination of camera types may be used to provide the necessary coverage around the vehicle 102. In addition, the number of cameras may differ depending on the embodiment. For example, the vehicle may include six cameras, seven cameras, ten cameras, twelve cameras, and/or another number of cameras. The cameras may support, as an example and without limitation, Gigabit Multimedia Serial Link (GMSL) and/or Gigabit Ethernet. Each of the camera(s) is described with more detail herein with respect to FIG. 11A and FIG. 11B.

The vehicle 102 may further include vibration sensor(s) 1142. The vibration sensor(s) 1142 may measure vibrations of components of the vehicle, such as the axle(s). For example, changes in vibrations may indicate a change in road surfaces. In another example, when two or more vibration sensors 1142 are used, the differences between the vibrations may be used to determine friction or slippage of the road surface (e.g., when the difference in vibration is between a power-driven axle and a freely rotating axle).

The vehicle 102 may include an ADAS system 1138. The ADAS system 1138 may include a SoC, in some examples. The ADAS system 1138 may include autonomous/adaptive/automatic cruise control (ACC), cooperative adaptive cruise control (CACC), forward crash warning (FCW), automatic emergency braking (AEB), lane departure warnings (LDW), lane keep assist (LKA), blind spot warning (BSW), rear cross-traffic warning (RCTW), collision warning systems (CWS), lane centering (LC), and/or other features and functionality.

The ACC systems may use RADAR sensor(s) 1160, LIDAR sensor(s) 1164, and/or a camera(s). The ACC systems may include longitudinal ACC and/or lateral ACC. Longitudinal ACC monitors and controls the distance to the vehicle immediately ahead of the vehicle 102 and automatically adjust the vehicle speed to maintain a safe distance from vehicles ahead. Lateral ACC performs distance keeping, and advises the vehicle 102 to change lanes when necessary. Lateral ACC is related to other ADAS applications such as LCA and CWS.

CACC uses information from other vehicles that may be received via the network interface 1124 and/or the wireless antenna(s) 1126 from other vehicles via a wireless link, or indirectly, over a network connection (e.g., over the Internet). Direct links may be provided by a vehicle-to-vehicle (V2V) communication link, while indirect links may be infrastructure-to-vehicle (I2V) communication link. In general, the V2V communication concept provides information about the immediately preceding vehicles (e.g., vehicles immediately ahead of and in the same lane as the vehicle 102), while the I2V communication concept provides information about traffic further ahead. CACC systems may include either or both I2V and V2V information sources. Given the information of the vehicles ahead of the vehicle 102, CACC may be more reliable and it has potential to improve traffic flow smoothness and reduce congestion on the road.

FCW systems are designed to alert the driver to a hazard, so that the driver may take corrective action. FCW systems use a front-facing camera and/or RADAR sensor(s) 1160, coupled to a dedicated processor, DSP, FPGA, and/or ASIC, that is electrically coupled to driver feedback, such as a display, speaker, and/or vibrating component. FCW systems may provide a warning, such as in the form of a sound, visual warning, vibration and/or a quick brake pulse.

AEB systems detect an impending forward collision with another vehicle or other object, and may automatically apply the brakes if the driver does not take corrective action within a specified time or distance parameter. AEB systems may use front-facing camera(s) and/or RADAR sensor(s) 1160, coupled to a dedicated processor, DSP, FPGA, and/or ASIC. When the AEB system detects a hazard, it typically first alerts the driver to take corrective action to avoid the collision and, if the driver does not take corrective action, the AEB system may automatically apply the brakes in an effort to prevent, or at least mitigate, the impact of the predicted collision. AEB systems, may include techniques such as dynamic brake support and/or crash imminent braking.

LDW systems provide visual, audible, and/or tactile warnings, such as steering wheel or seat vibrations, to alert the driver when the vehicle 102 crosses lane markings. A LDW system does not activate when the driver indicates an intentional lane departure, by activating a turn signal. LDW systems may use front-side facing cameras, coupled to a dedicated processor, DSP, FPGA, and/or ASIC, that is electrically coupled to driver feedback, such as a display, speaker, and/or vibrating component.

LKA systems are a variation of LDW systems. LKA systems provide steering input or braking to correct the vehicle 102 if the vehicle 102 starts to exit the lane.

BSW systems detects and warn the driver of vehicles in an automobile's blind spot. BSW systems may provide a visual, audible, and/or tactile alert to indicate that merging or changing lanes is unsafe. The system may provide an additional warning when the driver uses a turn signal. BSW systems may use rear-side facing camera(s) and/or RADAR sensor(s) 1160, coupled to a dedicated processor, DSP, FPGA, and/or ASIC, that is electrically coupled to driver feedback, such as a display, speaker, and/or vibrating component.

RCTW systems may provide visual, audible, and/or tactile notification when an object is detected outside the rear-camera range when the vehicle 102 is backing up. Some RCTW systems include AEB to ensure that the vehicle brakes are applied to avoid a crash. RCTW systems may use one or more rear-facing RADAR sensor(s) 1160, coupled to a dedicated processor, DSP, FPGA, and/or ASIC, that is electrically coupled to driver feedback, such as a display, speaker, and/or vibrating component.

Conventional ADAS systems may be prone to false positive results which may be annoying and distracting to a driver, but typically are not catastrophic, because the ADAS systems alert the driver and allow the driver to decide whether a safety condition truly exists and act accordingly. However, in an autonomous vehicle 102, the vehicle 102 itself must, in the case of conflicting results, decide whether to heed the result from a primary computer or a secondary computer (e.g., a first controller 1136 or a second controller 1136). For example, in some embodiments, the ADAS system 1138 may be a backup and/or secondary computer for providing perception information to a backup computer rationality module. The backup computer rationality monitor may run a redundant diverse software on hardware components to detect faults in perception and dynamic driving tasks. Outputs from the ADAS system 1138 may be provided to a supervisory MCU. If outputs from the primary computer and the secondary computer conflict, the supervisory MCU must determine how to reconcile the conflict to ensure safe operation.

In some examples, the primary computer may be configured to provide the supervisory MCU with a confidence score, indicating the primary computer's confidence in the chosen result. If the confidence score exceeds a threshold, the supervisory MCU may follow the primary computer's direction, regardless of whether the secondary computer provides a conflicting or inconsistent result. Where the confidence score does not meet the threshold, and where the primary and secondary computer indicate different results (e.g., the conflict), the supervisory MCU may arbitrate between the computers to determine the appropriate outcome.

The supervisory MCU may be configured to run a neural network(s) that is trained and configured to determine, based on outputs from the primary computer and the secondary computer, conditions under which the secondary computer provides false alarms. Thus, the neural network(s) in the supervisory MCU may learn when the secondary computer's output may be trusted, and when it cannot. For example, when the secondary computer is a RADAR-based FCW system, a neural network(s) in the supervisory MCU may learn when the FCW system is identifying metallic objects that are not, in fact, hazards, such as a drainage grate or manhole cover that triggers an alarm. Similarly, when the secondary computer is a camera-based LDW system, a neural network in the supervisory MCU may learn to override the LDW when bicyclists or pedestrians are present and a lane departure is, in fact, the safest maneuver. In embodiments that include a neural network(s) running on the supervisory MCU, the supervisory MCU may include at least one of a DLA or GPU suitable for running the neural network(s) with associated memory. In preferred embodiments, the supervisory MCU may comprise and/or be included as a component of the SoC(s) 1104.

In other examples, ADAS system 1138 may include a secondary computer that performs ADAS functionality using traditional rules of computer vision. As such, the secondary computer may use classic computer vision rules (if-then), and the presence of a neural network(s) in the supervisory MCU may improve reliability, safety and performance. For example, the diverse implementation and intentional non-identity makes the overall system more fault-tolerant, especially to faults caused by software (or software-hardware interface) functionality. For example, if there is a software bug or error in the software running on the primary computer, and the non-identical software code running on the secondary computer provides the same overall result, the supervisory MCU may have greater confidence that the overall result is correct, and the bug in software or hardware on primary computer is not causing material error.

In some examples, the output of the ADAS system 1138 may be fed into the primary computer's perception block and/or the primary computer's dynamic driving task block. For example, if the ADAS system 1138 indicates a forward crash warning due to an object immediately ahead, the perception block may use this information when identifying objects. In other examples, the secondary computer may have its own neural network which is trained and thus reduces the risk of false positives, as described herein.

The vehicle 102 may further include the infotainment SoC 1130 (e.g., an in-vehicle infotainment system (IVI)). Although illustrated and described as a SoC, the infotainment system may not be a SoC, and may include two or more discrete components. The infotainment SoC 1130 may include a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, Wi-Fi, etc.), and/or information services (e.g., navigation systems, rear-parking assistance, a radio data system, vehicle related information such as fuel level, total distance covered, brake fuel level, oil level, door open/close, air filter information, etc.) to the vehicle 102. For example, the infotainment SoC 1130 may radios, disk players, navigation systems, video players, USB and Bluetooth connectivity, carputers, in-car entertainment, Wi-Fi, steering wheel audio controls, hands free voice control, a heads-up display (HUD), an HMI display 1134, a telematics device, a control panel (e.g., for controlling and/or interacting with various components, features, and/or systems), and/or other components. The infotainment SoC 1130 may further be used to provide information (e.g., visual and/or audible) to a user(s) of the vehicle, such as information from the ADAS system 1138, autonomous driving information such as planned vehicle maneuvers, trajectories, surrounding environment information (e.g., intersection information, vehicle information, road information, etc.), and/or other information.

The infotainment SoC 1130 may include GPU functionality. The infotainment SoC 1130 may communicate over the bus 1102 (e.g., CAN bus, Ethernet, etc.) with other devices, systems, and/or components of the vehicle 102. In some examples, the infotainment SoC 1130 may be coupled to a supervisory MCU such that the GPU of the infotainment system may perform some self-driving functions in the event that the primary controller(s) 1136 (e.g., the primary and/or backup computers of the vehicle 102) fail. In such an example, the infotainment SoC 1130 may put the vehicle 102 into a chauffeur to safe stop mode, as described herein.

The vehicle 102 may further include an instrument cluster 1132 (e.g., a digital dash, an electronic instrument cluster, a digital instrument panel, etc.). The instrument cluster 1132 may include a controller and/or supercomputer (e.g., a discrete controller or supercomputer). The instrument cluster 1132 may include a set of instrumentation such as a speedometer, fuel level, oil pressure, tachometer, odometer, turn indicators, gearshift position indicator, seat belt warning light(s), parking-brake warning light(s), engine-malfunction light(s), airbag (SRS) system information, lighting controls, safety system controls, navigation information, etc. In some examples, information may be displayed and/or shared among the infotainment SoC 1130 and the instrument cluster 1132. In other words, the instrument cluster 1132 may be included as part of the infotainment SoC 1130, or vice versa.

Figure 11D:
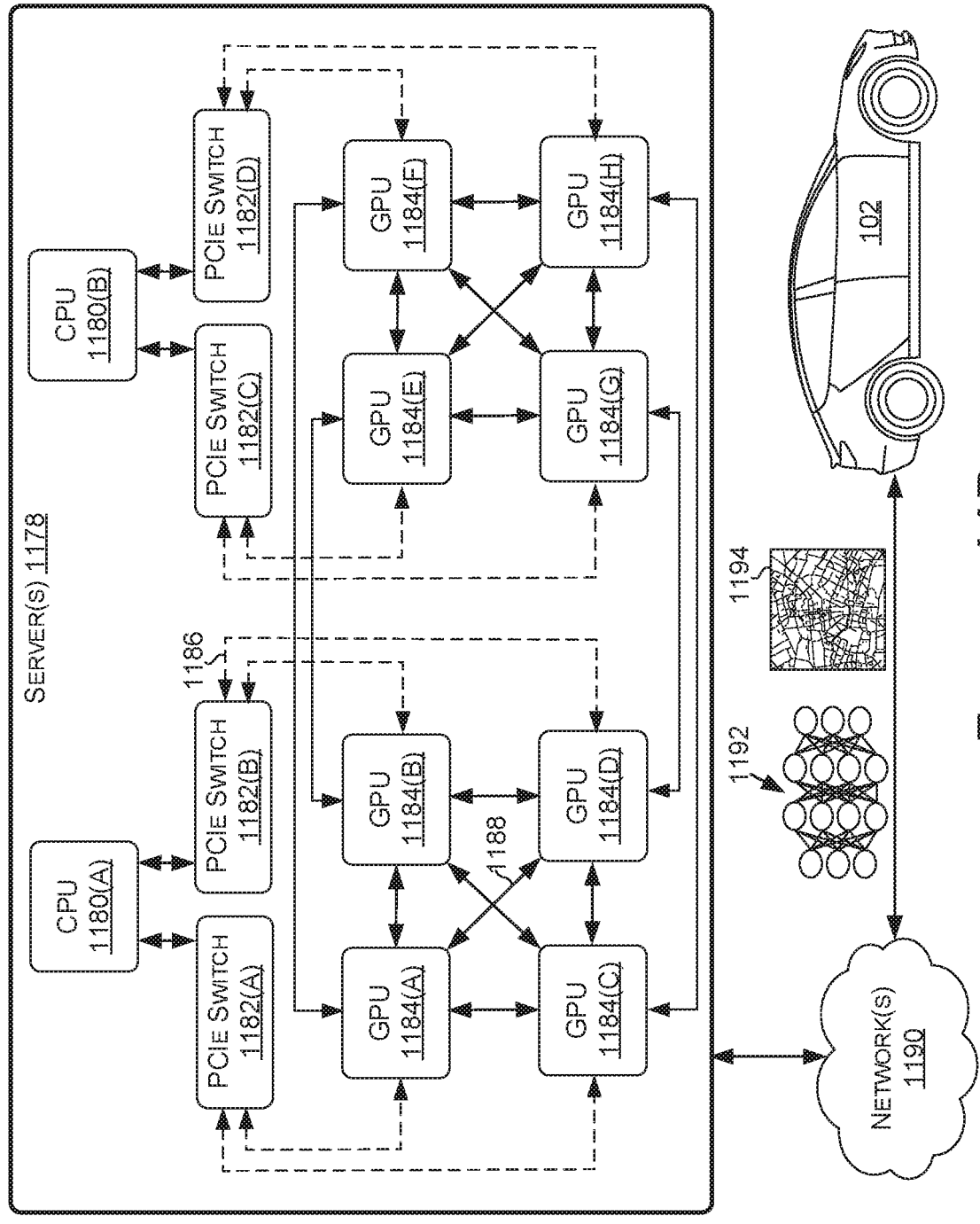
FIG. 11D is a system diagram for communication between cloud-based server(s) and the example autonomous vehicle of FIG. 11A, in accordance with some embodiments of the present disclosure.

FIG. 11D is a system diagram for communication between cloud-based server(s) and the example autonomous vehicle 102 of FIG. 11A, in accordance with some embodiments of the present disclosure. The system 1176 may include server(s) 1178, network(s) 1190, and vehicles, including the vehicle 102. The server(s) 1178 may include a plurality of GPUs 1184(A)-1184(H) (collectively referred to herein as GPUs 1184), PCIe switches 1182(A)-1182(H) (collectively referred to herein as PCIe switches 1182), and/or CPUs 1180(A)-1180(B) (collectively referred to herein as CPUs 1180). The GPUs 1184, the CPUs 1180, and the PCIe switches may be interconnected with high-speed interconnects such as, for example and without limitation, NVLink interfaces 1188 developed by NVIDIA and/or PCIe connections 1186. In some examples, the GPUs 1184 are connected via NVLink and/or NVSwitch SoC and the GPUs 1184 and the PCIe switches 1182 are connected via PCIe interconnects. Although eight GPUs 1184, two CPUs 1180, and two PCIe switches are illustrated, this is not intended to be limiting. Depending on the embodiment, each of the server(s) 1178 may include any number of GPUs 1184, CPUs 1180, and/or PCIe switches. For example, the server(s) 1178 may each include eight, sixteen, thirty-two, and/or more GPUs 1184.

The server(s) 1178 may receive, over the network(s) 1190 and from the vehicles, image data representative of images showing unexpected or changed road conditions, such as recently commenced road-work. The server(s) 1178 may transmit, over the network(s) 1190 and to the vehicles, neural networks 1192, updated neural networks 1192, and/or map information 1194, including information regarding traffic and road conditions. The updates to the map information 1194 may include updates for the HD map 1122, such as information regarding construction sites, potholes, detours, flooding, and/or other obstructions. In some examples, the neural networks 1192, the updated neural networks 1192, and/or the map information 1194 may have resulted from new training and/or experiences represented in data received from any number of vehicles in the environment, and/or based on training performed at a datacenter (e.g., using the server(s) 1178 and/or other servers).

The server(s) 1178 may be used to train machine learning models (e.g., neural networks) based on training data. The training data may be generated by the vehicles, and/or may be generated in a simulation (e.g., using a game engine). In some examples, the training data is tagged (e.g., where the neural network benefits from supervised learning) and/or undergoes other pre-processing, while in other examples the training data is not tagged and/or pre-processed (e.g., where the neural network does not require supervised learning). Once the machine learning models are trained, the machine learning models may be used by the vehicles (e.g., transmitted to the vehicles over the network(s) 1190, and/or the machine learning models may be used by the server(s) 1178 to remotely monitor the vehicles.

In some examples, the server(s) 1178 may receive data from the vehicles and apply the data to up-to-date real-time neural networks for real-time intelligent inferencing. The server(s) 1178 may include deep-learning supercomputers and/or dedicated AI computers powered by GPU(s) 1184, such as a DGX and DGX Station machines developed by NVIDIA. However, in some examples, the server(s) 1178 may include deep learning infrastructure that use only CPU-powered datacenters.

The deep-learning infrastructure of the server(s) 1178 may be capable of fast, real-time inferencing, and may use that capability to evaluate and verify the health of the processors, software, and/or associated hardware in the vehicle 102. For example, the deep-learning infrastructure may receive periodic updates from the vehicle 102, such as a sequence of images and/or objects that the vehicle 102 has located in that sequence of images (e.g., via computer vision and/or other machine learning object classification techniques). The deep-learning infrastructure may run its own neural network to identify the objects and compare them with the objects identified by the vehicle 102 and, if the results do not match and the infrastructure concludes that the AI in the vehicle 102 is malfunctioning, the server(s) 1178 may transmit a signal to the vehicle 102 instructing a fail-safe computer of the vehicle 102 to assume control, notify the passengers, and complete a safe parking maneuver.

For inferencing, the server(s) 1178 may include the GPU(s) 1184 and one or more programmable inference accelerators (e.g., NVIDIA's TensorRT). The combination of GPU-powered servers and inference acceleration may make real-time responsiveness possible. In other examples, such as where performance is less critical, servers powered by CPUs, FPGAs, and other processors may be used for inferencing.

Example Computing Device

Figure 12:
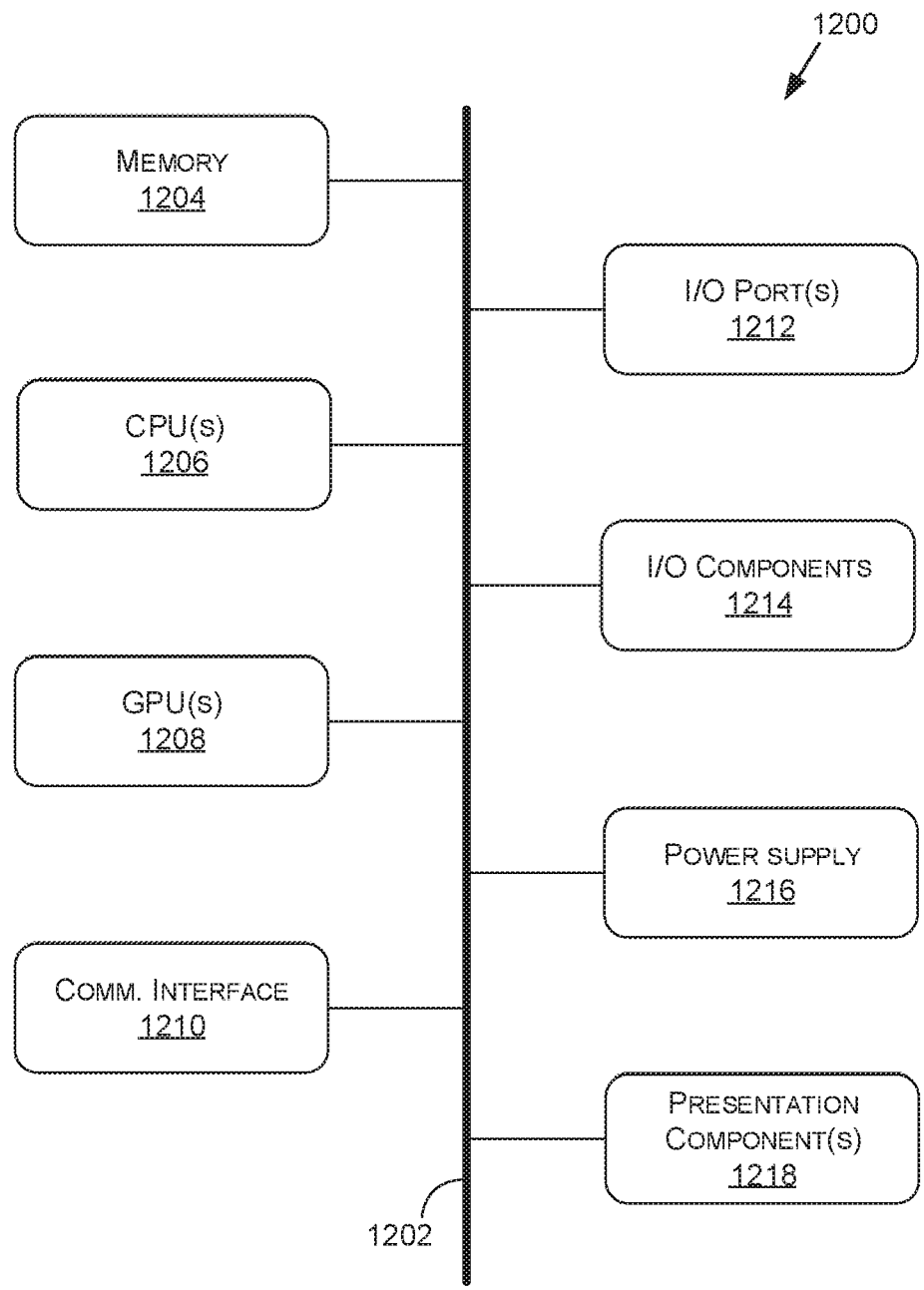
FIG. 12 is a block diagram of an example computing device suitable for use in implementing some embodiments of the present disclosure.

FIG. 12 is a block diagram of an example computing device 1200 suitable for use in implementing some embodiments of the present disclosure. Computing device 1200 may include a bus 1202 that directly or indirectly couples the following devices: memory 1204, one or more central processing units (CPUs) 1206, one or more graphics processing units (GPUs) 1208, a communication interface 1210, input/output (I/O) ports 1212, input/output components 1214, a power supply 1216, and one or more presentation components 1218 (e.g., display(s)).

Although the various blocks of FIG. 12 are shown as connected via the bus 1202 with lines, this is not intended to be limiting and is for clarity only. For example, in some embodiments, a presentation component 1218, such as a display device, may be considered an I/O component 1214 (e.g., if the display is a touch screen). As another example, the CPUs 1206 and/or GPUs 1208 may include memory (e.g., the memory 1204 may be representative of a storage device in addition to the memory of the GPUs 1208, the CPUs 1206, and/or other components). In other words, the computing device of FIG. 12 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 12.

The bus 1202 may represent one or more busses, such as an address bus, a data bus, a control bus, or a combination thereof. The bus 1202 may include one or more bus types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus.

The memory 1204 may include any of a variety of computer-readable media. The computer-readable media may be any available media that may be accessed by the computing device 1200. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1204 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 1200. As used herein, computer storage media does not comprise signals per se.

The communication media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the communication media may include wired media such as a wired network or direct-wired connection, and wireless media such as acoustic, RF, infrared and other wireless media. Combinations of any of the above should also be included within the scope of computer-readable media.

The CPU(s) 1206 may be configured to execute the computer-readable instructions to control one or more components of the computing device 1200 to perform one or more of the methods and/or processes described herein. The CPU(s) 1206 may each include one or more cores (e.g., one, two, four, eight, twenty-eight, seventy-two, etc.) that are capable of handling a multitude of software threads simultaneously. The CPU(s) 1206 may include any type of processor, and may include different types of processors depending on the type of computing device 1200 implemented (e.g., processors with fewer cores for mobile devices and processors with more cores for servers). For example, depending on the type of computing device 1200, the processor may be an ARM processor implemented using Reduced Instruction Set Computing (RISC) or an x86 processor implemented using Complex Instruction Set Computing (CISC). The computing device 1200 may include one or more CPUs 1206 in addition to one or more microprocessors or supplementary co-processors, such as math co-processors.

The GPU(s) 1208 may be used by the computing device 1200 to render graphics (e.g., 3D graphics). The GPU(s) 1208 may include hundreds or thousands of cores that are capable of handling hundreds or thousands of software threads simultaneously. The GPU(s) 1208 may generate pixel data for output images in response to rendering commands (e.g., rendering commands from the CPU(s) 1206 received via a host interface). The GPU(s) 1208 may include graphics memory, such as display memory, for storing pixel data. The display memory may be included as part of the memory 1204. The GPU(s) 708 may include two or more GPUs operating in parallel (e.g., via a link). When combined together, each GPU 1208 may generate pixel data for different portions of an output image or for different output images (e.g., a first GPU for a first image and a second GPU for a second image). Each GPU may include its own memory, or may share memory with other GPUs.

In examples where the computing device 1200 does not include the GPU(s) 1208, the CPU(s) 1206 may be used to render graphics.

The communication interface 1210 may include one or more receivers, transmitters, and/or transceivers that enable the computing device 700 to communicate with other computing devices via an electronic communication network, included wired and/or wireless communications. The communication interface 1210 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet), low-power wide-area networks (e.g., LoRaWAN, SigFox, etc.), and/or the Internet.

The I/O ports 1212 may enable the computing device 1200 to be logically coupled to other devices including the I/O components 1214, the presentation component(s) 1218, and/or other components, some of which may be built in to (e.g., integrated in) the computing device 1200. Illustrative I/O components 1214 include a microphone, mouse, keyboard, joystick, game pad, game controller, satellite dish, scanner, printer, wireless device, etc. The I/O components 1214 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1200. The computing device 1200 may be include depth cameras, such as stereoscopic camera systems, infrared camera systems, RGB camera systems, touchscreen technology, and combinations of these, for gesture detection and recognition. Additionally, the computing device 1200 may include accelerometers or gyroscopes (e.g., as part of an inertia measurement unit (IMU)) that enable detection of motion. In some examples, the output of the accelerometers or gyroscopes may be used by the computing device 1200 to render immersive augmented reality or virtual reality.

The power supply 1216 may include a hard-wired power supply, a battery power supply, or a combination thereof. The power supply 1216 may provide power to the computing device 1200 to enable the components of the computing device 1200 to operate.

The presentation component(s) 1218 may include a display (e.g., a monitor, a touch screen, a television screen, a heads-up-display (HUD), other display types, or a combination thereof), speakers, and/or other presentation components. The presentation component(s) 1218 may receive data from other components (e.g., the GPU(s) 1208, the CPU(s) 1206, etc.), and output the data (e.g., as an image, video, sound, etc.).

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:
receiving simulation data representative of a simulated three-dimensional (3D) environment;
predicting, based at least on processing the simulation data using a sensor model comprising one or more machine learning models trained to predict virtual sensor data for a second sensor installation location using training data comprising physical sensor data representative of a first sensor installation location prior to adding an encoder to the sensor model to adapt the sensor model to the second sensor installation location, the virtual sensor data representative of the simulated 3D environment as perceived by a corresponding virtual sensor at the second sensor installation location on a virtual 3D object simulating an ego-object within the simulated 3D environment; and
computing, using at least one component of a software stack of the ego-object and based at least on the virtual sensor data, at least one output corresponding to control of the ego-object within one or more real-world environments.

2. The method of claim 1, the virtual sensor data predicted based at least on processing a representation of a scene configuration comprising corresponding channels that encode one or more images of the simulated 3D environment and a depth map representing one or more positions and one or more dimensions of virtual 3D objects within the simulated 3D environment.

3. The method of claim 1, wherein the sensor model simulates a RADAR sensor, a LIDAR sensor, or an ultrasonic sensor.

4. The method of claim 1, the virtual sensor data predicted based at least on processing a representation of a scene configuration comprising corresponding channels that encode one or more images of the simulated 3D environment and virtual LIDAR data of the simulated 3D environment and classification data identifying virtual 3D objects in the simulated 3D environment.

5. The method of claim 1, the virtual sensor data predicted based at least on processing a representation of a scene configuration comprising corresponding channels that encode one or more images of the simulated 3D environment and one or more segmentation masks derived from the one or more images of the simulated 3D environment.

6. The method of claim 1, the sensor model trained to predict the virtual sensor data for the second sensor installation location based at least on training the sensor model with first training data representative of the first sensor installation location and using transfer learning to adapt the sensor model to the second installation location.

7. The method of claim 1, wherein the sensor model includes a generative adversarial network (GAN) or a variational autoencoder (VAE).

8. The method of claim 1, further comprising training the sensor model using the training data generated from the physical sensor data captured using one or more physical sensors of one or more physical vehicles.

9. The method of claim 1, further comprising encoding the virtual sensor data using one or more codecs to generate encoded sensor data, wherein the computing the at least one output is based at least on the encoded sensor data.

10. A method comprising:
transmitting, from a first hardware component managing a simulated three-dimensional (3D) environment to a second hardware component managing simulation of a virtual 3D object that simulates an ego-object within the simulated 3D environment, virtual sensor data computed based at least on processing, using a sensor model, simulation data representative of the simulated 3D environment, the sensor model trained to predict the virtual sensor data for a second sensor installation location using training data comprising physical sensor data representative of a first sensor installation location prior to adding an encoder to the sensor model to adapt the sensor model to the second sensor installation location, the virtual sensor data representative of a portion of the simulated 3D environment managed using the first hardware component, the virtual sensor data corresponding to at least a field of view of a virtual sensor at the second sensor installation location on the virtual 3D object managed using the second hardware component;
receiving, using the first hardware component and from the second hardware component, operative data representative of an operation of a software stack of the ego-object, the operative data being generated using the second hardware component based at least on the virtual sensor data; and
updating, using the first hardware component, one or more attributes of the virtual 3D object within the simulated 3D environment based at least in part on the operative data.

11. The method of claim 10, the sensor model trained to predict the virtual sensor data for the second sensor installation location based at least on training the sensor model with first training data representative of the first installation location and using transfer learning to adapt the sensor model to the second installation location.

12. The method of claim 10, the virtual sensor data computed based at least on processing a representation of a scene configuration that encodes one or more images of the simulated 3D environment as perceived by a virtual camera associated with the virtual 3D object simulating the ego-object within the simulated 3D environment.

13. The method of claim 10, wherein the sensor model is configured to simulate a RADAR sensor using a generative machine learning model to predict values of the virtual sensor data representing reflection characteristics that depend on at least one of an installation location or an installation orientation of the simulated RADAR sensor with respect to the simulated 3D environment, wherein the reflection characteristics comprise at least one of bearing, azimuth angle, elevation angle, range, intensity, Doppler velocity, or RADAR cross section (RCS).

14. The method of claim 10, wherein the sensor model includes a generative adversarial network (GAN) or a variational autoencoder (VAE).

15. A method comprising:
training a virtual sensor model comprising a generative machine learning model to simulate a virtual sensor corresponding to at least one physical sensor, the generative machine learning model being trained to predict virtual sensor data for a second sensor installation location using training data comprising physical sensor data representative of a first sensor installation location prior to adding an encoder to the virtual sensor model to adapt the virtual sensor model to the second sensor installation location;

computing, based at least on processing simulation data representative of a simulated environment using the virtual sensor model, the virtual sensor data representative of a view of the simulated environment from a perspective of the virtual sensor associated with a virtual object simulating an ego-object within the simulated environment; and computing an output using at least one component of a software stack associated with control of the ego-object in one or more real-world environments and based at least on the virtual sensor data.

16. The method of claim 15, wherein the generative machine learning model simulates a RADAR sensor, a LIDAR sensor, or an ultrasonic sensor.

17. The method of claim 15, the virtual sensor data computed based at least on processing a representation of a scene configuration that encodes one or more images of the simulated environment as perceived by a virtual camera associated with the virtual object simulating the ego-object within the simulated environment.

* * * * *